United States Patent
Lee et al.

(10) Patent No.: US 12,135,850 B2
(45) Date of Patent: Nov. 5, 2024

(54) TOUCH DISPLAY DEVICE

(71) Applicant: LG Display Co., Ltd., Seoul (KR)

(72) Inventors: Yangsik Lee, Seoul (KR); SangHyuck Bae, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/242,353

(22) Filed: Sep. 5, 2023

(65) Prior Publication Data

US 2024/0160312 A1 May 16, 2024

(30) Foreign Application Priority Data

Nov. 11, 2022 (KR) ......................... 10-2022-0150035

(51) Int. Cl.
*G06F 3/041* (2006.01)
*G06F 3/044* (2006.01)

(52) U.S. Cl.
CPC ........ *G06F 3/04164* (2019.05); *G06F 3/0446* (2019.05)

(58) Field of Classification Search
CPC ............. G06F 3/041662; G06F 3/0412; G06F 3/04164; G06F 3/0446; G06F 3/04166; G06F 3/0443; G06F 3/0445; G06F 3/0416; G06F 3/044
See application file for complete search history.

(56) References Cited

U.S. PATENT DOCUMENTS

| | | | |
|---|---|---|---|
| 11,662,865 B2 | 5/2023 | Yu et al. | |
| 2016/0357333 A1* | 12/2016 | Huang | G06F 3/0412 |
| 2016/0364068 A1* | 12/2016 | Cheng | G06F 3/0412 |
| 2017/0090630 A1 | 3/2017 | Kim et al. | |
| 2017/0228074 A1* | 8/2017 | Du | G06F 3/0412 |
| 2017/0228084 A1* | 8/2017 | Kim | G06F 3/04164 |
| 2018/0113531 A1* | 4/2018 | Na | G06F 3/0412 |
| 2018/0284926 A1 | 10/2018 | Kim et al. | |
| 2019/0196644 A1 | 6/2019 | Chung | |
| 2021/0132764 A1 | 5/2021 | Mayumi et al. | |

FOREIGN PATENT DOCUMENTS

| | | |
|---|---|---|
| CN | 106155449 B | 1/2019 |
| CN | 111580696 A | 8/2020 |
| WO | WO 2021/082098 A1 | 5/2021 |

* cited by examiner

*Primary Examiner* — Md Saiful A Siddiqui
(74) *Attorney, Agent, or Firm* — Birch, Stewart, Kolasch & Birch, LLP

(57) ABSTRACT

A touch display device can include a substrate having a display area and a non-display area located outside of the display area; at least one subpixel disposed in the display area including a display anode electrode, an emission layer and a display cathode electrode; and a display driving transistor disposed in the display area and being configured to drive the display anode electrode. Also, the touch display device can include a touch electrode disposed in the display area; a touch driving transistor disposed in the display area and configured to drive the touch electrode, the touch driving transistor including a first active layer, a first source electrode, a first drain electrode and a first gate electrode; and a control transistor configured to control turn-on and turn-off operations of the touch driving transistor, and including a second active layer, a second source electrode, a second drain electrode and a second gate electrode.

23 Claims, 25 Drawing Sheets

TOUCH DISPLAY DEVICE

CROSS-REFERENCE TO RELATED APPLICATION

This application claims the priority under 35 U.S.C. § 119(a) to Korean Patent Application No. 10-2022-0150035, filed in the Republic of Korea on Nov. 11, 2022, which is incorporated by reference in its entirety into the present application.

BACKGROUND

Technical Field

The present disclosure relates to electronic devices with a display, and more specifically, to touch display devices.

Discussion of the Related Art

Display devices increasingly employ a touch-based input function that enables users to easily input information or a command to the display device in an intuitive and convenient manner, in addition to providing a function of displaying images or data.

In order to provide the touch-based input function, such touch display devices are required to have capabilities to detect the presence or absence of a touch from a user and accurately obtain coordinates of the touch. To perform touch sensing, touch display devices need to include a touch sensor structure and a touch circuit. For example, the touch sensor structure can include a plurality of touch electrodes and a plurality of touch lines for electrically connecting the touch electrodes to the touch circuit. To meet the requirements for touch sensing, the touch circuit needs to normally perform an intended operation in accordance with the touch sensor structure.

When touch display devices are configured to have a larger screen size or a higher touch resolution (a higher accuracy of touch sensing), more touch electrodes can be needed, and in turn, more touch lines and touch channels may be needed due to the increased number of touch electrodes.

Thus, typical touch display devices have suffered from a larger number of touch lines, more touch pads, and more touch channels due to an increased number of touch electrodes. Moreover, in relation to these limitations, increases in the number of touch lines and the number of touch pads can cause a structure of an associated panel to become complicated and costly, and an increase in the number of touch channels corresponding to the number of touch lines can cause a touch circuit to become more complicated. Thereby, in such a typical display device, limitations can arise, such as an increase in size of the touch circuit, and increased manufacturing costs.

SUMMARY OF THE DISCLOSURE

The present disclosure is directed to solving or addressing the above-described needs and limitations.

One or more embodiments of the present disclosure can provide a touch display device having an advanced touch sensor structure capable of reducing a number of touch lines, reducing a number of touch pads, and reducing a number of touch channels, even when the number of touch electrodes is increased.

One or more embodiments of the present disclosure can provide a touch display device having an advanced touch sensor structure capable of realizing a high touch resolution while reducing a number of touch lines, reducing a number of touch pads, and reducing a number of touch channels.

One or more embodiments of the present disclosure can provide a touch display device in which a touch sensor structure is integrated into a self-emission type of display panel.

One or more embodiments of the present disclosure can provide a touch display device in which a touch sensor structure is integrated into a display panel with a top emission structure.

According to aspects of the present disclosure, a touch display device can include a substrate including a display area and a non-display area located outside of the display area; a display anode electrode disposed in the display area; an emission layer disposed in the display area and located on the display anode electrode; a display cathode electrode disposed in the display area, located on the emission layer, and including a cathode electrode material; a display driving transistor disposed in the display area and driving the display anode electrode; a touch electrode disposed in the display area; and a touch driving transistor disposed in the display area and configured to drive the touch electrode.

The touch electrode can include a second electrode. The second electrode can include the cathode electrode material and be spaced apart from the display cathode electrode.

The touch electrode can further include a first electrode disposed under the second electrode. The first electrode can include a same anode electrode material as the display anode electrode.

The touch driving transistor can include a first active layer, a first source electrode, a first drain electrode, and a first gate electrode. The touch electrode can further include a relay electrode for relaying an electrical interconnection between the first source electrode or the first drain electrode and the second electrode.

For example, the relay electrode can be located between the first source electrode or the first drain electrode and the second electrode. In another example, the relay electrode can be located in or on the same layer as the first gate electrode.

In one or more embodiments, the touch display device can further include a control transistor for controlling the turn-on and turn-off operation of the touch driving transistor.

The control transistor can include a second active layer, a second source electrode, a second drain electrode, and a second gate electrode.

The second source electrode or the second drain electrode can be electrically connected to the first gate electrode, the second drain electrode or the second source electrode can be electrically connected to a first switching signal line, and the second gate electrode can be electrically connected to a driving signal line.

The control transistor can be disposed in the non-display area.

The display area can include a pixel area and a transmission area.

The display anode electrode, the emission layer, the display cathode electrode, and the display driving transistor can be disposed in the pixel area, and the touch electrode can be disposed in the transmission area.

According to aspects of the present disclosure, a touch display device can include a substrate; a display anode electrode disposed on the substrate; an emission layer disposed on the display anode electrode; a display cathode electrode located on the emission layer, and including a cathode electrode material; a second electrode including the cathode electrode material; a touch line to which a touch driving signal having a variable voltage level is applied; and a touch driving transistor for controlling an interconnection between the touch line and the second electrode.

In one or more embodiments, the touch display device can further include a control transistor for controlling the turn-on and turn-off operation of the touch driving transistor.

The touch driving transistor can be disposed in the display area, and the control transistor can be disposed in a non-display area located outside of the display area.

The touch display device can further include a relay electrode for an interconnection between the touch driving transistor and the second electrode. The relay electrode can be located farther away from the substrate than the source electrode or drain electrode of the touch driving transistor, and located closer to the substrate than the second electrode.

The touch display device can further include a relay electrode for an interconnection between the touch driving transistor and the second electrode, and the relay electrode can be located in or on the same layer as the gate electrode of the touch driving transistor.

The touch display device can further include a relay electrode for an interconnection between the touch driving transistor and the touch cathode electrode, and the relay electrode can be located in or on the same layer as the gate electrode of the touch driving transistor.

According to one or more embodiments of the present disclosure, a touch display device can include an advanced touch sensor structure capable of reducing a number of touch lines, reducing a number of touch pads, and reducing a number of touch channels, even when more touch electrodes are provided.

According to one or more embodiments of the present disclosure, a touch display device can include an advanced touch sensor structure capable of realizing a high touch resolution while reducing a number of touch lines, reducing a number of touch pads, and reducing a number of touch channels.

According to one or more embodiments of the present disclosure, a touch display device can be provided that enables a touch sensor structure to be integrated into a self-emission type of display panel.

According to one or more embodiments of the present disclosure, a touch display device can be provided that enables a touch sensor structure to be integrated into a display panel with a top emission structure. According to one or more embodiments of the present disclosure, since a touch sensor is integrated into a display panel, the manufacturing process of the panel can be simplified, or one or more of processes of manufacturing the panel can be simplified, thus, leading to optimization of the manufacturing process, reduced costs and faster production with higher yields. Also, according to one or more embodiments of the present disclosure, the touch electrodes can be provided at the same layer as the light emitting elements and be formed of some of the same materials during the same manufacturing step, which can produce a much thinner device, conserve resources and reduce manufacturing time and costs.

According to one or more embodiments of the present disclosure, low-power driving and high-efficiency driving can be realized because touch driving and touch sensing can be normally performed even using a fewer number of touch lines and touch channels by employing an advanced touch sensor structure, even when more touch electrodes are used.

According to one or more embodiments of the present disclosure, the size or number of elements included in a touch driving circuit can be reduced by employing an advanced touch sensor structure and thereby reducing a number of touch channels even when a number of touch electrodes is increased. Accordingly, touch display devices with a reduced weight and small size can be provided.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION OF THE EMBODIMENTS

Figure 1:
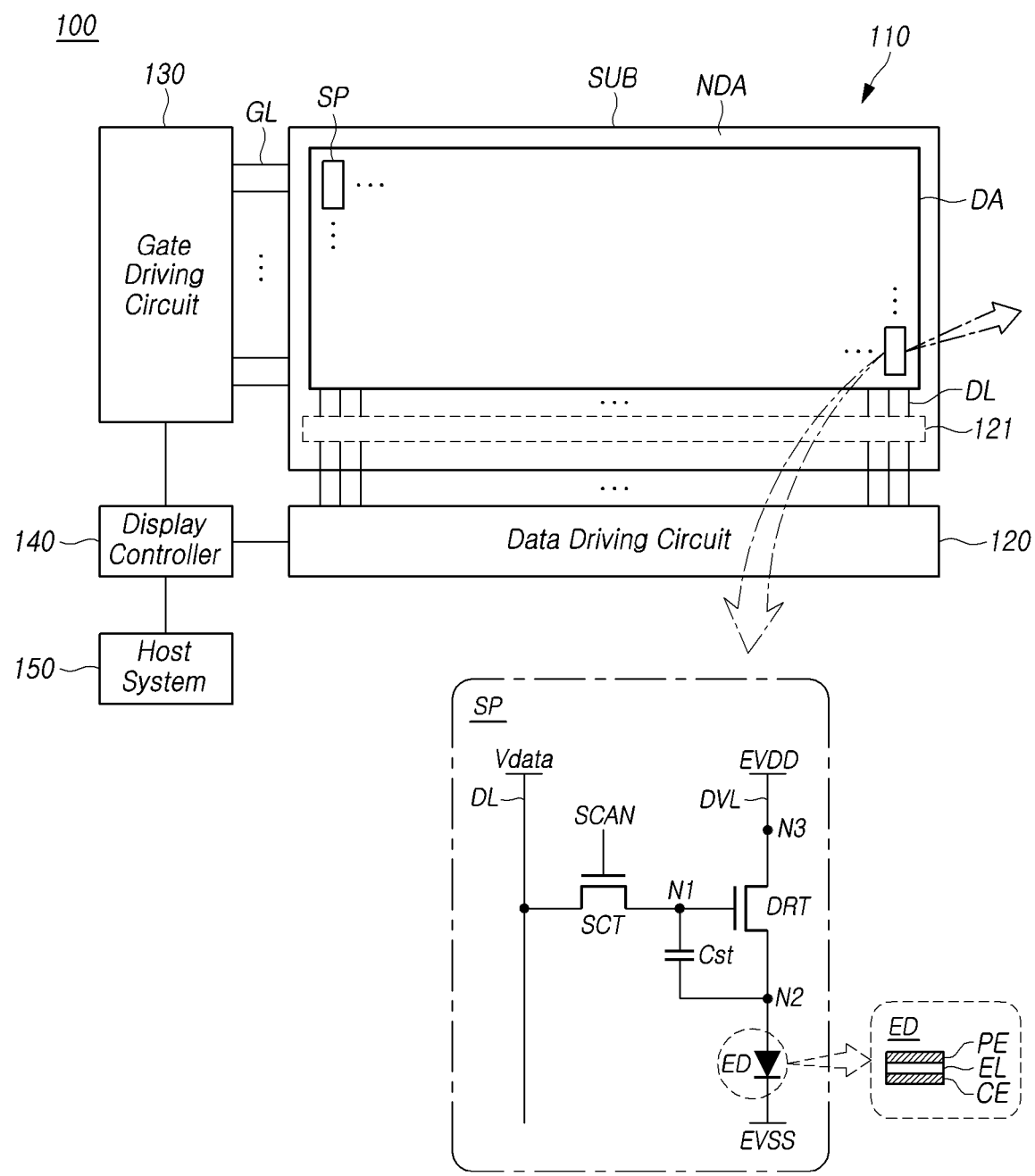
FIG. 1 illustrates an example system configuration for display driving in a touch display device according to aspects of the present disclosure.

Reference will now be made in detail to embodiments of the present disclosure, examples of which can be illustrated in the accompanying drawings.

In the following description, the structures, embodiments, implementations, methods and operations described herein are not limited to the specific example or examples set forth herein and can be changed as is known in the art, unless otherwise specified. Like reference numerals designate like elements throughout, unless otherwise specified. Names of the respective elements used in the following explanations are selected only for convenience of writing the specification and can thus be different from those used in actual products. Advantages and features of the present disclosure, and implementation methods thereof will be clarified through following example embodiments described with reference to the accompanying drawings. The present disclosure can, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the protected scope of the present disclosure is defined by claims and their equivalents. In the following description, where the detailed description of the relevant known function or configuration can unnecessarily obscure aspects of the present disclosure, a detailed description of such known function or configuration can be omitted. The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements can be added unless the term, such as "only," is used. An element described in the singular form is intended to include a plurality of elements, and vice versa, unless the context clearly indicates otherwise.

Although the terms "first," "second," A, B, (a), (b), and the like can be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

When it is mentioned that a first element "is connected or coupled to," "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc. each other via a fourth element. Here, the second element can be included in at least one of two or more elements that "are connected or coupled to," "contact or overlap," etc. each other.

Where positional relationships are described, for example, where the positional relationship between two parts is described using "on," "over," "under," "above," "below," "beside," "next," or the like, one or more other parts can be located between the two parts unless a more limiting term, such as "immediate(ly)," "direct(ly)," or "close(ly)" is used. For example, where an element or layer is disposed "on" another element or layer, a third element or layer can be interposed therebetween. Furthermore, the terms "left," "right," "top," "bottom," "downward," "upward," "upper," "lower," and the like refer to an arbitrary frame of reference.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can."

The following embodiments can be partially or entirely bonded to or combined with each other and can be linked and operated in technically various ways. The embodiments can be carried out independently of or in association with each other.

Hereinafter, various embodiments of the present disclosure will be described in detail with reference to the accompanying drawings. All the components of each display device according to all embodiments of the present disclosure are operatively coupled and configured.

FIG. 1 illustrates an example system configuration for display driving in a touch display device 100 according to aspects of the present disclosure.

Referring to FIG. 1, the display driving system of the touch display device 100 according to aspects of the present disclosure can include a display panel 110 and a display driving circuit for driving the display panel 110.

The display panel 110 can include a display area DA in which one or more images can be displayed and a non-display area NDA in which an image is not displayed. The display panel 110 can include a substrate SUB, and several types of transistors and signal lines disposed on the substrate SUB. The substrate SUB can include a display area DA and a non-display area NDA.

The display panel 110 can include a plurality of subpixels SP for image displaying. For example, the plurality of subpixels SP can be disposed in the display area DA. In one or more embodiments, at least one subpixel SP can be disposed in the non-display area NDA. The at least one subpixel SP disposed in the non-display area NDA can be referred to as a dummy subpixel.

For driving the plurality of subpixels SP, a plurality of signal line can be disposed in the display panel 110. For example, the plurality of signal lines can include a plurality of data lines DL and a plurality of gate lines GL. The signal lines can further include other types of signal lines, in addition to the plurality of data lines DL and the plurality of gate lines GL, according to a structure of the subpixel SP. For example, driving voltage lines DVL, and the like can be disposed in the display panel 110.

The plurality of data lines DL and the plurality of gate lines GL can intersect each other. Each of the plurality of data lines DL can extend in a first direction. Each of the plurality of gate lines GL can extend in a second direction different from the first direction. For example, the first direction can be a column or vertical direction, and the second direction can be a row or horizontal direction. Herein, the column direction and the row direction are not absolute directions, but relative directions. For example, the column direction can be the vertical direction and the row direction can be the horizontal direction. In another example, the column direction can be the horizontal direction and the row direction can be the vertical direction.

The display driving circuit can include a data driving circuit 120 for driving the plurality of data lines DL and a gate driving circuit 130 for driving the plurality of gate lines GL, and can further include a display controller 140 for controlling the data driving circuit 120 and the gate driving circuit 130.

The data driving circuit 120, which is a circuit for driving the plurality of data lines DL, can output data voltages (data signals) corresponding to image signals to the plurality of data lines DL.

The gate driving circuit 130, which is a circuit for driving the plurality of gate lines GL, can generate gate signals and output the generated gate signals to the plurality of gate lines GL.

The display controller 140 can control scanning operation to be performed according to timings established in each frame, and can control data driving according to scanning timings. The display controller 140 can convert image data inputted from an external device or system such as a host system 150 to a data signal form interpretable by the data driving circuit 120 and supply the converted image data resulting from the converting to the data driving circuit 120.

The display controller 140 can receive display driving control signals, as well as image data, from the host system 150. For example, the display driving control signals can include a vertical synchronization signal VSYNC, a horizontal synchronization signal HSYNC, an input data enable signal DE, a clock signal, and the like.

The display controller 140 can generate data driving control signals and gate driving control signals based on display driving control signals (e.g., VSYNC, HSYNC, DE, clock signal, and the like) inputted from the host system 150.

The display controller 140 can control the driving operation and driving timing of the data driving circuit 120 by supplying the data driving control signals to the data driving circuit 120. For example, the gate driving control signals can include a gate start pulse GSP, a gate shift clock GSC, a gate output enable signal GOE, and the like.

The display controller 140 can control the driving operation and driving timing of the gate driving circuit 130 by supplying the gate driving control signals to the gate driving circuit 130. For example, the data driving control signals can include a source start pulse SSP, a source sampling clock SSC, a source output enable signal SOE, and the like.

The data driving circuit 120 can include one or more source driver integrated circuits SDIC. Each source driver integrated circuit SDIC can include a shift register, a latch circuit, a digital-to-analog converter, an output buffer, and the like. In one or more embodiments, each source driver integrated circuit SDIC can further include an analog-to-digital converter.

For example, the source driver integrated circuit SDIC can be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

For example, the gate driving circuit 130 can be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another example, the gate driving circuit 130 can be disposed in the non-display area NDA of the display panel 110 in a gate in panel (GIP) type. The gate driving circuit 130 can be disposed on the substrate, or connected to the substrate. That is, in the situation of the GIP type, the gate driving circuit 130 can be disposed in the non-display area NDA of the substrate. In the situation of the chip on glass (COG) type, the chip on film (COF) type, or the like, the gate driving circuit 130 can be connected to the substrate.

For example, at least one of the data driving circuit 120 and the gate driving circuit 130 can be disposed in the display area DA. For example, at least one of the data driving circuit 120 and the gate driving circuit 130 can be disposed not to overlap with subpixels SP, or disposed to overlap with one or more, or all, of the subpixels SP.

The data driving circuit 120 can be located in, and/or electrically connected to, only one side or portion (e.g., an upper edge or a lower edge) of the display panel 110. In one or more embodiments, the data driving circuit 120 can be electrically connected to data pad units 121 located in, and/or electrically connected to, two sides or portions (e.g., an upper edge and a lower edge) of the display panel 110, or be electrically connected to data pad units 121 located in, and/or electrically connected to, at least two of four sides or portions (e.g., the upper edge, the lower edge, a left edge, and a right edge) of the display panel 110 according to driving schemes, panel design schemes, or the like.

The gate driving circuit 130 can be located in, and/or electrically connected to, only one side or portion (e.g., a left edge or a right edge) of the display panel 110. In one or more embodiments, the gate driving circuit 130 can be located in, and/or electrically connected to, two sides or portions (e.g., a left edge and a right edge) of the display panel 110, or be located in, and/or electrically connected to, at least two of four sides or portions (e.g., an upper edge, a lower edge, the left edge, and the right edge) of the display panel 110 according to driving schemes, panel design schemes, or the like.

The display controller 140 can be implemented as a separate component from the data driving circuit 120, or incorporated in the data driving circuit 120 and thus implemented in an integrated circuit.

The display controller 140 can be a timing display controller used in the typical display technology, or a controller or a control device configured to additionally perform other control functions in addition to the function of the typical timing display controller. In some embodiments, the display controller 140 can be a controller or a control device different from the timing display controller, or a circuitry or a component included in the controller or the control device. The display controller 140 can be implemented with various circuits or electronic components such as an integrated circuit (IC), a field programmable gate array (FPGA), an application specific integrated circuit (ASIC), a processor, and/or the like.

The display controller 140 can be mounted on a printed circuit board, a flexible printed circuit, and/or the like and be electrically connected to the data driving circuit 120 and the gate driving circuit 130 through the printed circuit board, flexible printed circuit, and/or the like.

The display controller 140 can transmit signals to, and receive signals from, the data driving circuit 120 via one or more predefined interfaces. In one or more embodiments, such interfaces can include a low voltage differential signaling (LVDS) interface, an embedded clock point-point interface (EPI), a serial peripheral interface (SPI), and the like.

The display controller 140 can include one or more storage media such as one or more registers.

In one or more aspects, the touch display device 100 can be a self-emission display device in which the display panel 110 itself emits light (e.g., no backlight unit is needed). In examples where the touch display device 100 according to aspects of the present disclosure employs self-emission display technology, each of a plurality of subpixels SP can include a light emitting element ED.

In one embodiment, the touch display device 100 according to aspects of the present disclosure can be an organic light emitting display device in which organic light emitting diodes (OLED) are implemented as light emitting elements ED. In another embodiment, the touch display device 100 according to aspects of the present disclosure can be an inorganic light emitting display device in which inorganic material-based light emitting diodes are implemented as light emitting elements ED. In further another embodiment, the touch display device 100 according to aspects of the present disclosure can be a quantum dot display device in which quantum dots, which are self-emission semiconductor crystals, are implemented as light emitting elements ED.

Referring to FIG. 1, in one or more embodiments, each of a plurality of subpixels SP included in the touch display device 100 can include a light emitting element ED, a driving transistor DRT for supplying a driving current to the light emitting element ED, a scan transistor SCT for enabling a data voltage VDATA corresponding to an image signal to be transmitted to the driving transistor DRT, a storage capacitor Cst for maintaining a voltage at an approximate constant level during a predefined period, and the like.

The light emitting element ED can include a pixel electrode PE and a common electrode CE, and an emission layer EL interposed between the pixel electrode PE and the common electrode CE. The light emitting element ED included in the subpixel SP can be, for example, an organic light emitting diode OLED, an inorganic light emitting diode LED, a quantum dot light emitting element, a micro light emitting diode (μLED), or the like.

The pixel electrode PE of the light emitting element ED can be an anode electrode (or a cathode electrode), and the common electrode CE of the light emitting element ED can be the cathode electrode (or the anode electrode). In one or more embodiments, a base voltage EVSS can be applied to the common electrode CE of the light emitting element ED. The base voltage EVSS can be, for example, a ground voltage, a low voltage, or a voltage similar to the ground voltage.

The driving transistor DRT can be a transistor for driving the light emitting element ED, and includes a first node N1, a second node N2, and a third node N3.

The first node N1 of the driving transistor DRT can be a gate node, and be electrically connected to a source node or a drain node of the scan transistor SCT.

The second node N2 of the driving transistor DRT can be a source node or a drain node, and be electrically connected to the anode electrode AE of the light emitting element ED.

The third node N3 of the driving transistor DRT can be the drain node or the source node, and a driving voltage EVDD can be applied thereto. The third node N3 of the driving transistor DRT can be electrically connected to a driving voltage line DVL for supplying the driving voltage EVDD.

The scan transistor SCT can control an interconnection between the first node N1 of the driving transistor DRT and a corresponding data line DL according to a scan signal SCAN supplied through a gate line GL.

The drain node or the source node of the scan transistor SCT can be electrically connected to the data line DL. The source node or the drain node of the scan transistor SCT can be electrically connected to the first node N1 of the driving transistor DRT. The gate node of the scan transistor SCT can be electrically connected to the gate line GL to receive the scan signal SCAN.

The scan transistor SCT can be turned on by the scan signal SCAN of a turn-on level voltage, and allow a data voltage Vdata transmitted through the data line DL to be transferred to the first node N1 of the driving transistor DRT.

The scan transistor SCT can be turned on by the scan signal SCAN of the turn-on level voltage and turned off by the scan signal SCAN of a turn-off level voltage. In one example where the scan transistor SCT is an n-type transistor, the turn-on level voltage can be a high level voltage (e.g., logical high), and the turn-off level voltage can be a low level voltage (e.g., logical low). In another example where the scan transistor SCT is an p-type transistor, the turn-on level voltage can be a low level voltage (e.g., logical low), and the turn-off level voltage can be a high level voltage (e.g., logical high).

The storage capacitor Cst can be electrically connected between the first node N1 and the second node N2 of the driving transistor DRT, and can maintain a data voltage Vdata corresponding to an image signal voltage or a voltage corresponding to this during one frame time.

The storage capacitor Cst can be an external capacitor intentionally designed to be located outside of the driving transistor DRT, and therefore, be different from an internal capacitor such as a parasitic capacitor (e.g., a Cgs, a Cgd) that can be formed between the first node N1 and the second node N2 of the driving transistor DRT.

Each of the driving transistor DRT and the scan transistor SCT can be an n-type transistor or a p-type transistor. Both of the driving transistor DRT and the scan transistor SCT can be n-type transistors or p-type transistors. At least one of the driving transistor DRT and the scan transistor SCT can be an n-type transistor (or a p-type transistor), and the remaining driving transistor DRT or scan transistor SCT can be the p-type transistor (or the n-type transistor).

It should be noted that the structure of each subpixel SP illustrated in FIG. 1 is merely an example for description, and embodiments are not limited thereto. For example, each subpixel SP can further include one or more transistors and/or one or more capacitors. In one or more embodiments, a plurality subpixels SP can have a same structure, or at least one of the plurality subpixels SP can have a different structure than the remaining subpixels SP.

In one or more embodiments, the touch display device 100 can be a transparent display allowing light to enter the front (or the back), and exit the back (or the front), of the touch display device 100 or the display panel 110 included in the touch display device 100. For example, in examples where the touch display device 100 is a transparent touch display device, one or more areas adjacent to one or more respective light emitting areas of one or more subpixels SP can be implemented as transmission areas.

Figure 2:
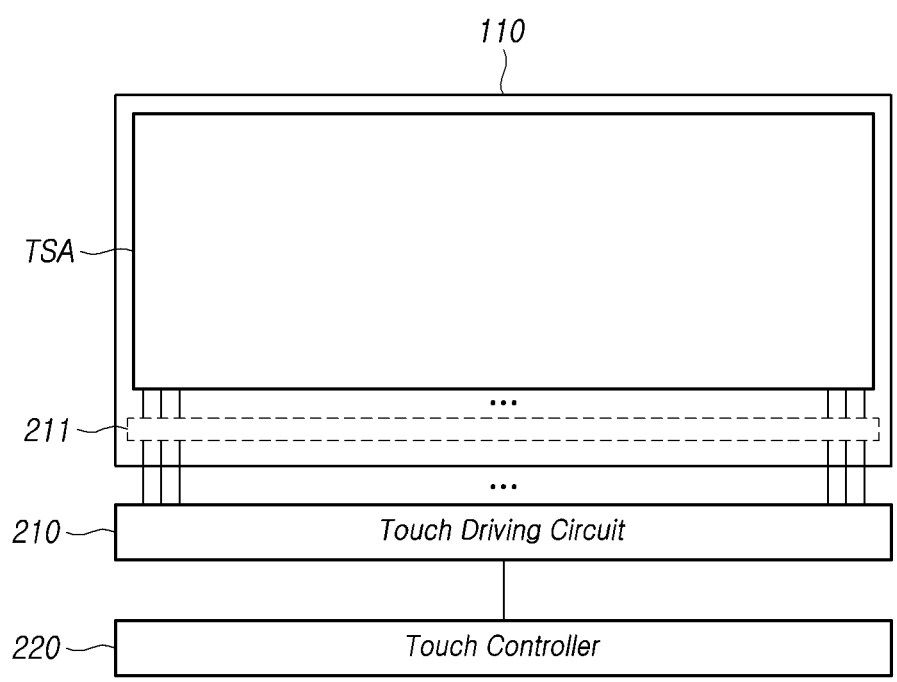
FIG. 2 illustrates an example system configuration for touch sensing in the touch display device according to aspects of the present disclosure.

FIG. 2 illustrates an example system configuration for touch sensing in the touch display device 100 according to aspects of the present disclosure.

Referring to FIG. 2, the touch display device 100 according to aspects of the present disclosure can include a touch sensing system for detecting a touch input by a touch pointer or a touch location of the touch pointer, as well as the function or system for image displaying as discussed above.

For example, such a touch pointer can be a touch object from a user such as a finger, a pen, or the like. Touching of a touch pointer on the display panel 110 can be performed such that the touch pointer touches the display panel 110 in a direct contact manner or in a contactless manner (which can be referred to as a hover mode manner).

The touch sensing system can include a touch sensor disposed in a touch sensing area TSA, and a touch circuit capable of detecting the presence or absence of a touch and/or a touch location (touch coordinates) by driving and sensing the touch sensor.

The touch circuit can include a touch driving circuit 210 capable of outputting touch sensing data by driving and sensing the touch sensor, and a touch controller 220 capable of detecting or recognizing a touch input or a touch event, or determining a touch location (touch coordinates) using the touch sensing data.

The touch sensor can include touch electrodes, and further include touch lines for electrical interconnections between the touch electrodes and the touch driving circuit 210. The touch lines can be referred to as touch routing lines.

The touch sensor can include one type of touch sensor metal, or can include two or more types of touch sensor metals.

The touch sensor can be included inside or outside of the display panel 110 (e.g., mounted on top or embedded within the display panel).

In examples where the touch sensor is included inside of the display panel 110, the touch sensor can be formed together while the display-related electrodes or lines are formed in the manufacturing process of the display panel 110. The touch sensor included inside of the display panel 110 can be referred to as an integrated type touch sensor. For example, the integrated type touch sensor can include an in-cell type touch sensor, an on-cell type touch sensor, or the like.

In examples where the touch sensor is disposed outside of the display panel 110, the display panel 110 and a touch panel including the touch sensor can be separately manufactured, and then, the touch panel and the display panel 110 can be bonded together to form the touch display device 100. For example, such a type of touch sensor, in which a touch panel including the touch sensor is bonded to the display panel 110, can include an add-on type touch sensor, or the like.

Hereinafter, for convenience of description, it is assumed that the touch sensor is included inside of the display panel 110. However, embodiments of the present disclosure are not limited thereto.

The touch sensor can be disposed in the touch sensing area TSA. For example, the location and/or size of the touch sensing area TSA can correspond to the location and/or size of the display area DA. In one or more embodiments, the location and/or size of the touch sensing area TSA can be different than the location and/or size of the display area DA.

The touch sensor can include a plurality of touch electrodes and a plurality of touch lines.

All or some of the plurality of touch electrodes can substantially serve as the touch sensor. An electrical attribute (e.g., capacitance, or the like) across at least one of the plurality of touch electrodes can vary according to the presence or absence of a touch input by a user such as touching a portion overlying, or directly touching, the at least one touch electrode.

The plurality of touch lines can electrically interconnect between the plurality of touch electrodes and the touch driving circuit 210. The touch driving circuit 210 can detect a change in an electrical attribute across a corresponding touch electrode through at least one of the plurality of touch lines.

In examples where the touch sensor is included inside of the display panel 110, a touch pad unit 211 can be disposed in the non-display area NDA of the display panel 110. The touch pad unit 211 can include a plurality of touch pads to which a plurality of touch lines are electrically connected, and be electrically connected to the touch driving circuit 210.

The touch pad unit 211 can be disposed on the substrate SUB of the display panel 110 and be disposed in the non-display area NDA located outside of the display area DA.

The touch driving circuit 210 can generate touch sensing data by driving and sensing the touch sensor. The touch driving circuit 210 can supply the generated touch sensing data to the touch controller 220.

The touch controller 220 can detect the presence or absence of a touch or a location (or coordinates) of the touch based on the touch sensing data. The touch controller 220 or any one or more other controllers operating in connection with, or by control of, the touch controller 220 can perform a predefined function (e.g., input processing, object selection processing, handwriting processing, etc.) based on the detection of the touch presence or the determination of a touch location or touch coordinates.

The touch driving circuit 210 can be implemented, for example, in a separate integrated circuit different from the data driving circuit 120. In another example, the touch driving circuit 210 and the data driving circuit 120 can be integrated and implemented in a single integrated circuit.

The touch controller 220 can be implemented separately from the display controller 140, or integrated with the display controller 140 and thus implemented in a single integrated circuit.

The touch display device 100 according to aspects of the present disclosure can detect a touch based on a self-capacitance based touch sensing system or a mutual-capacitance based touch sensing system.

Hereinafter, example structures of the touch sensor are briefly described with reference to FIGS. 3A and 3B.

Figure 3A:
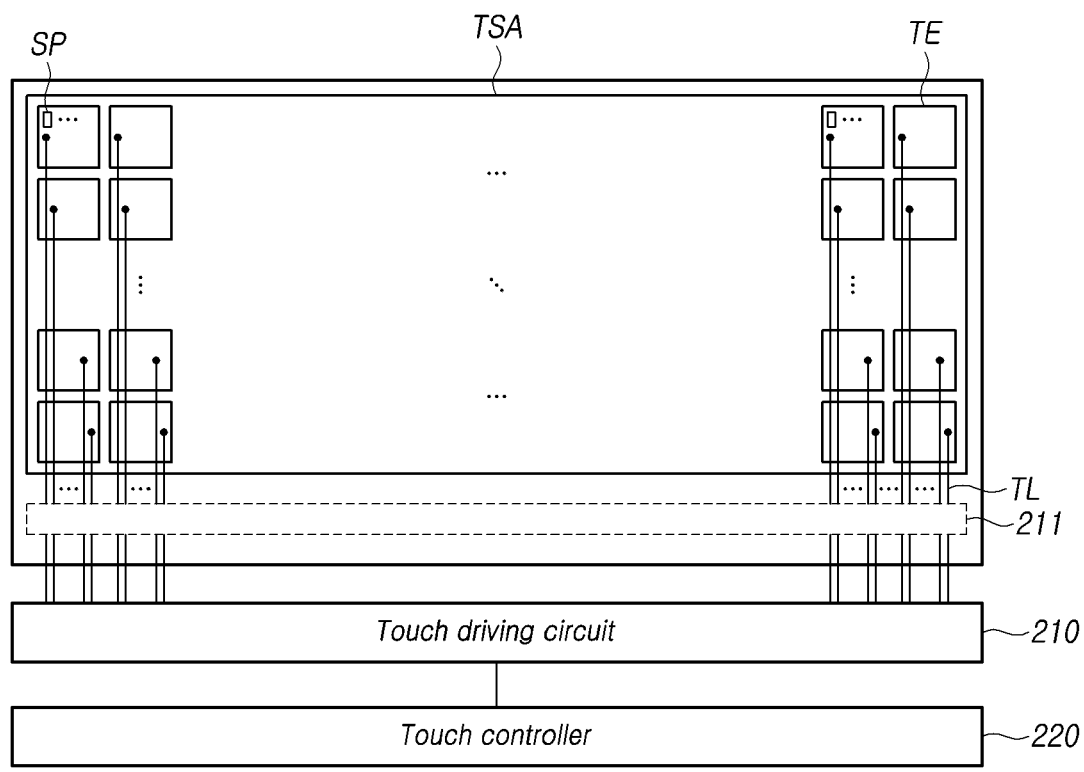
FIG. 3A illustrates an example touch sensor structure based on self-capacitance sensing in the touch display device according to aspects of the present disclosure.

FIG. 3A illustrates an example touch sensor structure based on self-capacitance sensing in the touch display device 100 according to aspects of the present disclosure.

Referring to FIG. 3A, in one or more embodiments, the touch sensor structure based on self-capacitance sensing employed in the touch display device 100 can include a plurality of touch electrodes TE disposed in the touch sensing area TSA.

Referring to FIG. 3A, in the touch sensor structure based on self-capacitance sensing, the plurality of touch electrodes TE can be disposed to be separated from each other in the touch sensing area TSA (e.g., divided from the common electrode).

Referring to FIG. 3A, the touch sensor structure based on self-capacitance sensing can further include a plurality of touch lines TL for electrically connecting each of the plurality of touch electrodes TE to the touch driving circuit 160. The touch lines TL can be also referred to as touch routing lines.

Referring to FIG. 3A, in the touch sensor based on self-capacitance sensing, each of the plurality of touch electrodes TE may not electrically intersect one another. In the touch sensor based on self-capacitance sensing, each of the plurality of touch electrodes TE can be a respective touch node corresponding to touch coordinates.

Referring to FIG. 3A, in examples where the touch display device 100 is configured to detect a touch based on self-capacitance, the touch driving circuit 160 can supply a touch driving signal to at least one of the plurality of touch electrodes TE and sense the at least one touch electrode TE to which the touch driving signal is supplied.

A value obtained by sensing a touch electrode TE to which a touch driving signal is supplied can be a capacitance, or a value corresponding to the capacitance, across the touch electrode TE to which the touch driving signal is supplied. The capacitance across the touch electrode TE to which the touch driving signal is supplied can be a capacitance between the touch electrode TE to which the touch driving signal is supplied and a touch pointer or object such as a finger, a pen, or the like.

Figure 3B:
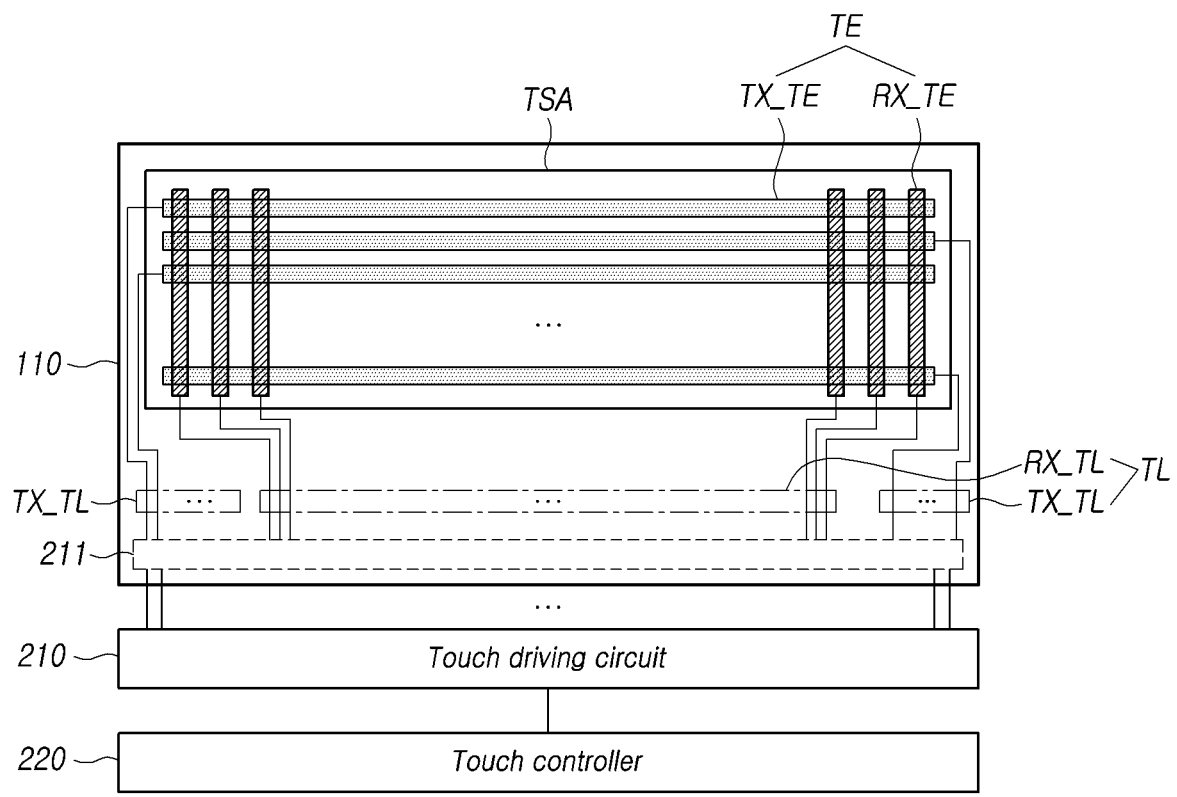
FIG. 3B illustrates an example touch sensor structure based on mutual-capacitance sensing in the touch display device according to aspects of the present disclosure.

FIG. 3B illustrates an example touch sensor structure based on mutual-capacitance sensing in the touch display device 100 according to aspects of the present disclosure.

The touch sensor structure based on mutual-capacitance sensing of FIG. 3B illustrates an example structure inclusively representing various types of touch sensor structures based on mutual-capacitance sensing. Therefore, embodiments of the present disclosure are not limited thereto, and can be variously modified.

Referring to FIG. 3B, in one or more embodiments, the touch sensor structure based on mutual-capacitance sensing employed in the touch display device 100 can include a plurality of touch electrodes TE. The plurality of touch electrodes TE can include a plurality of transmission touch electrodes TX_TE and a plurality of reception touch electrodes RX_TE.

For example, the plurality of transmission touch electrodes TX_TE and the plurality of reception touch electrodes RX_TE can intersect each other. In another example, the plurality of transmission touch electrodes TX_TE and the plurality of reception touch electrodes RX_TE can be disposed adjacent to each other without intersecting each other such that a respective one side of each of the plurality of transmission touch electrodes TX_TE is located adjacent to a respective one side of each of the plurality of reception touch electrodes RX_TE.

In another example, the plurality of transmission touch electrodes TX_TE and the plurality of reception touch electrodes RX_TE can overlap each other vertically. In another example, each of the plurality of reception touch electrodes RX_TE can be disposed on a respective one side of each of the plurality of transmission touch electrodes TX_TE.

Mutual-capacitance can be formed at respective points where each transmission touch electrode TX_TE and each reception touch electrode RX_TE intersect or one or more points adjacent to the respective points where each transmission touch electrode TX_TE and each reception touch electrode RX_TE intersect with each other. A point where one transmission touch electrode TX_TE and one reception touch electrode RX_TE intersect or a point adjacent to the point where one transmission touch electrode TX_TE and one reception touch electrode RX_TE intersect can be referred to as a touch node.

Each of the plurality of reception touch electrodes RX_TE can form mutual-capacitances with the plurality of transmission touch electrodes TX_TE, or a respective one of the plurality of transmission touch electrodes TX_TE. At least one of the mutual-capacitances can vary according to the presence or absence of a touch at a location where the at least one the mutual-capacitance is caused.

Referring to FIG. 3B, in one or more embodiments, the touch sensor structure of the touch display device 100 can further include a plurality of touch lines TL.

The plurality of touch lines TL can include a plurality of transmission touch lines TX_TL for electrically connecting the plurality of transmission touch electrodes TX_TE to the touch pad unit 211, and a plurality of reception touch lines RX_TL for electrically connecting the plurality of reception touch electrodes RX_TE to the touch pad unit 211.

The plurality of transmission touch lines TX_TL can be electrically connected to the touch driving circuit 210 electrically connected to the touch pad unit 211 through the touch pad unit 211. The plurality of reception touch lines RX_TL can be electrically connected to the touch driving circuit 210 electrically connected to the touch pad unit 211 through the touch pad unit 211.

The touch driving circuit 210 can supply a touch driving signal to at least one of the plurality of transmission touch electrodes TX_TE and sense at least one of the plurality of reception touch electrodes RX_TE. The plurality of transmission touch electrodes TX_TE can be also referred to as driving touch electrodes, and the plurality of reception touch electrodes RX_TE can be also referred to as sensing touch electrodes.

For example, referring to the example shown in FIG. 3B, each of the plurality of transmission touch electrodes TX_TE can be disposed to extend in a row direction (e.g., an X-axis direction or horizontal direction), and each of the plurality of reception touch electrodes RX_TE can be disposed to extend in a column direction (e.g., a Y-axis direction or vertical direction).

In another example, each of the plurality of transmission touch electrodes TX_TE can be disposed to extend in the column direction (e.g., the Y-axis direction or vertical direction), and each of the plurality of reception touch electrodes RX_TE can be disposed to extend in the row direction (e.g., the X-axis direction or horizontal direction).

For convenience of description, as illustrated in FIG. 3B, discussions that follow are provided based on examples where each of the plurality of transmission touch electrodes TX_TE is disposed to extend in the row direction (e.g., the X-axis direction or horizontal direction), and each of the plurality of reception touch electrodes RX_TE is disposed to extend in the column direction (e.g., the Y-axis direction or vertical direction). However, embodiments of the present disclosure are not limited thereto.

Each of the plurality of transmission touch electrodes TX_TE can be formed with one touch sensor metal as shown in FIG. 3B. For example, one transmission touch electrode TX_TE formed with one touch sensor metal can have a bar shape as illustrated in FIG. 3B, or can include first portions, each of which has a relatively large area (e.g., a rhombic shape), and one or more second portions, each of which has a relatively small area for interconnecting the first portions.

Each of the plurality of transmission touch electrodes TX_TE can be formed with two or more metals located in different layers from each other. For example, one transmission touch electrode TX_TE formed with two metals can include first partial electrodes, each of which has a relatively large area (e.g., a rhombic shape), and one or more second partial electrodes, each of which has a relatively small area for interconnecting the first partial electrodes. The first partial electrodes can be formed with respective touch sensor metals, and the one or more second partial electrodes can be formed with one or more respective bridge metals. The touch sensor metal and the bridge metal can be located in different layers with an intervening interlayer insulating layer.

Each of the plurality of reception touch electrodes RX_TE can be formed with one touch sensor metal as shown in FIG. 3B. For example, one reception touch electrode RX_TE formed with one touch sensor metal can have a bar shape as illustrated in FIG. 3B, or can include first portions, each of has a relatively large area (e.g., a rhombic shape), and one or more second portions, each of which has a relatively small area for interconnecting the first portions.

Each of the plurality of reception touch electrodes RX_TE can be formed with two or more metals located in different layers from each other. For example, one reception touch electrode RX_TE formed with two metals can include first partial electrodes, each of which has a relatively large area (e.g., a rhombic shape), and one or more second partial electrodes, each of which has a relatively small area for interconnecting the first partial electrodes. The first partial electrodes can be formed with respective touch sensor metals, and the one or more second partial electrodes can be formed with one or more respective bridge metals. The touch sensor metal and the bridge metal can be located in different layers with an intervening interlayer insulating layer.

The plurality of transmission touch electrodes TX_TE and the plurality of reception touch electrodes RX_TE can be disposed in or on a same layer or can be disposed on different layers.

The plurality of touch lines TL can be formed with at least one of the touch sensor metal and the bridge metal, or can be formed with a third metal different from the touch sensor metal and the bridge metal.

Figure 4A:
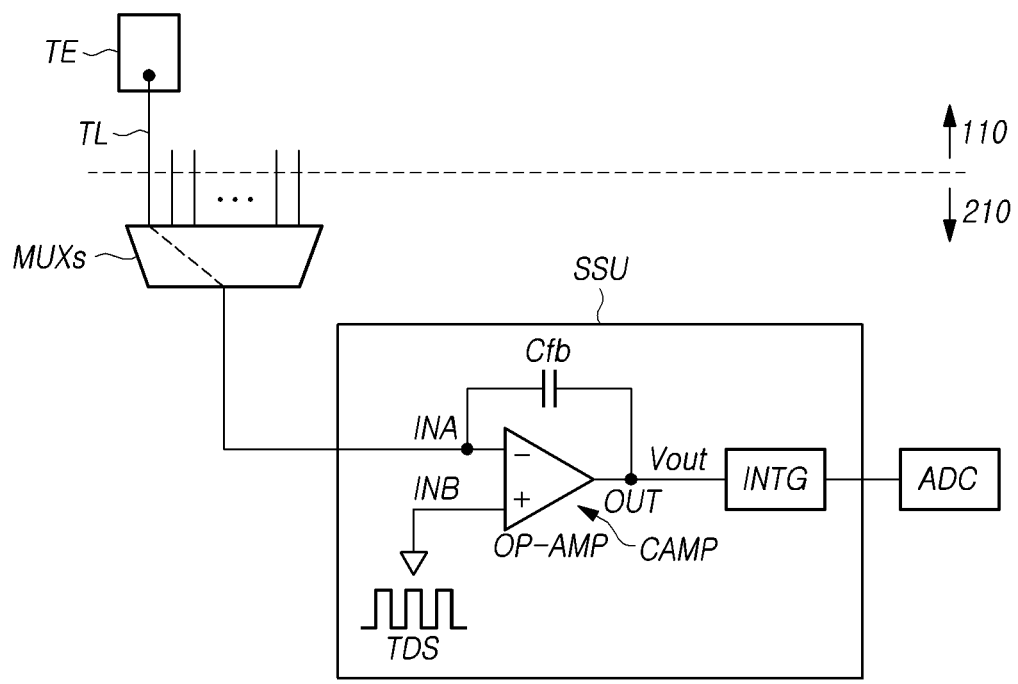
FIG. 4A illustrates an example touch driving circuit operating in the touch sensor structure based on self-capacitance sensing in the touch display device according to aspects of the present disclosure.

FIG. 4A illustrates an example touch driving circuit 210 operating in the touch sensor structure based on self-capacitance sensing in the touch display device 100 according to aspects of the present disclosure.

Referring to FIG. 4A, the touch driving circuit 210 can include one or more self-sensing units SSU and one or more analog-to-digital converters ADC.

Referring to FIG. 4A, the self-sensing unit SSU can detect a signal corresponding to a capacitance across a touch electrode TE after driving the touch electrode TE and sensing the touch electrode TE. The self-sensing unit SSU can include a charge amplifier CAMP, an integrator INTG, and the like. The integrator INTG can be included in the charge amplifier CAMP or can be omitted.

Referring to FIG. 4A, the charge amplifier CAMP can include an operational amplifier OP-AMP including a first input node INA electrically connected to a touch line TL, a second input node INB to which a touch driving signal TDS is input, and an output node OUT for outputting an output signal Vout, and a feedback capacitor Cfb between the first input node INA and the output node OUT of the operational amplifier OP-AMP.

The touch driving signal TDS input to the second input node INB can be output to the touch line TL through the first input node INA. For example, the touch driving signal TDS can be a signal with voltage levels varying over time, and swing with a predefined frequency and a predefined amplitude. The touch driving signal TDS can have various signal waveforms, such as a square wave, a sine wave, a triangular wave, or the like.

Referring to FIG. 4A, the touch driving circuit 210 can further include one or more self-multiplexers MUXs for selecting one of a plurality of touch lines TL and connecting the selected touch line TL to the self-sensing unit SSU.

As a touch gesture is performed by a user, a capacitance (self-capacitance) can be formed between a touch pointer of the user (e.g., a finger, a pen, or the like) and an adjacent touch electrode TE. Electric charges corresponding to the capacitance can be transferred to the first input node INA of the charge amplifier CAMP through a corresponding touch line TL. Electric charges transferred to the first input node INA of the charge amplifier CAMP can be stored in the feedback capacitor Cfb of the charge amplifier CAMP.

The charge amplifier CAMP can output a voltage corresponding to the amount of electric charge stored in the feedback capacitor Cfb as an output signal Vout through the output node OUT.

Referring to FIG. 4A, the integrator INTG can integrate output signals (e.g., voltage values) Vout of the charge amplifier CAMP at a predefined number of times, and output an integral value resulting from the integrating.

Referring to FIG. 4A, the analog-to-digital converter ADC can convert the signal (e.g., the integral value) output from the integrator INTG into a sensing value in the form of digital value. The touch driving circuit 210 can output the sensing value obtained by the analog-to-digital converter ADC as sensing data by using a communication module.

Meanwhile, referring to FIG. 4A, the second input node INB of the operational amplifier OP-AMP of the charge amplifier CAMP, to which the touch driving signal TDS is input, can be electrically connected to a reference voltage line RVL used for display driving in the display mode. In this situation, the touch driving signal TDS can also be used as a reference voltage Vref used while the touch display device 100 operates for display driving, which can help reduce noise and parasitic capacitance. The reference voltage Vref can be a voltage (e.g., the base voltage EVSS as described above with reference to FIG. 1) applied to the second node N2 of the driving transistor DRT of the subpixel SP.

Figure 4B:
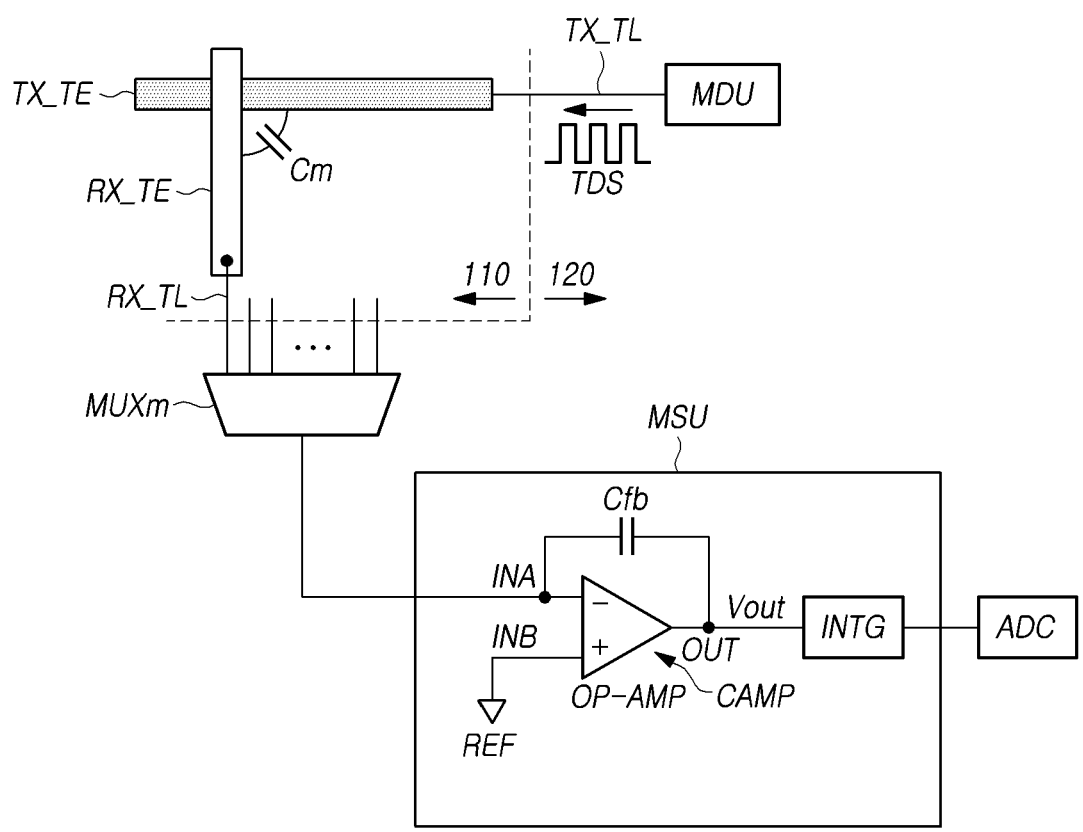
FIG. 4B illustrates an example touch driving circuit operating in the touch sensor structure based on mutual-capacitance sensing in the touch display device according to aspects of the present disclosure.

FIG. 4B illustrates an example touch driving circuit 210 operating in the touch sensor structure based on mutual-capacitance sensing in the touch display device 100 according to aspects of the present disclosure.

Referring to FIG. 4B, the touch driving circuit 210 can include a mutual-driving unit MDU for driving one or more transmission touch electrodes TX_TE and a mutual-sensing unit MSU for sensing one or more reception touch electrodes RX_TE.

Referring to FIG. 4B, the mutual-driving unit MDU can supply a touch driving signal TDS to one or more transmission touch electrodes TX_TE through one or more transmission touch line TX_TL. For example, the touch driving signal TDS can be a signal with voltage levels varying over time, and swing with a predefined frequency and a predefined amplitude. The touch driving signal TDS can have various signal waveforms such as a square wave, a sine wave, a triangular wave, or the like.

Referring to FIG. 4B, the mutual-sensing unit MSU can detect a signal corresponding to a capacitance (mutual-capacitance) between a reception touch electrode RX_TE and a transmission touch electrode TX_TE through a reception touch line RX_TL.

The mutual-sensing unit MSU can include a charge amplifier CAMP, an integrator INTG, and the like. The integrator INTG can be included in the charge amplifier CAMP or can be omitted.

The charge amplifier CAMP can include an operational amplifier OP-AMP including a first input node INA electrically connected to a reception touch line RX_TL, a second input node INB to which a reference voltage REF is input, and an output node OUT for outputting an output signal Vout, and a feedback capacitor Cfb between the first input node INA and the output node OUT of the operational amplifier OP-AMP.

Referring to FIG. 4B, the touch driving circuit 210 can further include one or more mutual-multiplexers MUXm for selecting one of a plurality of reception touch lines RX_TL and connecting the selected reception touch line RX_TL to the mutual-sensing unit MSU.

As a touch gesture is performed by a user, a capacitance (mutual-capacitance) can be formed between a transmission touch electrode TX_TE and a reception touch line RX_TL that are located at, or adjacent to, a touch pointer of the user (e.g., a finger, a pen, or the like). Electric charges corresponding to the capacitance can be transferred to the first input node INA of the charge amplifier CAMP through the reception touch line RX_TL. Electric charges transferred to the first input node INA of the charge amplifier CAMP can be stored in the feedback capacitor Cfb of the charge amplifier CAMP.

The charge amplifier CAMP can output a voltage corresponding to the amount of electric charges stored in the feedback capacitor Cfb as an output signal Vout through the output node OUT.

Referring to FIG. 4B, the integrator INTG can integrate output signals (e.g., voltage values) Vout of the charge amplifier CAMP at a predefined number of times, and output an integral value resulting from the integrating.

Referring to FIG. 4B, the analog-to-digital converter ADC can convert the signal (e.g., the integral value) output from the integrator INTG into a sensing value in the form of digital value. The touch driving circuit 210 can output the sensing value obtained by the analog-to-digital converter ADC as sensing data by using a communication module.

According to the touch sensor structure based on self-capacitance sensing of FIG. 3A and the touch sensor structure based on mutual-capacitance sensing of FIG. 3B, a number of touch lines TL used can at least be as many as a number of touch electrodes because one touch line TL can be used for each touch electrode TE.

Thus, according to the touch sensor structure based on self-capacitance sensing of FIG. 3A and the touch sensor structure based on mutual-capacitance sensing of FIG. 3B, a number of touch pads in the touch pad unit 211 can be the same as a number of touch lines, but embodiments are not limited thereto.

In turn, according to the touch sensor structure based on self-capacitance sensing of FIG. 3A and the touch sensor structure based on mutual-capacitance sensing of FIG. 3B, a number of channels (a number of touch channels) of the touch driving circuit 210 can be also equal to a number of touch electrodes, but embodiments are not limited thereto.

In an example where the touch display device 100 is configured to have a large size or a high touch sensing resolution, a number of touch electrodes in the touch display device 100 can increase, and in turn, a number of touch lines, a number of touch pads, and a number of channels can be considerably increased, which can complicate the design and increase the manufacturing costs.

To address these issues, the touch display device 100 according to aspects of the present disclosure can include advanced touch sensor structures capable of reducing a number of channels, even when the number of touch electrodes is increased. Herein, a number of channels can represent the same meaning as all, or one or more, of a number of touch lines, a number of touch pads, and a number of touch channels.

The touch display device 100 according to aspects of the present disclosure can provide advantages of reducing a number of touch lines, reducing a number of touch pads, and reducing a number of touch channels, while also providing a high touch resolution by applying advanced touch sensor structures even when a larger amount of touch electrodes are used. Herein, the term "touch resolution" can represent accuracy of touch sensing, and more specifically, mean a factor for representing an ability to accurately distinguish two different touch points. In an example where a touch display device has a low touch resolution, the touch display device can determine two different touch points to have same touch coordinates. In another example where a touch display device has a high touch resolution, the touch display device can accurately distinguish two different touch points, and accurately determine respective touch coordinates different from each other.

In one or more embodiments, the advanced touch sensor structures applied to the touch display device 100 can include advanced touch sensor structures based on self-capacitance sensing and advanced touch sensor structures based on mutual-capacitance sensing.

Hereinafter, the advanced touch sensor structures based on self-capacitance sensing in the touch display device 100 according to aspects of the present disclosure will be described with reference to FIGS. 5A, 5B, 6A, 6B, 7A, and 7B. Thereafter, the advanced touch sensor structures based on mutual-capacitance sensing in the touch display device 100 according to aspects of the present disclosure will be described with reference to FIGS. 8A and 8B.

Figure 5A:
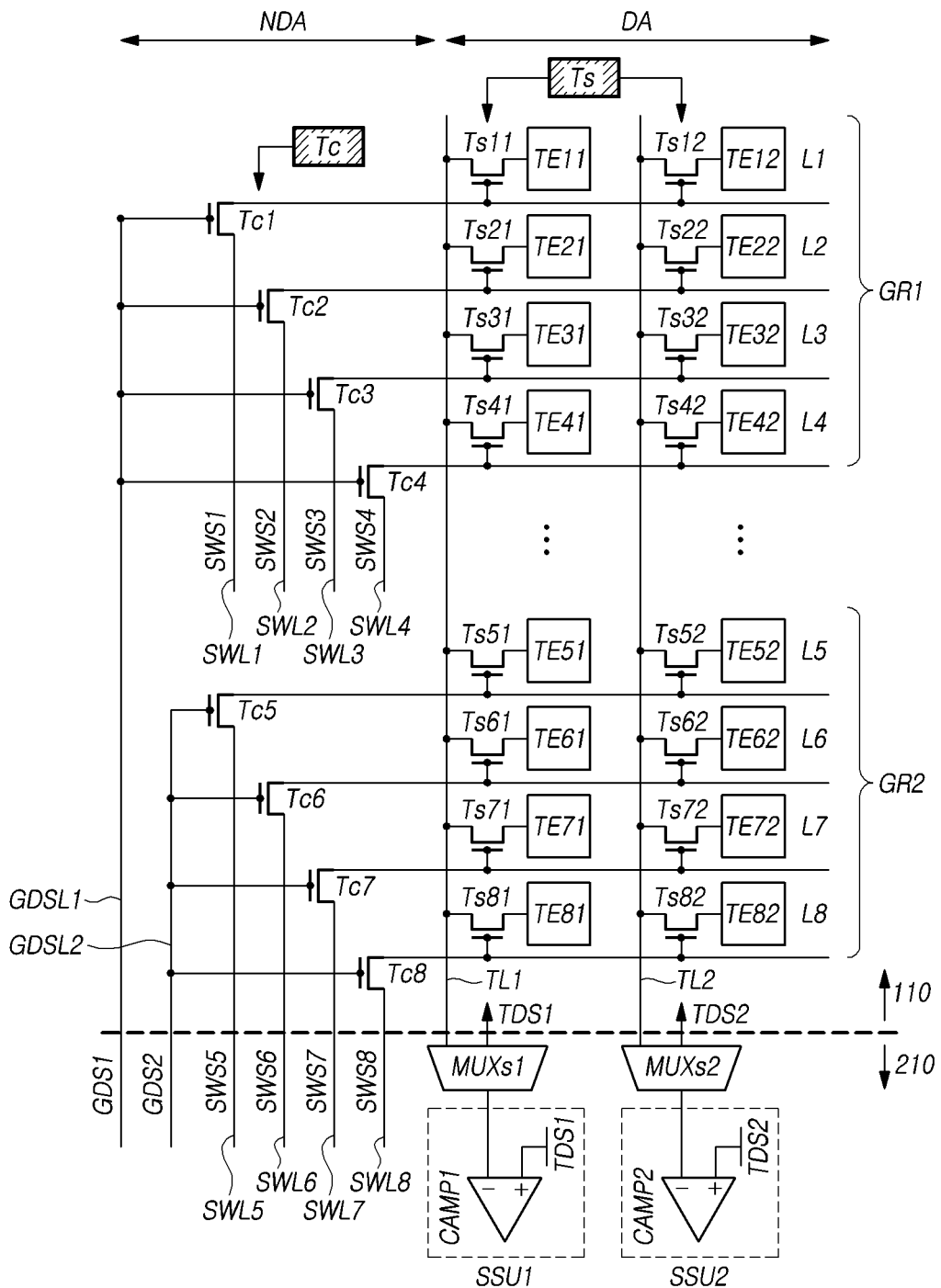
FIGS. 5A and 5B illustrate example advanced touch sensor structures based on self-capacitance sensing in the touch display device according to aspects of the present disclosure.
Figure 5B:
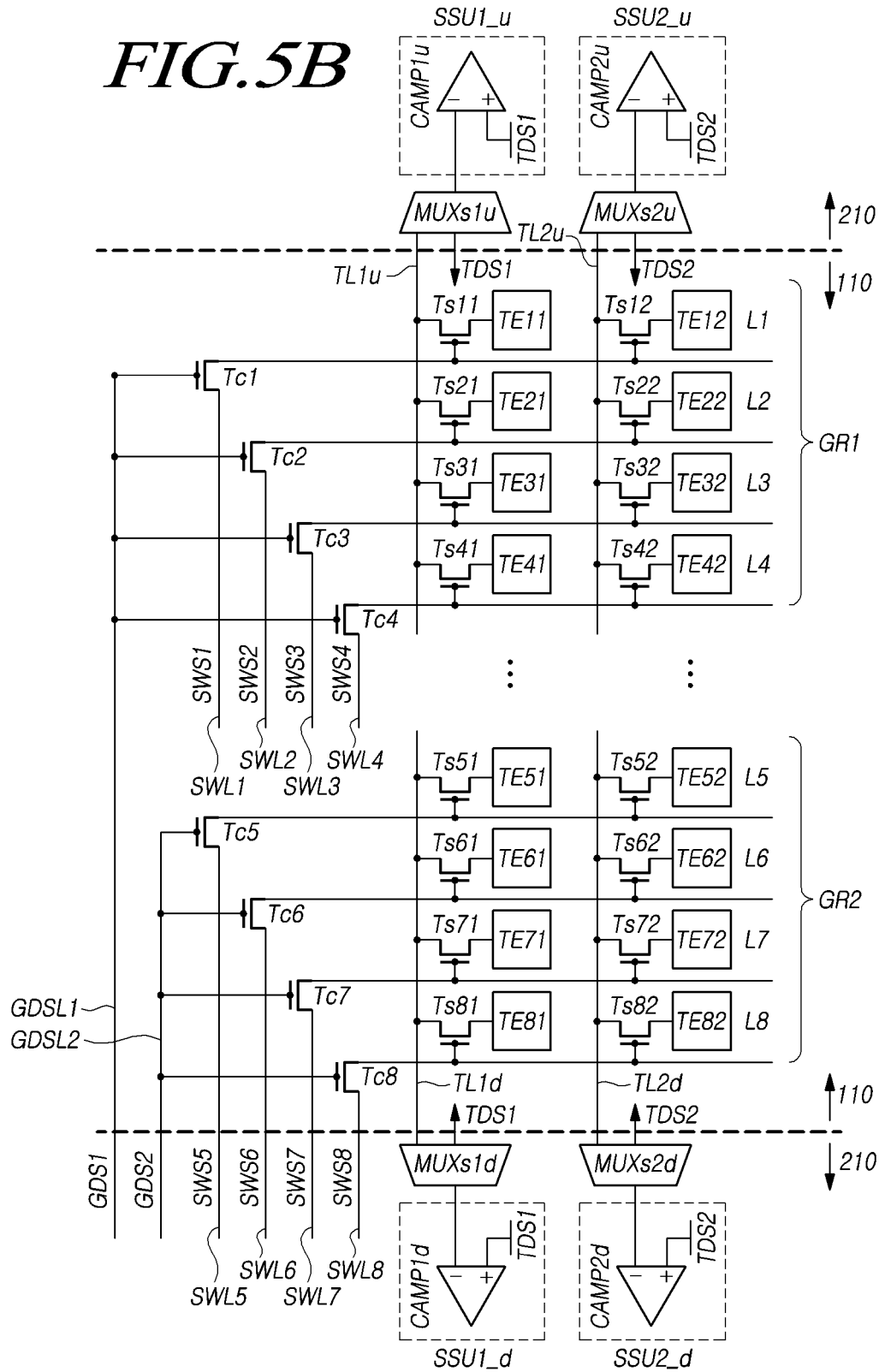
Figure 6A:
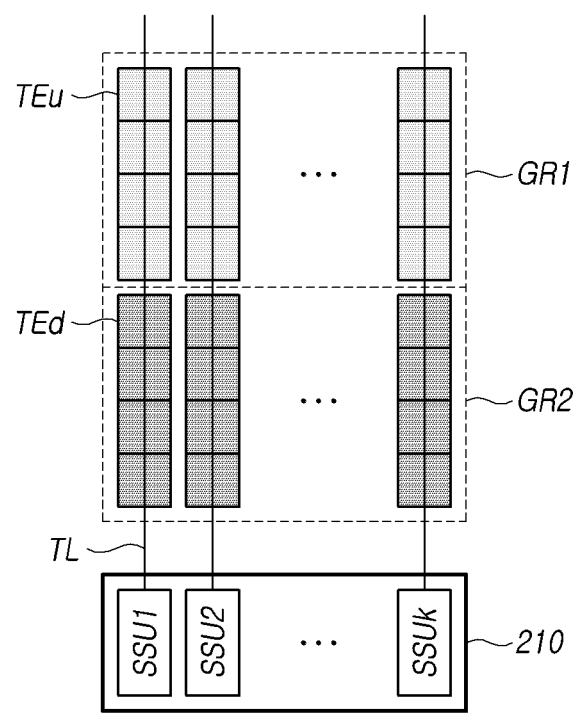
FIGS. 6A and 6B illustrate example two schemes for interconnecting touch electrodes and the touch driving circuit in the advanced touch sensor structures based on self-capacitance sensing in the touch display device according to aspects of the present disclosure.
Figure 6B:
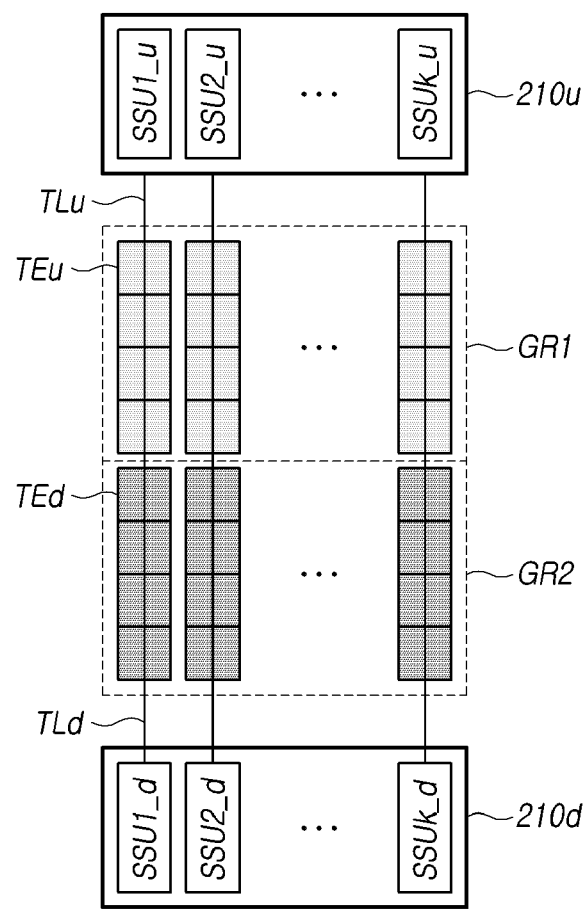

FIGS. 5A and 5B illustrate example advanced touch sensor structures based on self-capacitance sensing in the touch display device 100 according to aspects of the present disclosure. FIGS. 6A and 6B illustrate examples of two schemes for interconnecting touch electrodes TE and the touch driving circuit 210 in the advanced touch sensor structures based on self-capacitance sensing of the touch display device 100 according to aspects of the present disclosure.

Referring to FIGS. 5A and 5B, the advanced touch sensor structures based on self-capacitance sensing of the touch display device 100 according to aspects of the present disclosure can include a plurality of touch electrodes TE and a plurality of touch driving transistors Ts.

Referring to FIGS. 5A and 5B, in one or more embodiments, the advanced touch sensor structures based on self-capacitance sensing of the touch display device 100 can further include a plurality of touch lines TL.

Referring to FIGS. 5A and 5B, the plurality of touch driving transistors Ts can be connected to the plurality of touch electrodes TE, respectively. That is, the plurality of touch driving transistors Ts can correspond to the plurality of touch electrodes TE on a one-to-one basis. Each of the plurality of touch lines TL can be connected to two or more touch electrodes TE through two or more touch driving transistors Ts.

Referring to FIGS. 5A and 5B, the plurality of touch electrodes TE can include first to eighth touch electrode rows L1 to L8.

Referring to FIGS. 5A and 5B, a first touch electrode row L1 can include a plurality of first touch electrodes (TE11, TE12); a second touch electrode row L2 can include a plurality of second touch electrodes (TE21, TE22); a third touch electrode row L3 can include a plurality of third touch electrodes (TE31, TE32); a fourth touch electrode row L4 can include a plurality of fourth touch electrodes (TE41, TE42); a fifth touch electrode row L5 can include a plurality of fifth touch electrodes (TE51, TE52); a sixth touch electrode row L6 can include a plurality of sixth touch electrodes (TE61, TE62); a seventh touch electrode row L7 can include a plurality of seventh touch electrodes (TE71, TE72): and an eighth touch electrode row L8 can include a plurality of eighth touch electrodes (TE81, TE82).

Referring to FIGS. 5A and 5B, for group-based driving, the first to fourth touch electrode rows L1 to L4 can be organized as a first touch electrode group GR1, and the fifth to eighth touch electrode rows L5 to L8 can be organized as a second touch electrode group GR2.

Referring to FIGS. 6A and 6B, the first to fourth touch electrodes (TE11, TE12, TE21, TE22, TE31, TE32, TE41, TE42) included in the first touch electrode group GR1 can be referred to as upper touch electrodes TEu, and the fifth to eighth touch electrodes (TE51, TE52, TE61, TE62, TE71, TE72, TE81, TE82) included in the second touch electrode group GR2 can be referred to as lower touch electrodes TEd.

Referring to FIGS. 5A and 6A, the touch driving circuit 210 can include a plurality of self-sensing units (SSU1 to SSUk, where k is a natural number equal to or greater than 2). The plurality of self-sensing units SSU1 to SSUk can be located in one side or an edge of the display panel 110. For example, the plurality of self-sensing units SSU1 to SSUk can be connected to a touch pad unit 211 (e.g., the touch pad unit 211 in the figures discussed above) located in a portion of the non-display area NDA that is relatively closer to the second touch electrode group GR2 than the first touch electrode group GR1.

Referring to FIGS. 5A and 6A, the plurality of self-sensing units SSU1 to SSUk can sense both the first touch electrode group GR1 and the second touch electrode group GR2. For example, the plurality of self-sensing units SSU1 to SSUk can sense both the upper touch electrodes TEu and the lower touch electrodes TEd.

Referring to FIGS. 5A and 6A, eight touch electrodes (TE11, TE21, TE31, TE41, TE51, TE61, TE71 and TE81) disposed in the first column in the first touch electrode group GR1 and the second touch electrode group GR2 can correspond to one first touch line TL1 of the plurality of touch lines TL.

Referring to FIGS. 5A and 6A, the eight touch electrodes (TE11, TE21, TE31, TE41, TE51, TE61, TE71 and TE81) disposed in the first column can be electrically connected to the one first touch line TL1 of the plurality of touch lines TL through eight touch driving transistors (Ts11, Ts21, Ts31, Ts41, Ts51, Ts61, Ts71, and Ts81), respectively.

Accordingly, the number of touch lines, the number of touch pads, and the number of channels can be significantly reduced because only one first touch line TL1 is disposed for the eight touch electrodes (TE11, TE21, TE31, TE41, TE51, TE61, TE71 and TE81) disposed in the first column. In order words, the same touch line can be used for eight different touch electrodes disposed in the same column.

Further, referring to FIGS. 5A and 6A, eight touch electrodes (TE12, TE22, TE32, TE42, TE52, TE62, TE72 and TE82) disposed in the second column in the first touch electrode group GR1 and the second touch electrode group GR2 can correspond to one second touch line TL2 of the plurality of touch lines TL.

Referring to FIGS. 5A and 6A, the eight touch electrodes (TE12, TE22, TE32, TE42, TE52, TE62, TE72 and TE82) disposed in the second column can be electrically connected to the one second touch line TL2 of the plurality of touch lines TL through eight touch driving transistors (Ts12, Ts22, Ts32, Ts42, Ts52, Ts62, Ts72, and Ts82), respectively.

Accordingly, the number of touch lines, the number of touch pads, and the number of channels can be significantly reduced because only one second touch line TL2 is disposed for the eight touch electrodes (TE12, TE22, TE32, TE42, TE52, TE62, TE72 and TE82) disposed in the second column.

Referring to FIGS. 5B and 6B, the touch driving circuit 210 can include a plurality of upper self-sensing units (SSU1_u to SSUk_u, where k is a natural number equal to or greater than 2) and a plurality of lower self-sensing units (SSU1_d to SSUk_d, where k is a natural number equal to or greater than 2).

Referring to FIGS. 5B and 6B, the plurality of upper self-sensing units SSU1_u to SSUk_u can be located in one side or an edge of the display panel 110. The plurality of lower self-sensing units SSU1_d to SSUk_d can be located in another side or another edge of the display panel 110. For example, the plurality of upper self-sensing units SSU1_u to SSUk_u can be connected to a touch pad unit 211 located in a portion of the non-display area NDA that is relatively closer to the first touch electrode group GR1 than the second touch electrode group GR2. The plurality of lower self-sensing units SSU1_d to SSUk_d can be connected to a touch pad unit 211 (e.g., the touch pad unit 211 in the figures discussed above) located in a portion of the non-display area NDA that is relatively closer to the second touch electrode group GR2 than the first touch electrode group GR1.

Referring to FIGS. 5B and 6B, the plurality of upper self-sensing units SSU1_u to SSUk_u can sense the first touch electrode group GR1. For example, the plurality of upper self-sensing units SSU1_u to SSUk_u can sense the upper touch electrodes TEu. The plurality of lower self-sensing units SSU1_d to SSUk_d can sense the second touch electrode group GR2. For example, the plurality of lower self-sensing units SSU1_d to SSUk_d can sense the lower touch electrodes TEd.

Referring to FIGS. 5B and 6B, four upper touch electrodes (TE11, TE21, TE31, and TE41) disposed in the first column in the first touch electrode group GR1 can correspond to one first upper touch line TL1u of the plurality of upper touch lines TLu. Four lower touch electrodes (TE51, TE61, TE71, and TE81) disposed in the first column in the second touch electrode group GR2 can correspond to one first lower touch line TL1d of the plurality of lower touch lines TLu.

The four upper touch electrodes (TE11, TE21, TE31, and TE41) disposed in the first column can be electrically connected to the one first upper touch line TL1u through four touch driving transistors (Ts11, Ts21, Ts31 and Ts41), respectively. The four lower touch electrodes (TE51, TE61, TE71, and TE81) disposed in the first column can be electrically connected to the one first lower touch line TL1d through four touch driving transistors (Ts51, Ts61, Ts71 and Ts81), respectively.

Accordingly, the number of touch lines, the number of touch pads, and the number of channels can be significantly reduced because only one first upper touch line TL1u is disposed for the four upper touch electrodes (TE11, TE21, TE31 and TE41) disposed in the first column. Further, the number of touch lines, the number of touch pads, and the number of channels can be significantly reduced because only one first lower touch line TL1d is disposed for the four lower touch electrodes (TE51, TE61, TE71 and TE81) disposed in the first column.

Further, referring to FIGS. 5B and 6B, four upper touch electrodes (TE12, TE22, TE32, and TE42) disposed in the second column in the first touch electrode group GR1 can correspond to one second upper touch line TL2u of the plurality of upper touch lines TLu. Four lower touch electrodes (TE52, TE62, TE72, and TE82) disposed in the second column in the second touch electrode group GR2 can correspond to one second lower touch line TL2d of the plurality of lower touch lines TLu.

The four upper touch electrodes (TE12, TE22, TE32, and TE42) disposed in the second column can be electrically connected to the one second upper touch line TL2u through four touch driving transistors (Ts12, Ts22, Ts32 and Ts42), respectively. The four lower touch electrodes (TE52, TE62, TE72, and TE82) disposed in the second column can be electrically connected to the one second lower touch line TL2d through four touch driving transistors (Ts52, Ts62, Ts72 and Ts82), respectively.

Accordingly, the number of touch lines, the number of touch pads, and the number of channels can be significantly reduced because only one second upper touch line TL2u is disposed for the four upper touch electrodes (TE12, TE22, TE32 and TE42) disposed in the second column. Further, the number of touch lines, the number of touch pads, and the number of channels can be significantly reduced because only one second lower touch line TL2d is disposed for the four lower touch electrodes (TE52, TE62, TE72 and TE82) disposed in the second column.

The above-described structure can be briefly described as follows. The advanced touch sensor structure based on self-capacitance according to embodiments of the present disclosure can include the first touch electrode TE11 and the second touch electrode TE21, which are spaced apart from each other, and the first touch line TL1 to which a touch driving signal TDS1 is applied.

The advanced touch sensor structure based on self-capacitance according to embodiments of the present disclosure can include the first touch driving transistor Ts11 for controlling an interconnection between the first touch electrode TE11 and the first touch line TL1, and the second touch driving transistor Ts21 for controlling an interconnection between the second touch electrode TE21 and the first touch line TL1.

The advanced touch sensor structure based on self-capacitance according to embodiments of the present disclosure can further include the third touch electrode TE31 and the fourth touch electrode TE41, which are spaced apart from each other, and further include the third touch driving transistor Ts31 for controlling an interconnection between the third touch electrode TE31 and the first touch line TL1, and the fourth touch driving transistor Ts41 controlling an interconnection between the fourth touch electrode TE41 and the first touch line TL1.

Referring to FIGS. 5A, 5B, 6A, and 6B, as the first touch driving transistor Ts11 is turned on, a first touch driving signal TDS1 can be supplied to the first touch electrode TE11 through the first touch line TL1 or the first upper touch line TL1u. As the second touch driving transistor Ts21 is turned on, the first touch driving signal TDS1 can be supplied to the second touch electrode TE21 through the first touch line TL1 or the first upper touch line TL1u.

Referring to FIGS. 5A, 5B, 6A, and 6B, as the third touch driving transistor Ts31 is turned on, the first touch driving signal TDS1 can be supplied to the third touch electrode TE31 through the first touch line TL1 or the first upper touch line TL1u. As the fourth touch driving transistor Ts41 is turned on, the first touch driving signal TDS1 can be supplied to the fourth touch electrode TE41 through the first touch line TL1 or the first upper touch line TL1u.

Referring to FIGS. 5A and 6A, the first self-sensing unit SSU1 included in the touch driving circuit 210 can be electrically connected to the first touch line TL1 through a first self-multiplexer MUXs1. The first self-sensing unit SSU1 can include a first charge amplifier CAMP1 for receiving a first touch driving signal TDS1 and outputting the received first touch driving signal TDS1 to the first touch line TL1 through the first self-multiplexer MUXs1.

Referring to FIGS. 5A and 6A, the second self-sensing unit SSU2 included in the touch driving circuit 210 can be electrically connected to the second touch line TL2 through a second self-multiplexer MUXs2. The second self-sensing unit SSU2 can include a second charge amplifier CAMP2 for receiving a second touch driving signal TDS2 and outputting the received second touch driving signal TDS2 to the second touch line TL2 through the second self-multiplexer MUXs2.

Referring to FIGS. 5B and 6B, a first upper self-sensing unit SSU1_u included in the touch driving circuit 210 can be electrically connected to the first upper touch line TL1u through a first upper self-multiplexer MUXs1u. The first upper self-sensing unit SSU1_u can include a first upper charge amplifier CAMP1u for receiving a first touch driving signal TDS1 and outputting the received first touch driving signal TDS1 to the first upper touch line TL1u through the first upper self-multiplexer MUXs1u.

Referring to FIGS. 5B and 6B, a first lower self-sensing unit SSU1_d included in the touch driving circuit 210 can be electrically connected to the first lower touch line TL1d through a first lower self-multiplexer MUXs1d. The first lower self-sensing unit SSU1_d can include a first lower charge amplifier CAMP1d for receiving the first touch driving signal TDS1 and outputting the received first touch driving signal TDS1 to the first lower touch line TL1d through the first lower self-multiplexer MUXs1d.

Referring to FIGS. 5B and 6B, a second upper self-sensing unit SSU2_u included in the touch driving circuit 210 can be electrically connected to the second upper touch line TL2u through a second upper self-multiplexer MUXs2u. The second upper self-sensing unit SSU2_u can include a second upper charge amplifier CAMP2u for receiving a second touch driving signal TDS2 and outputting the received second touch driving signal TDS2 to the second upper touch line TL2u through the second upper self-multiplexer MUXs2u.

Referring to FIGS. 5B and 6B, a second lower self-sensing unit SSU2_d included in the touch driving circuit 210 can be electrically connected to the second lower touch line TL2d through a second lower self-multiplexer MUXs2d. The second lower self-sensing unit SSU2_d can include a second lower charge amplifier CAMP2d for receiving the second touch driving signal TDS2 and outputting the received second touch driving signal TDS2 to the second lower touch line TL2d through the second lower self-multiplexer MUXs2d.

The touch driving transistors Ts including the first touch driving transistor Ts11 and the second touch driving transistor Ts21 can be located in the touch sensing area TSA.

The touch driving transistors Ts including the first touch driving transistor Ts11 and the second touch driving transistor Ts21 can be located in the display area DA of the display panel 110.

Referring to FIGS. 5A and 5B, in one or more embodiments, the advanced touch sensor structure based on self-capacitance sensing can further include control transistors Tc for controlling the turn-on or turn-off operation of touch driving transistors Ts.

Referring to FIGS. 5A and 5B, the control transistors Tc can include first to eighth control transistors Tc1 to Tc8. The first to eighth control transistors Tc1 to Tc8 can correspond to the first to eighth touch electrode rows L1 to L8 on a one-to-one basis.

Referring to FIGS. 5A and 5B, in one or more embodiments, the advanced touch sensor structure based on self-capacitance sensing can further include switching signal lines SWL1 to SWL8 for delivering switching signals SWS1 to SWS8 applied to the gate nodes of the touch driving transistors Ts.

The switching signal lines SWL1 to SWL8 can include first to eighth switching signal lines SWL1 to SWL8.

The first switching signal line SWL1 can deliver a first switching signal SWS1 for turning on all of one or more first touch driving transistors Ts11 and Ts12 corresponding to the first touch electrode row L1.

The second switching signal line SWL2 can deliver a second switching signal SWS2 for turning on all of one or more second touch driving transistors Ts21 and Ts22 corresponding to the second touch electrode row L2.

The third switching signal line SWL3 can deliver a third switching signal SWS3 for turning on all of one or more third touch driving transistors Ts31 and Ts32 corresponding to the third touch electrode row L3.

The fourth switching signal line SWL4 can deliver a fourth switching signal SWS4 for turning on all of one or more fourth touch driving transistors Ts41 and Ts42 corresponding to the fourth touch electrode row L4.

The fifth switching signal line SWL5 can deliver a fifth switching signal SWS5 for turning on all of one or more fifth touch driving transistors Ts51 and Ts52 corresponding to the fifth touch electrode row L5.

The sixth switching signal line SWL6 can deliver a sixth switching signal SWS6 for turning on all of one or more sixth touch driving transistors Ts61 and Ts62 corresponding to the sixth touch electrode row L6.

The seventh switching signal line SWL7 can deliver a seventh switching signal SWS7 for turning on all of one or more seventh touch driving transistors Ts71 and Ts72 corresponding to the seventh touch electrode row L7.

The eighth switching signal line SWL8 can deliver an eighth switching signal SWS8 for turning on all of one or more eighth touch driving transistors Ts81 and Ts82 corresponding to the eighth touch electrode row L8.

The first control transistor Tc1 can commonly control interconnections between the first switching signal line SWL1 and respective one or more gate nodes of one or more first touch driving transistors Ts11 and Ts12 corresponding to the first touch electrode row L1. In other words, first control transistor Tc1 can control touch driving transistors that are in a same row.

The second control transistor Tc2 can commonly control interconnections between the second switching signal line SWL2 and respective one or more gate nodes of one or more second touch driving transistors Ts21 and Ts22 corresponding to the second touch electrode row L2.

The third control transistor Tc3 can commonly control interconnections between the third switching signal line SWL3 and respective one or more gate nodes of one or more third touch driving transistors Ts31 and Ts32 corresponding to the third touch electrode row L3.

The fourth control transistor Tc4 can commonly control interconnections between the fourth switching signal line SWL4 and respective one or more gate nodes of one or more fourth touch driving transistors Ts41 and Ts42 corresponding to the fourth touch electrode row L4.

The fifth control transistor Tc5 can commonly control interconnections between the fifth switching signal line SWL5 and respective one or more gate nodes of one or more fifth touch driving transistors Ts51 and Ts52 corresponding to the fifth touch electrode row L5.

The sixth control transistor Tc6 can commonly control interconnections between the sixth switching signal line SWL6 and respective one or more gate nodes of one or more sixth touch driving transistors Ts61 and Ts62 corresponding to the sixth touch electrode row L6.

The seventh control transistor Tc7 can commonly control interconnections between the seventh switching signal line SWL7 and respective one or more gate nodes of one or more seventh touch driving transistors Ts71 and Ts72 corresponding to the seventh touch electrode row L7.

The eighth control transistor Tc8 can commonly control interconnections between the eighth switching signal line SWL8 and respective one or more gate nodes of one or more eighth touch driving transistors Ts81 and Ts82 corresponding to the eighth touch electrode row L8.

Referring to FIGS. 5A and 5B, the first to eighth control transistors Tc1 to Tc8 can be classified into the first to fourth control transistors Tc1 to Tc4 corresponding to the first touch electrode group GR1 and the fifth to eighth control transistors Tc5 to Tc8 corresponding to the second touch electrode group GR2.

Referring to FIGS. 5A and 5B, in one or more embodiments, the advanced touch sensor structure based on self-capacitance sensing can include a first group driving signal line GDSL1 to which the gate nodes of the first to fourth control transistors Tc1 to Tc4 are commonly connected, and a second group driving signal line GDSL2 to which the gate nodes of the fifth to eighth control transistors Tc5 to Tc8 are commonly connected.

The first group driving signal line GD can commonly deliver a first group driving signal GDS1 to the gate nodes of the first to fourth control transistors Tc1 to Tc4.

The second group driving signal line GDSL2 can commonly deliver a second group driving signal GDS2 to the gate nodes of the fifth to eighth control transistors Tc5 to Tc8.

Referring to FIGS. 5A and 5B, the touch electrodes (TE11, TE12, TE21, TE22, TE31, TE32, TE41, TE42, TE51, TE52, TE61, TE62, TE71, TE72, TE81, and TE82), the touch lines (TL1, TL2), the touch driving transistors Ts, and the control transistors Tc can be included in the display panel 110.

The display panel 110 can include a display area DA for displaying an image and a non-display area NDA located outside of the display area DA.

Referring to FIGS. 5A and 5B, the touch electrodes (TE11, TE12, TE21, TE22, TE31, TE32, TE41, TE42, TE51, TE52, TE61, TE62, TE71, TE72, TE81, and TE82), the touch lines (TL1, TL2), and the touch driving transistors Ts can be disposed in the display area DA of the display panel 110. The control transistors Tc can be disposed in the non-display area NDA of the display panel 110.

Referring to FIGS. 5A and 5B, the fifth touch driving transistor Ts51 can control an interconnection between the fifth touch electrode TE51 and a first touch line (TL1 in FIG. 5A, TL1$u$ in FIG. 5B). As the fifth touch driving transistor Ts51 is turned on, the first touch driving signal TDS1 can be supplied to the fifth touch electrode TE51 through the first touch line (TL1 in FIG. 5A, TL1$u$ in FIG. 5B).

Referring to FIGS. 5A and 5B, the sixth touch driving transistor Ts61 can control an interconnection between the sixth touch electrode TE61 and the first touch line (TL1 in FIG. 5A, TL1$u$ in FIG. 5B). As the sixth touch driving transistor Ts61 is turned on, the first touch driving signal TDS1 can be supplied to the sixth touch electrode TE61 through the first touch line (TL1 in FIG. 5A, TL1$u$ in FIG. 5B).

Referring to FIGS. 5A and 5B, the seventh touch driving transistor Ts71 can control an interconnection between the seventh touch electrode TE71 and the first touch line (TL1, TL1$u$). As the seventh touch driving transistor Ts71 is turned on, the first touch driving signal TDS1 can be supplied to the seventh touch electrode TE71 through the first touch line (TL1, TL1$u$).

Referring to FIGS. 5A and 5B, the eighth touch driving transistor Ts81 can control an interconnection between the eighth touch electrode TE81 and the first touch line (TL1, TL1$u$). As the eighth touch driving transistor Ts81 is turned on, the first touch driving signal TDS1 can be supplied to the eighth touch electrode TE81 through the first touch line (TL1, TL1$u$).

Referring to FIG. 5B, the fifth touch driving transistor Ts51 can control an interconnection between the fifth touch electrode TE51 and a second touch line TL1$d$. As the fifth touch driving transistor Ts51 is turned on, the first touch driving signal TDS1 can be supplied to the fifth touch electrode TE51 through the second touch line TL1$d$.

Referring to FIG. 5B, the sixth touch driving transistor Ts61 can control an interconnection between the sixth touch electrode TE61 and the second touch line TL1$d$. As the sixth touch driving transistor Ts61 is turned on, the first touch driving signal TDS1 can be supplied to the sixth touch electrode TE61 through the second touch line TL1$d$.

Referring to FIG. 5B, the seventh touch driving transistor Ts71 can control an interconnection between the seventh touch electrode TE71 and the second touch line TL1$d$. As the seventh touch driving transistor Ts71 is turned on, the first touch driving signal TDS1 can be supplied to the seventh touch electrode TE71 through the second touch line TL1$d$.

Referring to FIG. 5B, the eighth touch driving transistor Ts81 can control an interconnection between the eighth touch electrode TE81 and the second touch line TL1$d$. As the eighth touch driving transistor Ts81 is turned on, the first touch driving signal TDS1 can be supplied to the eighth touch electrode TE81 through the second touch line TL1$d$.

Figure 7A:
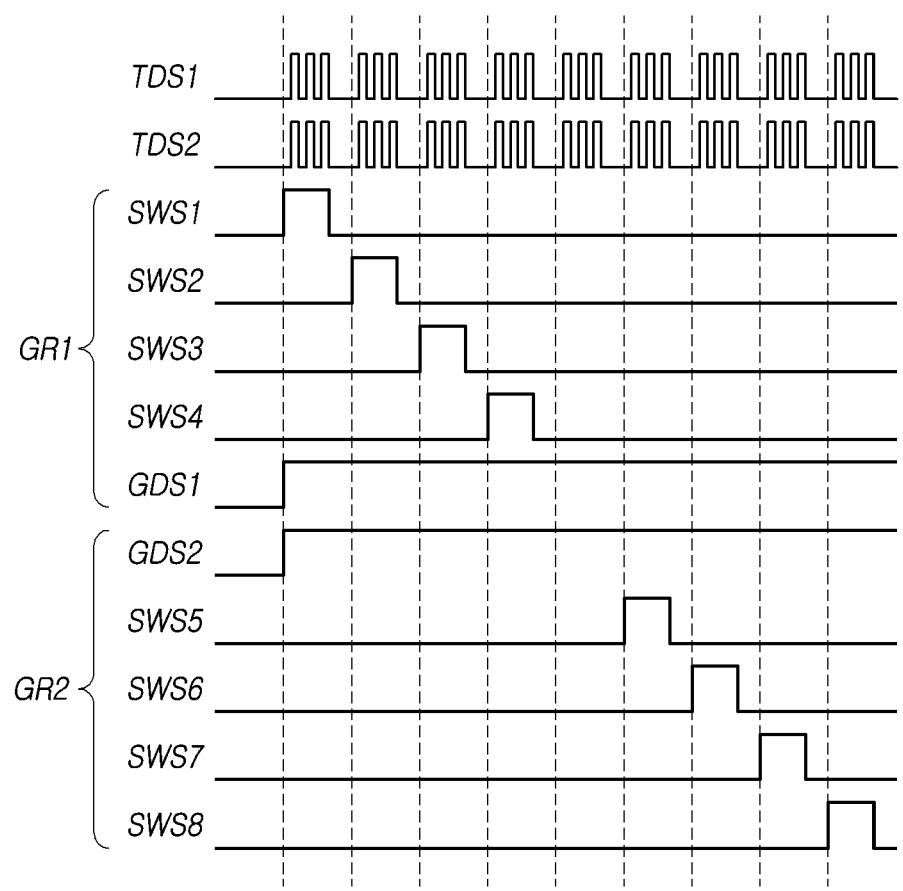
FIGS. 7A and 7B are an example touch driving timing diagram of an individual driving scheme and an example touch driving timing diagram of a group driving scheme, in the advanced touch sensor structures based on self-capacitance sensing in the touch display device according to aspects of the present disclosure.
Figure 7B:
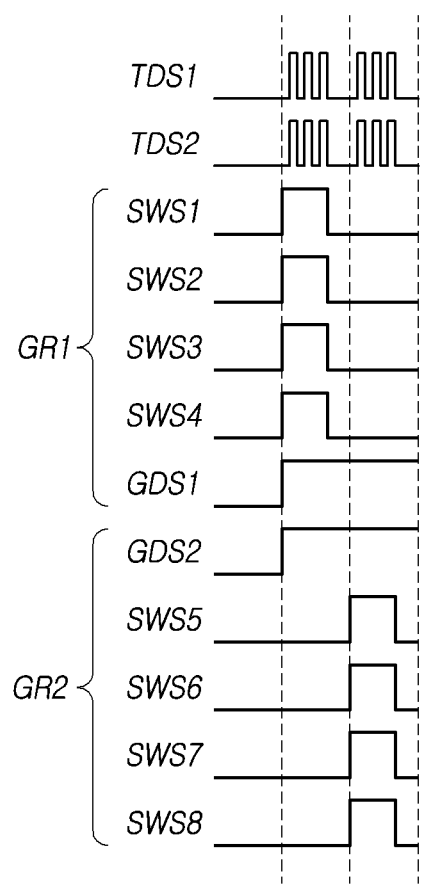

FIGS. 7A and 7B are an example touch driving timing diagram of an individual driving scheme and an example touch driving timing diagram of a group driving scheme, in the advanced touch sensor structures based on self-capacitance sensing in the touch display device 100 according to aspects of the present disclosure. Hereinafter, for convenience of description, discussions are provided by focusing on eight touch electrodes (TE11, TE21, TE31, TE41, TE51, TE61, TE71, and TE81) disposed in the first column as illustrated in the figures discussed above.

Referring to FIG. 7A, in one or more embodiments, the touch display device 100 can drive first to eighth touch electrode rows L1 to L8 individually and sequentially. This driving scheme can be referred to as an individual driving scheme, a sequential driving scheme, or an individual sequential driving scheme. For example, each row is sequentially driven, one at a time.

Referring to FIG. 7A, according to the individual driving scheme, the first to eighth touch driving transistors Ts11 to Ts81 can be sequentially turned on.

Referring to FIG. 7A, the first scheme for sequentially turning on the first to eighth touch driving transistors Ts11 to Ts81 is implemented such that in a situation where all of the first to eighth control transistors Tc1 to Tc8 are substantially concurrently turned on, respective turn-on level voltage durations of the first to eighth switching signals SWS1 to SWS8 transferred to the gate nodes of the first to eighth touch driving transistors Ts11 to Ts81 through the first to eighth control transistors Tc1 to Tc8 that have been turned on are sequentially controlled.

Referring to FIG. 7A, according to the first scheme, to substantially concurrently turn on the first to eighth control transistors Tc1 to Tc8, a first group driving signal GDS1 having a turn-on level voltage (e.g., a high level voltage) can be substantially concurrently applied to the gate nodes of the first to fourth control transistors Tc1 to Tc4, and a second group driving signal GDS2 having a turn-on level voltage (e.g. a high level voltage) can be substantially concurrently applied to the gate nodes of the fifth to eighth control transistors Tc5 to Tc8. For example, the rows in each of the two groups are sequentially driven with timings that are very close to each other.

Referring to FIG. 7A, according to the first scheme, while the first to eighth control transistors Tc1 to Tc8 are substantially concurrently turned on, the first to eighth switching signals SWS1 to SWS8 can sequentially have respective turn-on level voltages.

Accordingly, the first to eighth touch driving transistors Ts11 to Ts81 can be sequentially turned on, and pulses included in the first touch driving signal TDS can be sequentially supplied to the first to eighth touch electrodes (TE11, TE21, TE31, TE41, TE51, TE61, TE71, and TE81).

The second scheme for sequentially turning on the first to eighth touch driving transistors Ts11 to Ts81 is implemented such that during a period in which the first and second group driving signals GDS1 and GDS2 have respective turn-on level voltages, the first to eighth switching signals SWS1 to SWS8 are controlled to continually have respective turn-on level voltages, and the first to eighth control transistors Tc1 to Tc8 are controlled to be sequentially turned on.

According to the second scheme, while the first to eighth switching signals SWS1 to SWS8 substantially concurrently have respective turn-on level voltages, the first to eighth control transistors Tc1 to Tc8 can be sequentially turned on.

Referring to FIG. 7B, in one or more embodiments, the touch display device 100 can substantially concurrently drive the first to fourth touch electrode rows L1 to L4 included in the first touch electrode group GR1, and substantially concurrently drive the fifth to eighth touch electrode rows L5 to L8 included in the second touch electrode group GR2. This driving scheme can be referred to as a group driving scheme.

Referring to FIG. 7B, according to the group driving scheme, the first touch electrode group GR1 can be substantially concurrently driven, and the second touch electrode group GR2 can be substantially concurrently driven. For example, after the first touch electrode group GR1 is driven, then the second touch electrode group GR2 can be driven.

Referring to FIG. 7B, according to the group driving scheme, the first to fourth touch driving transistors Ts11 to Ts41 corresponding to the first touch electrode group GR1 can be substantially concurrently turned on at the same time. The fifth to eighth touch driving transistors Ts51 to Ts81 corresponding to the second touch electrode group GR2 can be substantially concurrently turned on at the same time.

Referring to FIG. 7B, while the first to fourth control transistors Tc1 to Tc4 corresponding to the first touch electrode group GR1 are substantially concurrently turned on by the first group driving signal GDS1, the first to fourth switching signals SWS1 to SWS4 can substantially concurrently have respective turn-on level voltages.

Referring to FIG. 7B, while the fifth to eighth control transistors Tc4 to Tc8 corresponding to the second touch electrode group GR2 are substantially concurrently turned on by the second group driving signal GDS2, the fifth to eighth switching signals SWS5 to SWS8 can substantially concurrently have respective turn-on level voltages.

Referring to FIG. 7B, while the first to fourth switching signals SWS1 to SWS4 substantially concurrently have respective turn-on level voltages, the first to fourth control transistors Tc1 to Tc4 corresponding to the first touch electrode group GR1 can be substantially concurrently turned on.

Referring to FIG. 7B, while the fifth to eighth switching signals SWS5 to SWS8 substantially concurrently have respective turn-on level voltages, the fifth to eighth control transistors Tc4 to Tc8 corresponding to the second touch electrode group GR2 can be substantially concurrently turned on.

Figure 8A:
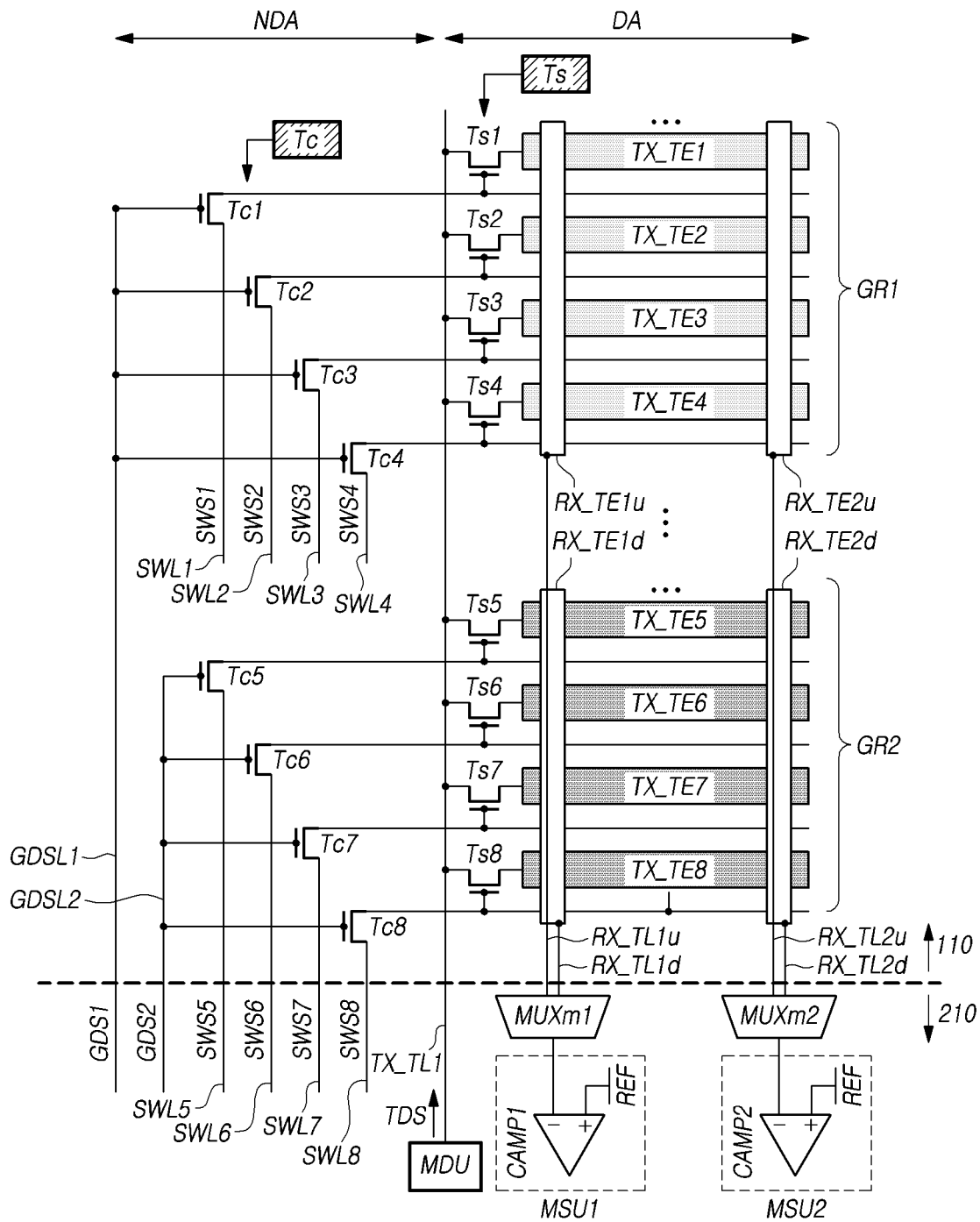
FIGS. 8A and 8B illustrate example advanced touch sensor structures based on mutual-capacitance sensing in the touch display device according to aspects of the present disclosure.
Figure 8B:
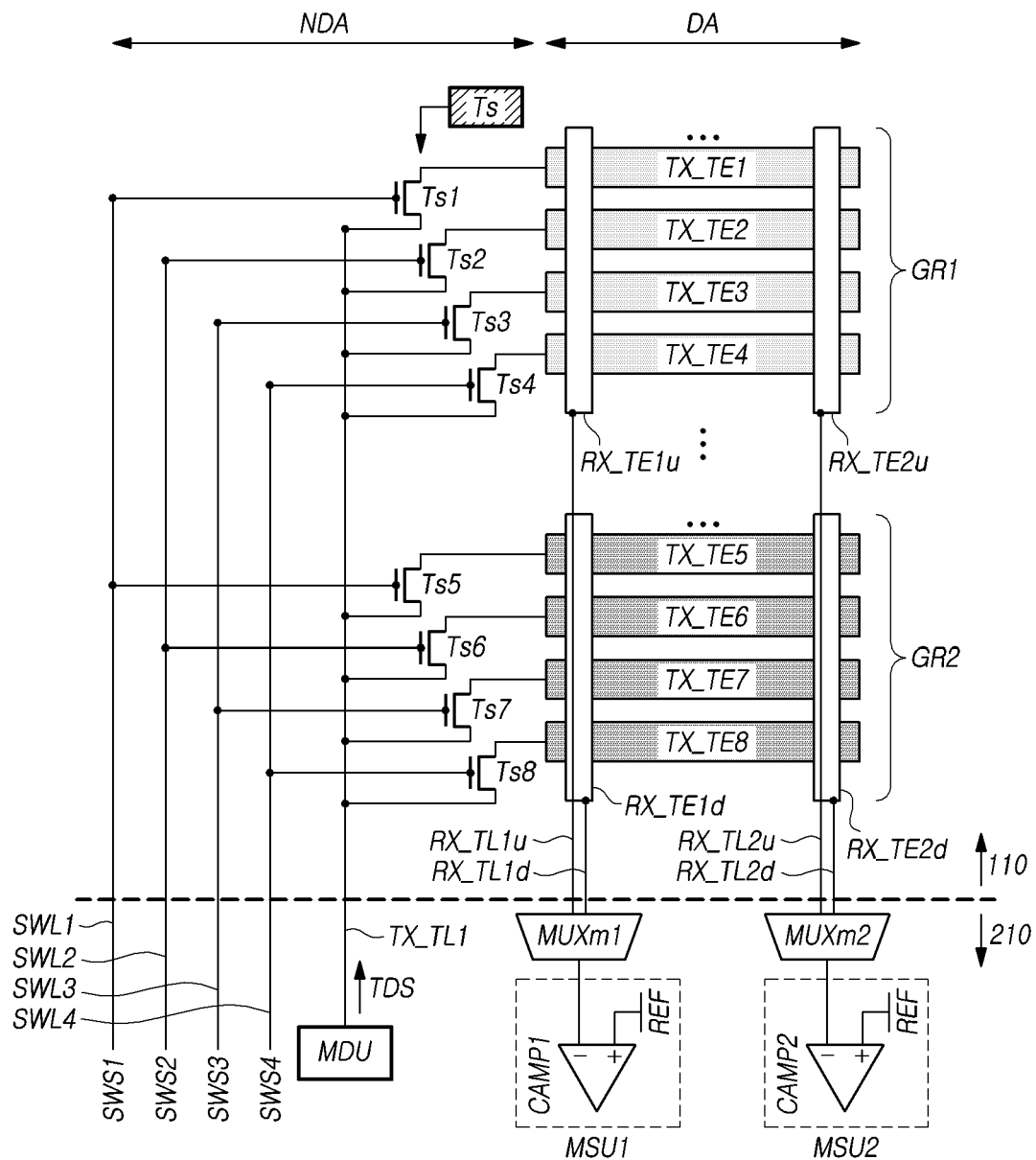

FIGS. 8A and 8B illustrate examples of advanced touch sensor structures based on mutual-capacitance sensing in the touch display device 100 according to aspects of the present disclosure. First to eighth transmission touch electrodes TX_TE1 to TX_TE8 described below can also be referred to as first to eighth touch electrodes. A first transmission touch line TX_TL1 can also be referred to as a first touch line TL1.

Referring to FIGS. 8A and 8B, in one or more embodiments, the advanced touch sensor structures based on mutual-capacitance sensing of the touch display device 100 can include a plurality of transmission touch electrodes TX_TE1 to TX_TE8 and a plurality of reception touch electrodes (RX_TE1u, RX_TE1d, RX_TE2u, RX_TE2d). For example, the plurality of transmission touch electrodes TX_TE1 to TX_TE8 and the plurality of reception touch electrodes (RX_TE2u, RX_TE2d) can intersect each other.

Referring to FIGS. 8A and 8B, in one or more embodiments, the advanced touch sensor structures based on mutual-capacitance sensing of the touch display device 100 can include a plurality of touch driving transistors Ts corresponding to the plurality of transmission touch electrodes TX_TE1 to TX_TE8 on a one-to-one basis. The plurality of touch driving transistors Ts can include first to eighth touch driving transistors Ts1 to Ts8.

Referring to FIGS. 8A and 8B, the first to eighth touch driving transistors Ts1 to Ts8 can control respective interconnections between one first transmission touch line TX_TL1 and the first to eighth transmission touch electrodes TX_TE1 to TX_TE8.

Referring to FIGS. 8A and 8B, in one or more embodiments, the advanced touch sensor structures based on mutual-capacitance sensing of the touch display device 100 can include a plurality of touch lines (TX_TL1, RX_TL1u, RX_TL1d, RX_TL2u, RX_TL2d).

The first to eighth transmission touch electrodes TX_TE1 to TX_TE8 can be electrically connected to the one first transmission touch line TX_TL1 through the respective first to eighth touch driving transistors Ts1 to Ts8. For example, all eight transmission touch electrodes (e.g., TX_TE1 to TX_TE8) are connected to the same transmission touch line (e.g., TX_TL1). Accordingly, the number of touch lines, the number of touch pads, and the number of transmission channels can be significantly reduced.

The first transmission touch line TX_TL1 can deliver a touch driving signal TDS output from a mutual-driving unit MDU to first to eighth touch driving transistors Ts1 to Ts8 so that the touch driving signal TDS can be transferred to the first to eighth transmission touch electrodes TX_TE1 to TX_TE8.

A first upper reception touch line RX_TL1u can electrically interconnect a first upper reception touch electrode RX_TE1u and a first mutual-sensing unit MSU1. A first lower reception touch line RX_TL1d can electrically interconnect a first lower reception touch electrode RX_TE1d and the first mutual-sensing unit MSU1.

The first upper reception touch line RX_TL1u and the first lower reception touch line RX_TL1d can be connected to the first mutual-sensing unit MSU1 through a first mutual multiplexer MUXm1. The first mutual multiplexer MUXm1 can select one of the first upper reception touch line RX_TL1u and the first lower reception touch line RX_TL1d, and connect the selected reception touch line to the first mutual-sensing unit MSU1.

A second upper reception touch line RX_TL2u can electrically interconnect a second upper reception touch electrode RX_TE1u and a second mutual-sensing unit MSU2. A second lower reception touch line RX_TL2d can electrically interconnect a second lower reception touch electrode RX_TE1d and the second mutual-sensing unit MSU2.

The second upper reception touch line RX_TL2u and the second lower reception touch line RX_TL2d can be connected to the second mutual-sensing unit MSU2 through a second mutual multiplexer MUXm2. The second mutual multiplexer MUXm2 can select one of the second upper reception touch line RX_TL2u and the second lower reception touch line RX_TL2d, and connect the selected reception touch line to the second mutual-sensing unit MSU2.

Referring to FIGS. 8A and 8B, the first to eighth transmission touch electrodes TX_TE1 to TX_TE8 can be classified into two touch electrode groups GR1 and GR2. A first touch electrode group GR1 can include the first to fourth transmission touch electrodes TX_TE1 to TX_TE4, and a second touch electrode group GR2 can include the fifth to eighth transmission touch electrodes TX_TE5 to TX_TE8.

Referring to FIGS. 8A and 8B, in one or more embodiments, the advanced touch sensor structure based on mutual-capacitance sensing can include switching signal lines for delivering switching signals applied to the gate nodes of the touch driving transistors Ts.

In one or more embodiments, in the advanced touch sensor structure based on mutual-capacitance sensing of FIG. 8A, switching signal lines can include first to eighth switching signal lines SWL1 to SWL8.

In the advanced touch sensor structure based on mutual-capacitance sensing of FIG. 8A, the first switching signal line SWL1 can deliver a first switching signal SWS1 for turning on the first touch driving transistor Ts1. The second switching signal line SWL2 can deliver a second switching signal SWS2 for turning on the second touch driving transistor Ts2. The third switching signal line SWL3 can deliver a third switching signal SWS3 for turning on the third touch driving transistor Ts3. The fourth switching signal line SWL4 can deliver a fourth switching signal SWS4 for turning on the fourth touch driving transistor Ts4. The fifth switching signal line SWL5 can deliver a fifth switching signal SWS5 for turning on the fifth touch driving transistor Ts5. The sixth switching signal line SWL6 can deliver a sixth switching signal SWS6 for turning on the sixth touch driving transistor Ts6. The seventh switching signal line SWL7 can deliver a seventh switching signal SWS7 for turning on the seventh touch driving transistor Ts7. The eighth switching signal line SWL8 can deliver an eighth switching signal SWS8 for turning on the eighth touch driving transistor Ts8.

In one or more embodiments, in the advanced touch sensor structure based on mutual-capacitance sensing of FIG. 8A, a first control transistor Tc1 can control an interconnection between the first switching signal line SWL1 and the gate node of the first touch driving transistor Ts1. A second control transistor Tc2 can control an interconnection between the second switching signal line SWL2 and the gate node of the second touch driving transistor Ts2. A third control transistor Tc3 can control an interconnection between the third switching signal line SWL3 and the gate node of the third touch driving transistor Ts3. A fourth control transistor Tc4 can control an interconnection between the fourth switching signal line SWL4 and the gate node of the fourth touch driving transistor Ts4. A fifth control transistor Tc5 can control an interconnection between the fifth switching signal line SWL5 and the gate node of the fifth touch driving transistor Ts5. A sixth control transistor Tc6 can control an interconnection between the sixth switching signal line SWL6 and the gate node of the sixth touch driving transistor Ts6. A seventh control transistor Tc7 can control an interconnection between the seventh switching signal line SWL7 and the gate node of the seventh touch driving transistor Ts7. An eighth control transistor Tc8 can control an interconnection between the eighth switching signal line SWL8 and the gate node of the eighth touch driving transistor Ts8.

Referring to FIG. 8A, in one or more embodiments, the advanced touch sensor structure based on mutual-capacitance sensing of the touch display device 100 can include the plurality of control transistors Tc for controlling the turn-on or turn-off operations of the plurality of touch driving transistors Ts. The plurality of control transistors Tc can include the first to eighth control transistors Tc1 to Tc8.

Referring to FIG. 8A, the first to eighth control transistors Tc1 to Tc8 can be classified into the first to fourth control transistors Tc1 to Tc4 corresponding to a first touch electrode group GR1 and the fifth to eighth control transistors Tc5 to Tc8 corresponding to a second touch electrode group GR2.

Referring to FIG. 8A, in one or more embodiments, the advanced touch sensor structure based on mutual-capacitance sensing can include a first group driving signal line GDSL1 to which the gate nodes of the first to fourth control transistors Tc1 to Tc4 are commonly connected, and a second group driving signal line GDSL2 to which the gate nodes of the fifth to eighth control transistors Tc5 to Tc8 are commonly connected.

The first group driving signal line GD can commonly deliver a first group driving signal GDS1 to the gate nodes of the first to fourth control transistors Tc1 to Tc4.

The second group driving signal line GDSL2 can commonly deliver a second group driving signal GDS2 to the gate nodes of the fifth to eighth control transistors Tc5 to Tc8.

In one or more embodiments, in the advanced touch sensor structure based on mutual-capacitance sensing of FIG. 8B, switching signal lines can include first to eighth switching signal lines SWL1 to SWL8.

In the advanced touch sensor structure based on mutual-capacitance sensing of FIG. 8B, the first switching signal line SWL1 can deliver a first switching signal SWS1 for turning on the first touch driving transistor Ts1. The second switching signal line SWL2 can deliver a second switching signal SWS2 for turning on the second touch driving transistor Ts2. The third switching signal line SWL3 can deliver a third switching signal SWS3 for turning on the third touch driving transistor Ts3. The fourth switching signal line SWL4 can deliver a fourth switching signal SWS4 for turning on the fourth touch driving transistor Ts4. The fifth switching signal line SWL5 can deliver a fifth switching signal SWS5 for turning on the fifth touch driving transistor Ts5. The sixth switching signal line SWL6 can deliver a sixth switching signal SWS6 for turning on the sixth touch driving transistor Ts6. The seventh switching signal line SWL7 can deliver a seventh switching signal SWS7 for turning on the seventh touch driving transistor Ts7. The eighth switching signal line SWL8 can deliver an eighth switching signal SWS8 for turning on the eighth touch driving transistor Ts8.

In one or more embodiments, in the advanced touch sensor structure based on mutual-capacitance sensing of FIG. 8B, a first switching signal line SWL1 can be commonly connected to the gate node of the first touch driving transistor Ts1 and the gate node of the fifth touch driving transistor Ts5. A second switching signal line SWL2 can be commonly connected to the gate node of the second touch driving transistor Ts2 and the gate node of the sixth touch driving transistor Ts6. A third switching signal line SWL3 can be commonly connected to the gate node of the third touch driving transistor Ts3 and the gate node of the seventh touch driving transistor Ts7. A fourth switching signal line SWL4 can be commonly connected to the gate node of the fourth touch driving transistor Ts4 and the gate node of the eighth touch driving transistor Ts8. Thus, the amount of wiring connections can be further reduced.

Referring to FIGS. 8A and 8B, transmission touch electrodes (TX_TE1 to TX_TE8), reception touch electrodes (RX_TE1u, RX_TE1d, RX_TE2u, RX_TE2d), touch lines (TX_TL1, RX_TL1u, RX_TL1d, RX_TL2u, RX_TL2d), touch driving transistors Ts, and control transistors Tc can be included in the display panel 110.

The display panel 110 can include a display area DA for displaying an image and a non-display area NDA located outside of the display area DA.

Referring to FIGS. 8A and 8B, the transmission touch electrodes (TX_TE1 to TX_TE8), the reception touch electrodes (RX_TE1u, RX_TE1d, RX_TE2u, RX_TE2d), and the touch lines (TX_TL1, RX_TL1u, RX_TL1d, RX_TL2u, RX_TL2d) can be disposed in the display area DA of the display panel 110. The control transistors Tc can be disposed in the non-display area NDA of the display panel 110. The touch driving transistors Ts can be disposed in the display area DA or the non-display area NDA of the display panel 110.

Referring to FIGS. 8A and 8B, the first touch driving transistor Ts1 can control an interconnection between the first transmission touch electrode TX_TE1 and the first transmission touch line TX_TL1. As the first touch driving transistor Ts1 is turned on, a touch driving signal TDS can be supplied to the first transmission touch electrode TX_TE1 through the first transmission touch line TX_TL1.

The second touch driving transistor Ts2 can control an interconnection between the second transmission touch electrode TX_TE2 and the first transmission touch line TX_TL1. As the second touch driving transistor Ts2 is turned on, a touch driving signal TDS can be supplied to the second transmission touch electrode TX_TE2 through the first transmission touch line TX_TL1.

The third touch driving transistor Ts3 can control an interconnection between the third transmission touch electrode TX_TE3 and the first transmission touch line TX_TL1. As the third touch driving transistor Ts3 is turned on, a touch driving signal TDS can be supplied to the third transmission touch electrode TX_TE3 through the first transmission touch line TX_TL1.

The fourth touch driving transistor Ts4 can control an interconnection between the fourth transmission touch electrode TX_TE4 and the first transmission touch line TX_TL1. As the fourth touch driving transistor Ts4 is turned on, a touch driving signal TDS can be supplied to the fourth transmission touch electrode TX_TE4 through the first transmission touch line TX_TL1.

The fifth touch driving transistor Ts5 can control an interconnection between the fifth transmission touch electrode TX_TE5 and the first transmission touch line TX_TL1. As the fifth touch driving transistor Ts5 is turned on, a touch driving signal TDS can be supplied to the fifth transmission touch electrode TX_TE5 through the first transmission touch line TX_TL1.

The sixth touch driving transistor Ts6 can control an interconnection between the sixth transmission touch electrode TX_TE6 and the first transmission touch line TX_TL1. As the sixth touch driving transistor Ts6 is turned on, a touch driving signal TDS can be supplied to the sixth transmission touch electrode TX_TE6 through the first transmission touch line TX_TL1.

The seventh touch driving transistor Ts7 can control an interconnection between the seventh transmission touch electrode TX_TE7 and the first transmission touch line TX_TL1. As the seventh touch driving transistor Ts7 is turned on, a touch driving signal TDS can be supplied to the seventh transmission touch electrode TX_TE7 through the first transmission touch line TX_TL1.

The eighth touch driving transistor Ts8 can control an interconnection between the eighth transmission touch electrode TX_TE8 and the first transmission touch line TX_TL1. As the eighth touch driving transistor Ts8 is turned on, a touch driving signal TDS can be supplied to the eighth transmission touch electrode TX_TE8 through the first transmission touch line TX_TL1.

In the advanced touch sensor structure based on the mutual-capacitance sensing of FIG. 8B, although the gate nodes of the first to eighth touch driving transistors Ts1 to Ts8 are connected to one first transmission touch line TX_TL1, but in one or more embodiments, each of the gate nodes of the first to eighth touch driving transistors Ts1 to Ts8 can be connected to a separate, or respective, transmission touch line.

Meanwhile, in one or more embodiments, the advanced touch sensor structures based on the mutual-capacitance sensing of the touch display device 100 can also be driven by the individual driving scheme as shown in FIG. 7A or by the group driving scheme as shown in FIG. 7B.

Figure 9:
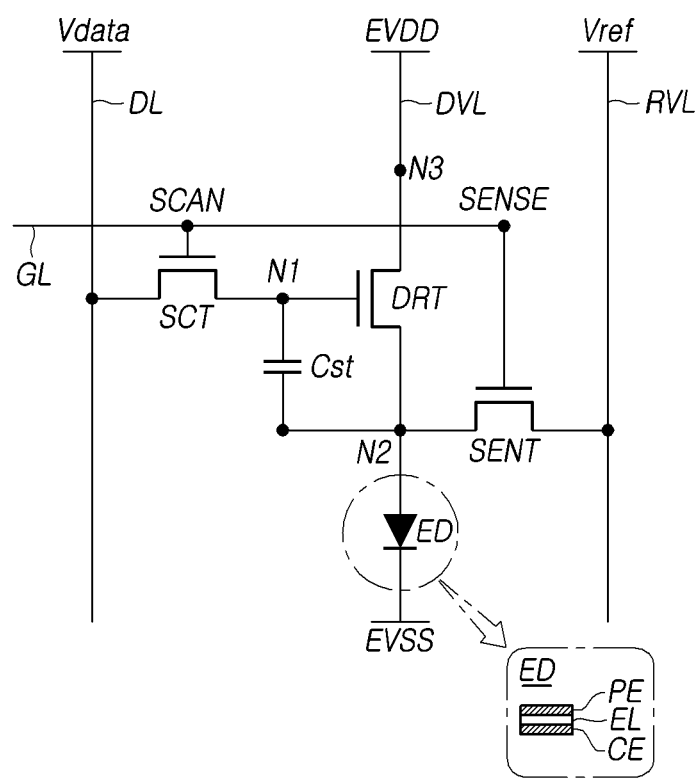
FIG. 9 illustrates an example equivalent circuit of a subpixel included in the touch display device according to aspects of the present disclosure.

FIG. 9 illustrates an equivalent circuit of a subpixel included in the touch display device 100 according to aspects of the present disclosure.

Referring to FIG. 9, in one or more embodiments, each subpixel SP of the touch display device 100 can further include a sensing transistor SENT, unlike the equivalent circuit of the subpixel SP of FIG. 1 which does not include a sensing transistor.

In these embodiments, as illustrated in FIG. 9, the subpixel SP can include a light emitting element ED, three transistors (DRT, SCT, and SENT), and one storage capacitor Cst.

The turn-on or turn-off operation of the sensing transistor SENT can be controlled by a sensing signal SENSE delivered through a gate line GL, and thereby, the sensing transistor SENT can control an interconnection between a second node N2 of the driving transistor DRT and a reference voltage line RVL. The second node N2 of the driving transistor DRT can be electrically connected to a pixel electrode PE of the light emitting element ED.

The sensing transistor SENT can be turned on by a sensing signal SENSE with a turn-on level voltage, and transfer a reference voltage Vref transmitted through the reference voltage line RVL to the second node N2 of the driving transistor DRT.

Each of the driving transistor DRT, the scan transistor SCT, and the sensing transistor SENT can be an n-type transistor, or a p-type transistor. All of the driving transistor DRT, the scan transistor SENT, and the sensing transistor SENT can be n-type transistors or p-type transistors. At least one of the driving transistor DRT and the scan transistor SENT can be an n-type transistor (or a p-type transistor), and the remaining driving transistor DRT or scan transistor SCT can be the p-type transistor (or the n-type transistor).

As illustrated in FIG. 9, for example, the gate nodes of the scan transistor SCT and the sensing transistor SENT can be connected to a same single gate line GL. In another example, the gate nodes of the scan transistor SCT and the sensing transistor SENT can be connected to their own respective gate lines GL. Hereinafter, for convenience of description, discussions that follow are provided based on examples where the gate nodes of the scan transistor SCT and the sensing transistor SENT is connected to a same single gate line GL.

The structure of the subpixel SP illustrated in FIG. 9 (which can be referred to as a 3T (three transistors)-1C (one capacitor)) structure) is merely an example for description, and embodiment are not limited thereto. In one or more embodiments, a subpixel SP included in the display device 100 can further include one or more transistors or, one or more capacitors, in addition to the 3T-1C structure. In one or more embodiments, subpixels SP included in the display device 100 can have a same structure, or at least one of the subpixels SP can have a different structure.

In one or more embodiments, the touch display device 100 can have a top emission structure or a bottom emission structure.

Hereinafter, an example stackup configuration of the advanced touch sensor structure of the touch display device 100 according to the embodiments described above will be described in more detail. Discussions on the example stackup configuration are provided based on the advanced touch sensor structure based on self-capacitance sensing of FIG. 5A.

Figure 10:
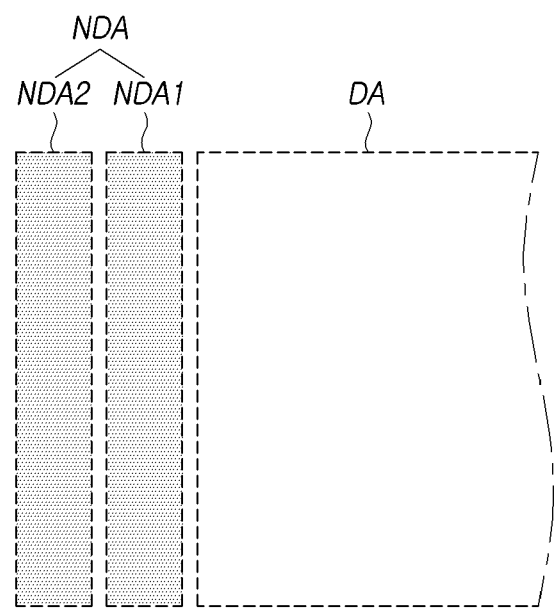
FIG. 10 illustrates an example display area and an example non-display area in a display panel of the touch display device according to aspects of the present disclosure.

FIG. 10 illustrates an example display area DA and an example non-display area NDA in the display panel 110 of the touch display device 100 according to aspects of the present disclosure.

Referring to FIG. 10, the display panel 110 can include the display area DA in which an image can be displayed and the non-display area NDA in which an image is not displayed.

Referring to FIG. 10, the non-display area NDA can include a first non-display area NDA1 and a second non-display area NDA2.

Referring to FIG. 10, the first non-display area NDA1 can be an area in which one or more touch driving related circuits are disposed, and the second non-display area NDA2 can be an area in which the gate driving circuit 130 for image displaying is disposed. In one or more embodiments, the gate driving circuit 130 can be a circuit formed in the gate in panel (GIP) type in the manufacturing process of the display panel 110.

Figure 11:
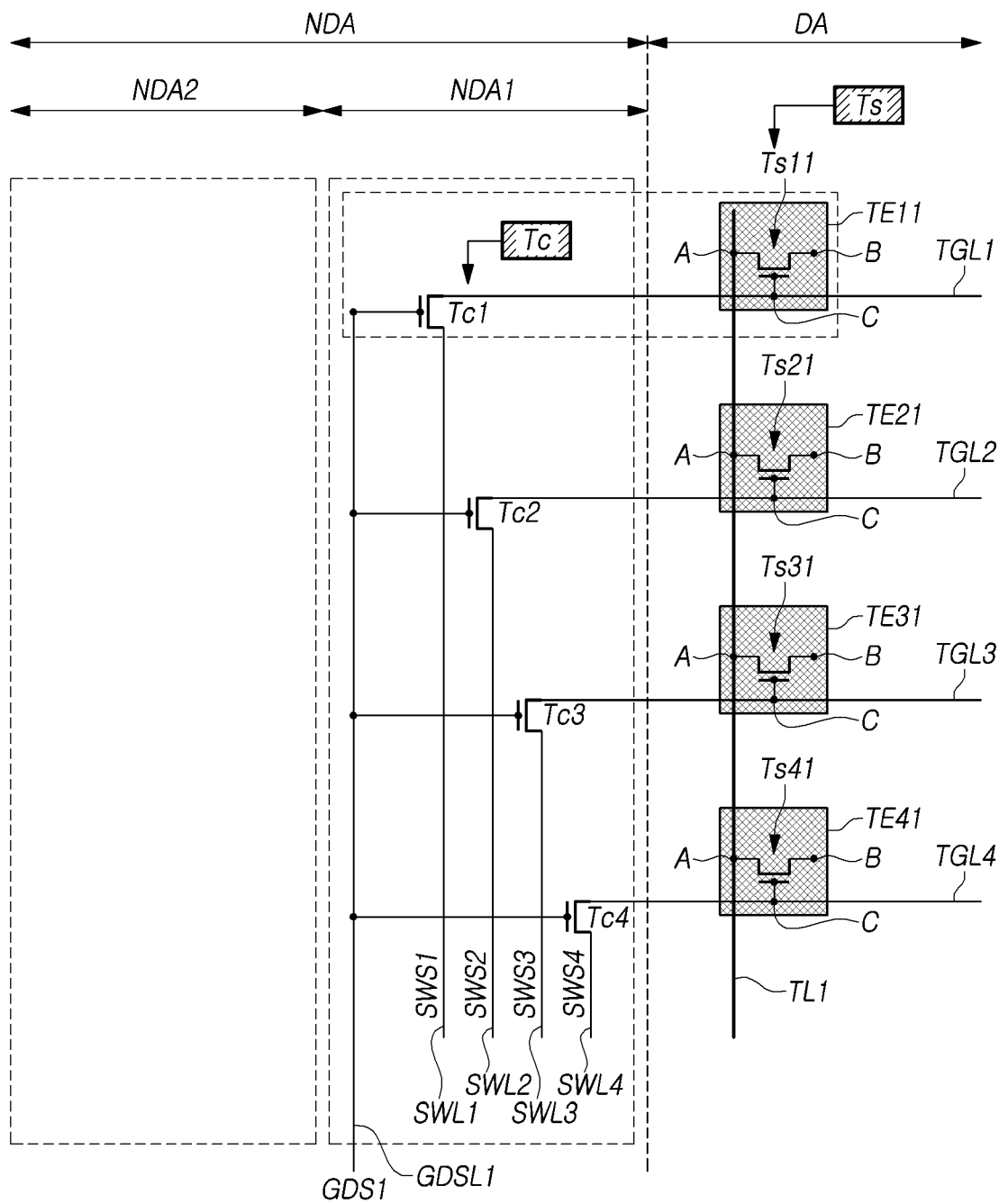
FIG. 11 illustrates example first to fourth touch electrodes, example first to fourth touch driving transistors, and example first to fourth control transistors in the touch display device according to aspects of the present disclosure.

FIG. 11 illustrates example first to fourth touch electrodes (TE11 to TE41), example first to fourth touch driving transistors (Ts11, Ts21, Ts31, and Ts41), and example first to fourth control transistors (Tc1 to Tc4) in the touch display device 100 according to aspects of the present disclosure. For convenience of description, discussions are provided based on the first to fourth touch electrodes (TE11, TE21, TE31, and TE41) included in a first touch electrode group GR1.

Referring to FIG. 11, subpixels SP for image displaying and touch electrodes (TE11, TE21, TE31, and TE41) for touch sensing can be disposed in the display area DA. Touch driving transistors (Ts11, Ts21, Ts31, and Ts41) for driving the touch electrodes (TE11, TE21, TE31, and TE41) can be further disposed in the display area DA.

Referring to FIG. 11, the first non-display area NDA1 can be an area where at least one touch driving related circuit is disposed, and control transistors (Tc1 to Tc4) for controlling driving of the touch driving transistors (Ts11, Ts21, Ts31, and Ts41) are disposed.

Referring to FIG. 11, the second non-display area NDA2 can be an area where the gate driving circuit 130 for image displaying is disposed, and various transistors and capacitors included in the gate driving circuit 130 are disposed.

Hereinafter, a touch sensor structure disposed in the display area DA and the first non-display area NDA1 will be described in more detail.

Referring to FIG. 11, the first to fourth touch electrodes (TE11, TE21, TE31, and TE41) and the first to fourth touch driving transistors (Ts11, Ts21, Ts31, and Ts41) can be disposed to correspond to each other in the display area DA.

Referring to FIG. 11, the first touch driving transistor Ts11 can be disposed adjacent to the first touch electrode TE11, and include first to third nodes (A, B and C) electrically connected to a first touch line TL1, the first touch electrode TE11, and a first touch gate line TGL1, respectively. The second touch driving transistor Ts21 can be disposed adjacent to the second touch electrode TE21, and include first to third nodes (A, B and C) electrically connected to the first touch line TL1, the second touch electrode TE21, and a second touch gate line TGL2, respectively. The third touch driving transistor Ts31 can be disposed adjacent to the third touch electrode TE31, and include first to third nodes (A, B and C) electrically connected to the first touch line TL1, the third touch electrode TE31, and a third touch gate line TGL3, respectively. The fourth touch driving transistor Ts41 can be disposed adjacent to the fourth touch electrode TE41, and include first to third nodes (A, B and C) electrically connected to the first touch line TL1, the fourth touch electrode TE41, and a fourth touch gate line TGL4, respectively.

Referring to FIG. 11, the second nodes B of the first to fourth touch driving transistors (Ts11, Ts21, Ts31, and Ts41) can be electrically connected to the first to fourth touch electrodes (TE11 to TE41), respectively, and the third nodes C of the first to fourth touch driving transistors (Ts11, Ts21, Ts31, and Ts41) can be electrically connected to the first to fourth touch gate lines (TGL1 to TGL4), respectively. All the first nodes A of the first to fourth touch driving transistors (Ts11, Ts21, Ts31, and Ts41) can be connected to the one first touch line TL1.

Referring to FIG. 11, the first to fourth touch driving transistors (Ts11 to Ts41) can overlap the first to fourth touch electrodes (TE11, TE21, TE31, and TE41), respectively.

Referring to FIG. 11, the first touch line TL1 can be disposed in the display area DA and can extend to the non-display area NDA and be connected to a touch pad unit 211 (e.g., the touch pad unit 211 in the figures discussed above).

Referring to FIG. 11, the first to fourth touch gate lines (TGL1 to TGL4) can extend from the display area DA to the non-display area NDA. For example, the first to fourth touch gate lines (TGL1 to TGL4) can extend up to a portion of the first non-display area NDA1 in which at least one touch driving related circuit is disposed.

Referring to FIG. 11, first to fourth switching signal lines (SWL1 to SWL4) and the first to fourth control transistors (Tc1 to Tc4) can be disposed in the first non-display area NDA1.

Referring to FIG. 11, the turn-on or turn-off operation of the first to fourth control transistors (Tc1 to Tc4) can be substantially concurrently controlled by a first group driving signal GDS1 delivered through a first group driving signal line GDSL1.

Referring to FIG. 11, as the first control transistor Tc1 is turned on, the first control transistor Tc1 can transfer a first switching signal SWS1 delivered from the first switching signal line SWL1 to the first touch gate line TGL1. As the second control transistor Tc2 is turned on, the second control transistor Tc2 can transfer a second switching signal SWS2 delivered from the second switching signal line SWL2 to the second touch gate line TGL2. As the third control transistor Tc3 is turned on, the third control transistor Tc3 can transfer a third switching signal SWS3 deliver from the third switching signal line SWL3 to the third touch gate line TGL3. As the fourth control transistor Tc4 is turned on, the fourth control transistor Tc4 can transfer a fourth switching signal SWS4 delivered from the fourth switching signal line SWL4 to the fourth touch gate line TGL4.

Referring to FIG. 11, the second non-display area NDA2 can be an area in which the gate driving circuit 130 for image displaying is disposed. For example, a gate driving transistor for transferring gate signals (e.g., a scan signal and a sensing signal) to a first gate line GL can be disposed in the second non-display area NDA2. For example, the gate driving transistor can be a transistor included in an output buffer circuit for outputting a gate signal to the first gate line GL, and be one of a pull-up transistor and a pull-down transistor.

In one or more embodiments, the touch display device 100 can include a substrate SUB including the display area DA and the non-display area NDA, the first and second touch electrodes (TE11 and TE21) disposed in the display area DA, the first touch driving transistor Ts11 disposed adjacent to the first touch electrode TE11, the second touch driving transistor Ts21 disposed adjacent to the second touch electrode TE21, the first touch line TL1 electrically connected to the first touch electrode TE11 through the first touch driving transistor Ts11 and electrically connected to the second touch electrode TE21 through the second touch driving transistor Ts21, the first touch gate line TGL1 electrically connected to the gate node C of the first touch driving transistor Ts11, and the second touch gate line TGL2 electrically connected to the gate node C of the second touch driving transistor Ts21.

In one or more embodiments, the touch display device 100 can further include the first switching signal line SWL1 for delivering a first switching signal SWS1 for turning on the first touch driving transistor Ts11, the second switching signal line SWL2 for delivering a second switching signal SWS2 for turning on the second touch driving transistor Ts21, the first control transistor Tc1 for controlling an interconnection between the first touch gate line TGL1 and the first switching signal line SWL1, and a second control transistor Tc2 for controlling an interconnection between the second touch gate line TGL2 and the second switching signal line SWL2.

In one or more embodiments, the first control transistor Tc1 and the second control transistor Tc2 included in the touch display device 100 can be disposed in the non-display area NDA.

Figure 12:
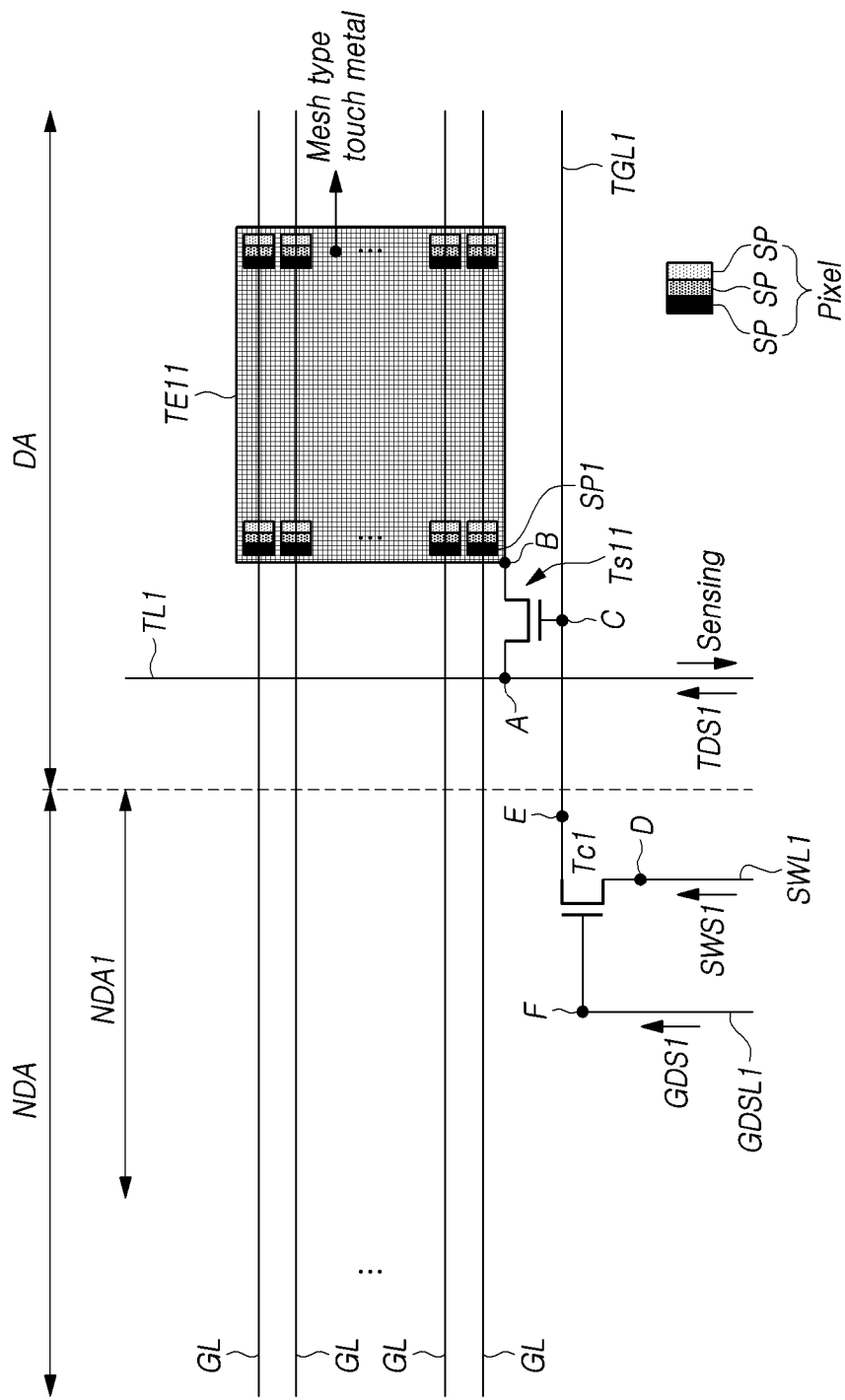
FIG. 12 illustrates the first touch electrode, the first touch driving transistor, and the first control transistor in the touch display device according to aspects of the present disclosure.

FIG. 12 illustrates the first touch electrode TE11, the first touch driving transistor Ts11, and the first control transistor Tc1 in the touch display device 100 according to aspects of the present disclosure. FIG. 12 is an enlarged view of the configuration of a dotted line box 1100 in FIG. 11.

Referring to FIG. 12, in one or more embodiments, one first touch electrode TE11 disposed in the display area DA of the display panel 110 of the touch display device 100 can overlap two or more subpixels SP. For example, the two or more subpixels SP can include a first subpixel SP1 as in examples discussed below. For example, one touch electrode can overlap a block of subpixels. Also, according to an embodiment, one touch electrode can be formed from pixel electrodes of a block of subpixels (e.g., divided from the common electrode, etc.).

Referring to FIG. 12, one first touch electrode TE11 disposed in the display area DA of the display panel 110 can be formed with a mesh-type touch metal. Accordingly, the first touch electrode TE11 can include two or more openings. Each of the two or more openings can correspond to a respective light emitting area of at least one subpixel SP.

Referring to FIG. 12, in the display area DA of the display panel 110, the first touch driving transistor Ts11 disposed adjacent to the first touch electrode TE11 can include first to third nodes (A, B, and C) electrically connected to the first touch line TL1, the first touch electrode TE11, and the first touch gate line TGL1, respectively.

Referring to FIG. 12, a first touch driving signal TDS1 output from the touch driving circuit 210 can be supplied to the first touch line TL1. As the first touch driving transistor Ts11 is turned on, the first touch driving signal TDS1 can be applied to the first touch electrode TE11 through the first touch driving transistor Ts11.

Referring to FIG. 12, the first control transistor Tc1 can be a transistor for controlling the turn-on or turn-off of the first touch driving transistor Ts11, and be disposed in the first non-display area NDA1 included in the non-display area NDA of the display panel 110.

Referring to FIG. 12, the first control transistor Tc1 can include first to third nodes (D, E, and F) electrically connected to the first switching signal line SWL1, the first touch gate line TGL1, and the first group driving signal line GDSL1, respectively.

Referring to FIG. 12, two or more gate lines GL connected to two or more subpixels SP overlapping the first touch electrode TE11 can be disposed in parallel to the first touch gate line TGL1. The first touch line TL1 can be disposed in parallel to two or more data lines DL connected to the two or more subpixels SP overlapping the first touch electrode TE11.

In one or more embodiments, the touch display device 100 can have a top emission structure in which light from a light emitting element is emitted in a direction opposite to the substrate SUB of the display panel 110. In these embodiments, a pixel electrode PE can be a reflective electrode (a reflective metal) or a transparent electrode (a transparent metal), and a corresponding common electrode CE can be a transparent electrode (a transparent metal).

Hereinafter, in examples where the display panel 110 of the touch display device 100 according to aspects of the present disclosure has a top emission structure, a stackup configuration (a cross-sectional structure) of the display panel 110 will be described in more detail by focusing on an advanced touch sensor structure with reference to figures. For ease of understanding, discussions on the advanced touch sensor structure will be provided based on an example stackup configuration (e.g., a vertical structure) in an area in which the first touch electrode TE11, the first touch driving transistor Ts11, and the first control transistor Tc1 of FIG. 12 are formed. For example, a plurality of subpixels SP including the first subpixel SP1 can be disposed in an area where the first touch electrode TE11 is disposed.

In the touch display device 100 according to aspects of the present disclosure, a touch electrode layer in which the first touch electrode TE11 is disposed and a touch line layer on which the first touch line TL1 is disposed can be layers suitable for the top emission structure, and be differently configured according to a configuration or structure of one or more insulating layers and/or one or more metal layers disposed in the display panel 110.

FIGS. 13 to 17 illustrate respective stackup configurations (cross-sectional structures) of the display panel 110 of the touch display device 100 according to aspects of the present disclosure.

Referring to FIGS. 13 to 17, in one or more embodiments, the display panel 110 of the touch display device 100 can include a display area DA where an image can be displayed and a non-display area NDA located outside of the display area DA.

Referring to FIGS. 13 to 17, the display area DA can include a pixel area PA in which a light emitting element ED is disposed and light from the light emitting element ED is emitted, and a touch area TA in which a touch sensor metal is disposed.

Referring to FIGS. 13 to 17, the non-display area NDA can include a first non-display area NDA1 where a touch driving related circuit is disposed and a second non-display NDA2 area where the gate driving circuit 130 for image displaying is disposed.

Referring to FIGS. 13 to 17, in one or more embodiments, the display panel 110 of the touch display device 100 can include a substrate SUB, a display anode electrode D_AND over the substrate SUB, an emission layer EL on the display anode electrode D_AND, and a display cathode electrode D_CTD located on the emission layer EL and including a cathode electrode material. For example, the cathode electrode material can be a transparent electrode material or a material having a predefined level or higher transparency (transmittance).

Referring to FIGS. 13 to 17, in the pixel area PA of the display area DA, the display anode electrode D_AND, the emission layer EL, and the display cathode electrode D_CTD can be included in a light emitting element ED.

Referring to FIGS. 13 to 17, in one or more embodiments, the display panel 110 of the touch display device 100 can further include a second electrode T_E2.

The second electrode T_E2 can be an electrode serving as a first touch electrode TE11 (e.g., the first touch electrode TE11 in the figures discussed above) and can be disposed in the touch area TA.

The second electrode T_E2 can include the same cathode electrode material as the display cathode electrode D_CTD.

Referring to FIGS. 13 to 17, in one or more embodiments, the display panel 110 of the touch display device 100 can further include a first touch line TL1 to which a touch driving signal having a variable voltage level is applied.

For example, the first touch line TL1 can be disposed in the touch area TA. In another example, the first touch line TL1 can be disposed across the touch area TA and the pixel area PA, be disposed in the pixel area PA, or be disposed in the non-display area NDA.

Referring to FIGS. 13 to 17, in one or more embodiments, the display panel 110 of the touch display device 100 can further include a first touch driving transistor Ts11 (e.g., the first touch driving transistor Ts11 in the figures discussed above) for controlling an interconnection between the first touch line TL1 and the second electrode T_E2.

Referring to FIGS. 13 to 17, the first touch driving transistor Ts11 can be disposed in the display area DA.

Referring to FIGS. 13 to 17, for example, the first touch driving transistor Ts11 can be disposed in the touch area TA of the display area DA.

In another example, the first touch driving transistor Ts11 can be disposed across the touch area TA and the pixel area PA or be disposed in the pixel area PA.

In an example where the first touch driving transistor Ts11 among a plurality of touch driving transistors Ts is located in an outermost edge of the panel, the first touch driving transistor Ts11 can be disposed in the touch area TA, be disposed across the touch area TA and the first non-display area NDA1, or disposed in the first non-display area NDA1.

Referring to FIGS. 13 to 17, in one or more embodiments, the display panel 110 of the touch display device 100 can further include a first control transistor Tc1 (e.g., the first control transistor Tc1 in the figures discussed above) for controlling the turn-on and turn-off operation of the first touch driving transistor Ts11.

Referring to FIGS. 13 to 17, the first control transistor Tc1 can be disposed in the non-display area NDA located outside of the display area DA.

Referring to FIGS. 13 to 17, for example, the first control transistor Tc1 can be disposed in the first non-display area NDA1 of the non-display area NDA.

In another example, the first control transistor Tc1 can be disposed across the first non-display area NDA1 and the touch area TA or be disposed in the touch area TA.

Referring to FIGS. 13 to 17, in one or more embodiments, the display panel 110 of the touch display device 100 can further include a first relay electrode RE_TS for an interconnection between the first touch driving transistor Ts11 and the second electrode T_E2. For example, the first relay electrode RE_TS is shown as being disposed on a first planarization layer PLN1, but first relay electrode RE_TS can be disposed on other layers, such as a second planarization layer PLN2, a first interlayer insulating layer ILD1 or a second interlayer insulating layer ILD2, but embodiments are not limited thereto. Also, the first relay electrode RE_TS can be disposed at a same layer or at a same height away from the substrate as one or more of the second planarization layer PLN2, the first interlayer insulating layer ILD1 or the second interlayer insulating layer ILD2.

The first relay electrode RE_TS can be disposed in various locations. For example, the first relay electrode RE_TS can be located in various material layers.

Referring to FIGS. 13 to 17, the first relay electrode RE_TS can be located farther away from the substrate SUB than a first source or drain electrode (S1 or D1) of the first touch driving transistor Ts11, and be located closer to the substrate SUB than the second electrode T_E2. For example, the first relay electrode RE_TS can be disposed at an area between the second electrode T_E2 and the first touch driving transistor Ts11, and between the first touch driving transistor Ts11 and the display driving transistor DRT, but embodiments are not limited thereto.

Figure 15:
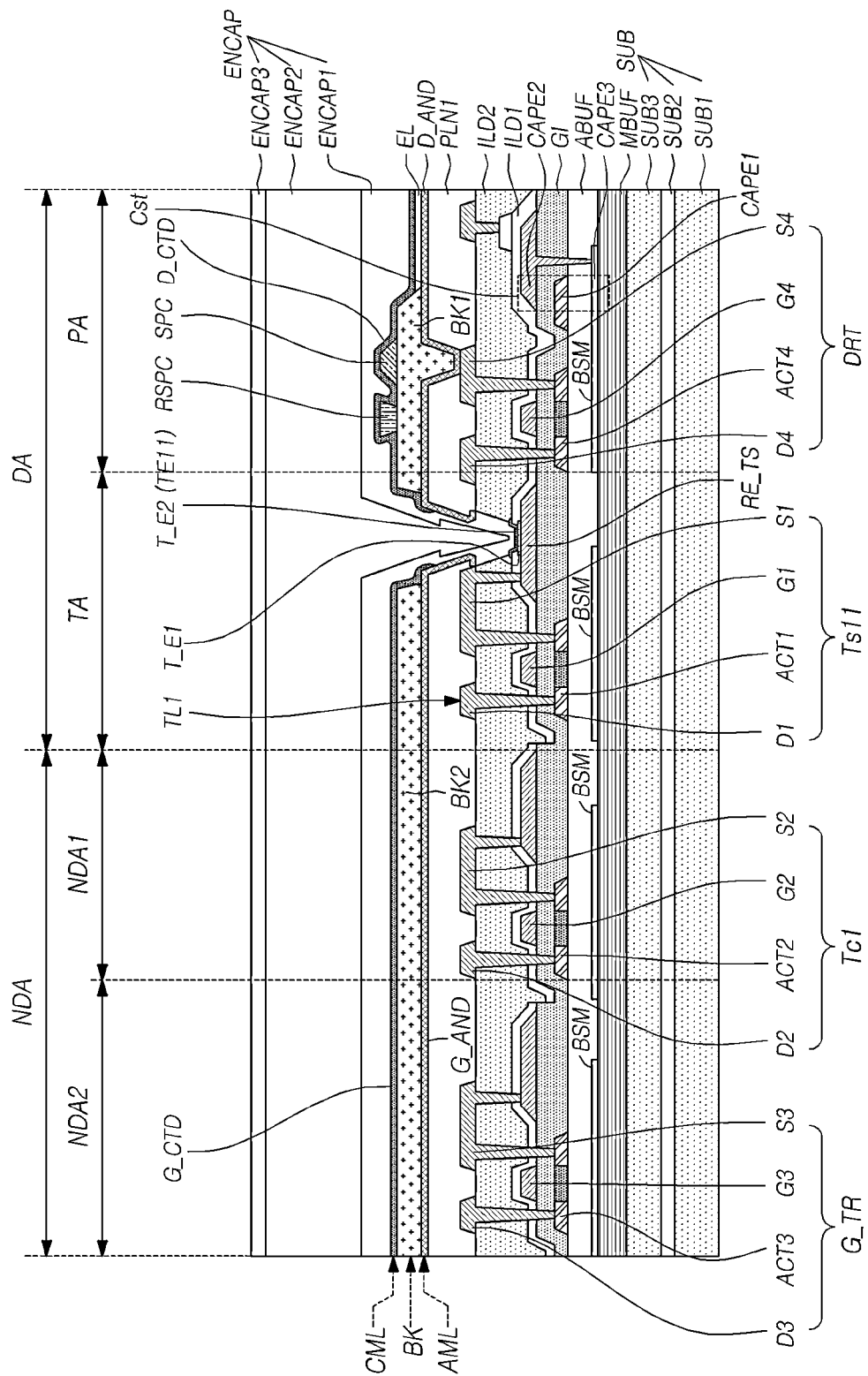
FIG. 15 is another example cross-sectional view of the display panel of the touch display device according to aspects of the present disclosure.
Figure 16:
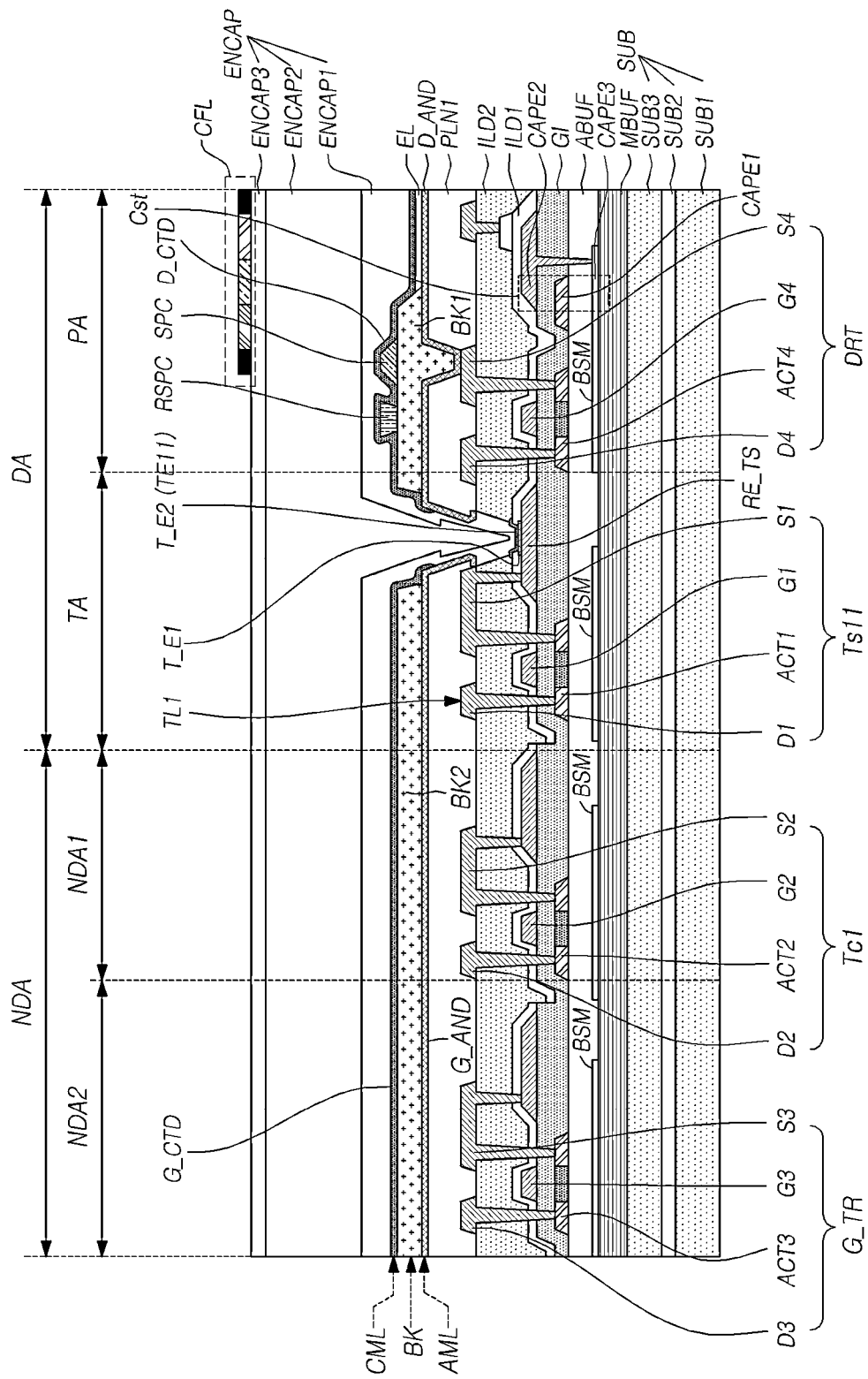
FIG. 16 is yet another example cross-sectional view of the display panel of the touch display device according to aspects of the present disclosure.

Referring to FIGS. 15 and 16, the first relay electrode RE_TS can be located farther away from the substrate SUB than a first active layer ACT1 of the first touch driving transistor Ts11, and can be located closer to the substrate SUB than the second electrode T_E2.

For example, the first relay electrode RE_TS can be located in or at the same layer (a gate material layer) as a first gate electrode G1 of the first touch driving transistor Ts11. According to this example, the first relay electrode RE_TS can include the same gate material as the first gate electrode G1 of the first touch driving transistor Ts11. Also, a width of the first relay electrode RE_TS can be wider than a width of the first gate electrode G1.

Referring to FIGS. 13 to 16, the display cathode electrode D_CTD can be disposed in a cathode electrode material layer CML in which a cathode electrode material is disposed. The display anode electrode D_AND can be disposed in an anode electrode material layer AML in which an anode electrode material is disposed.

Referring to FIGS. 13 to 16, in the process of manufacturing the display panel 110, since the cathode electrode material can be deposited to have one or more structural cuts, the display cathode electrode D_CTD and the second electrode T_E2 can be separately formed. Such a structure can be referred to as a cathode split structure.

Figure 13:
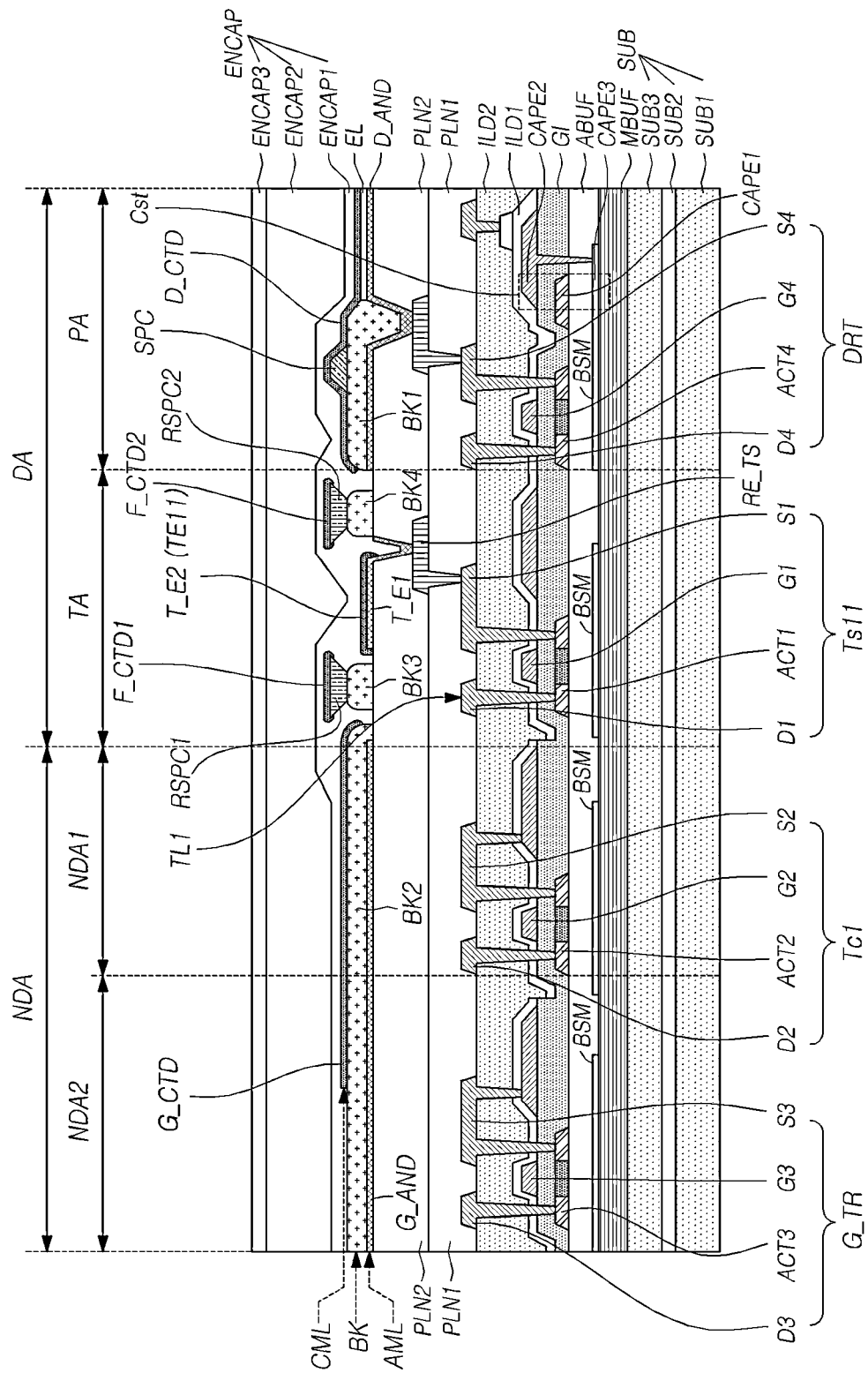
FIG. 13 is an example cross-sectional view of the display panel of the touch display device according to aspects of the present disclosure.
Figure 14:
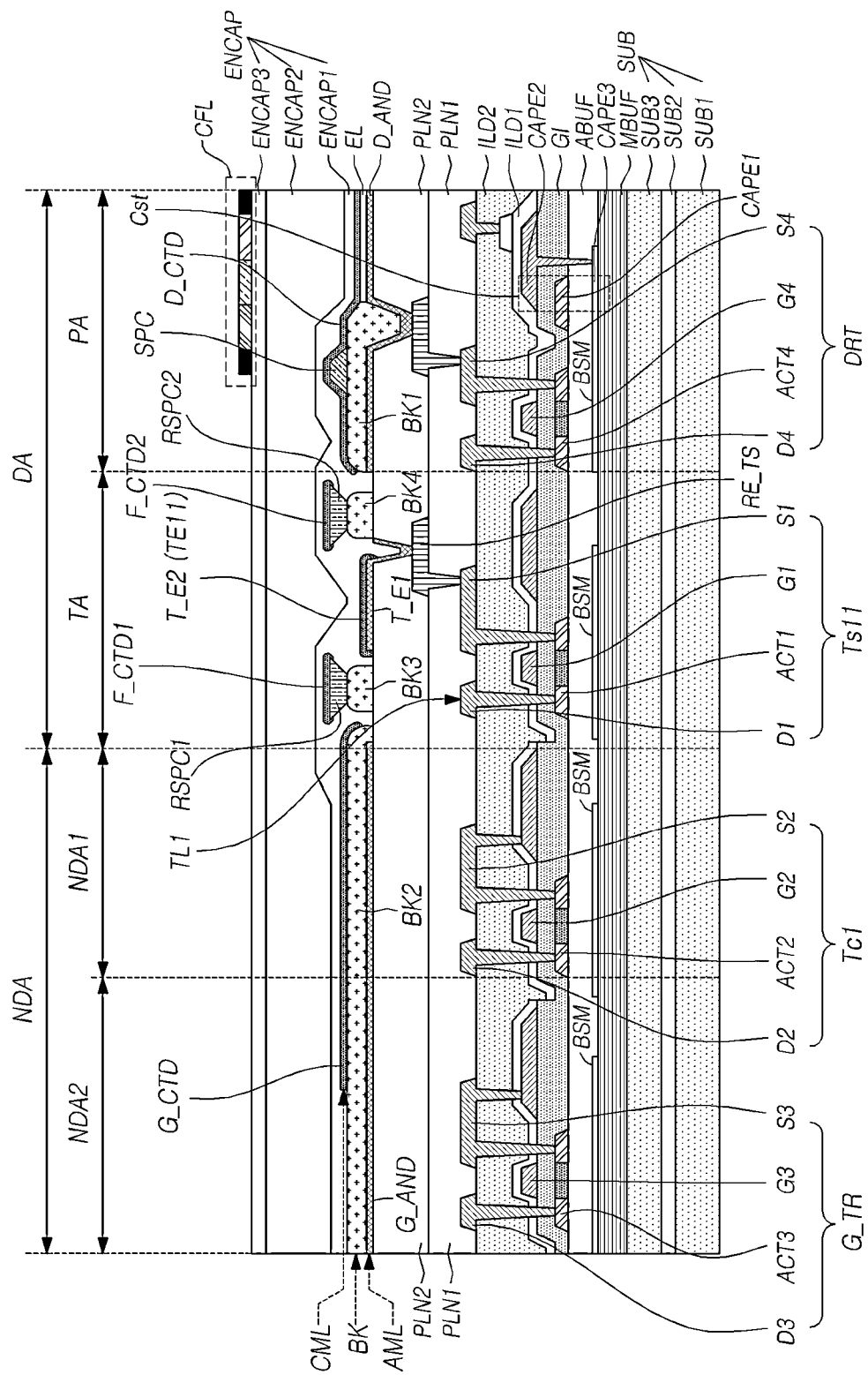
FIG. 14 is another example cross-sectional view of the display panel of the touch display device according to aspects of the present disclosure.

The cathode split structures of FIGS. 13 and 14 can be different than the cathode split structures of FIGS. 15 and 16. The cathode split structures of FIGS. 13 and 14 can be formed by a bank BK during the process of manufacturing the display panel 110. For example, the cathode split structures can be formed during the process of manufacturing the display panel 110 by an under-cut structure in which an insulating layer under the bank BK is downwardly recessed from the top surface thereof. In other words, a large cathode layer can be laid down across the panel which can be effectively cut or split into different cathode portions by raised areas of the bank BK and/or depressed areas in the insulating layers (e.g., by a portion of the bank BK that has a reverse tapered shape, or by a steep trench in insulating layers PLN1, ILD2, etc.).

The cathode split structures of FIGS. 15 and 16 can be formed during the process of manufacturing the display panel 110 by the anode electrode material layer AML in which the anode electrode material, which is the pixel electrode material, is disposed. For example, the cathode split structures can be formed during the process of manufacturing the display panel 110 by an under-cut structure in which an insulating layer (e.g., an interlayer insulating layer ILD2) under the anode electrode material layer AML is downwardly recessed from the top surface thereof.

As described above, since the cathode split structures of FIGS. 13 and 14 are different from the cathode split structures of FIGS. 15 and 16, the second electrode T_E2 disposed in the display panel 110 in the configurations of FIGS. 13 and 14 can be disposed at different locations than the second electrode T_E2 disposed in the display panel 110 in the configurations of FIGS. 15 and 16.

Referring to FIGS. 13 to 16, when a cathode material electrode is deposited, the display cathode electrode D_CTD and the second electrode T_E2 can be formed, and at the same time, a gate cathode electrode G_CTD can be formed. For example, the gate cathode electrode G_CTD can be the cathode electrode material disposed in the non-display area NDA. That is, in the cathode electrode material layer CML, the display cathode electrode D_CTD, the second electrode T_E2, and the gate cathode electrode G_CTD can be disposed to be separated from each other.

Referring to FIGS. 13 to 16, when an anode material electrode is deposited, the display anode electrode D_AND and a first electrode T_E1 can be formed, and at the same time, a gate anode electrode G_AND can be formed. For example, the gate anode electrode G_AND can be the anode electrode material disposed in the non-display area NDA. That is, in the anode electrode material layer AML, the display anode electrode D_AND, the first electrode T_E1, and the gate anode electrode G_AND can be disposed to be separated from each other. In other words, a large anode material layer can be laid down across the panel which can be effectively cut or split into different conductive portions by raised areas of the bank BK and/or depressed areas in various insulating layers (e.g., by a portion of the bank BK that has a reverse tapered shape, or by a steep trench in insulating layers PLN1, ILD2, etc.). Also, split portions of the cathode layer can be in direct contact with spilt portions of the anode layer where desired.

Referring to FIGS. 13 to 16, since the emission layer EL is vulnerable to moisture or oxygen, in order to prevent moisture or oxygen from penetrating into the emission layer EL, the display panel 110 can further include an encapsulation layer ENCAP disposed to cover the light emitting element ED.

Referring to FIGS. 13 to 16, the encapsulation layer ENCAP can be disposed on the cathode electrode material layer CML.

For example, the encapsulation layer ENCAP can have a single layer structure. In another example, as shown in FIGS. 13 to 16, the encapsulation layer ENCAP can have a multilayer structure.

As shown in FIGS. 13 to 16, in examples where the encapsulation layer ENCAP has a multilayer structure, the encapsulation layer ENCAP can include, for example, a first encapsulation layer ENCAP1, a second encapsulation layer ENCAP2, and a third encapsulation layer ENCAP3.

For example, the first encapsulation layer ENCAP1 and the third encapsulation layer ENCAP3 can be inorganic material layers, and the second encapsulation layer ENCAP2 can be an organic material layer.

In another example, the first encapsulation layer ENCAP1 can be an inorganic layer or organic layer, the third encapsulation layer ENCAP3 can be an encapsulation substrate, and the second encapsulation layer ENCAP2 can include a filler layer between the first encapsulation layer ENCAP1 and the third encapsulation layer ENCAP3 and at least one dam located outside of the filler layer to prevent leakage of the filler layer.

Referring to FIGS. 14 and 16, in one or more embodiments, the display panel 110 of the touch display device 100 can further include a color filter layer CFL located on the encapsulation layer ENCAP.

Referring to FIGS. 14 and 16, the color filter layer CFL can be located on the light emitting element ED in the pixel area PA (e.g., see the upper right area over the light in FIGS. 14 and 16).

Hereinafter, example cross-sectional structures of the display panel 110 will be described in more detail with reference to FIGS. 13 and 14. Thereafter, example cross-sectional structures of the display panel 110 will be described in more detail with reference to FIGS. 15 and 16.

FIG. 13 is an example cross-sectional view of the display panel 110 of the touch display device 100 according to aspects of the present disclosure. FIG. 14 is another example cross-sectional view of the display panel 110 of the touch display device 100 according to aspects of the present disclosure.

Referring to FIGS. 13 and 14, in one or more embodiments, the display panel 110 of the touch display device 100 can include the substrate SUB including the display area DA and the non-display area located outside of the display area DA, the display anode electrode D_AND disposed in the display area DA, the emission layer EL disposed in the display area DA and disposed on the display anode electrode D_AND, and the display cathode electrode D_CTD disposed in the display area DA, located on the emission layer EL, and including a cathode electrode material, which is a transparent electrode material.

The display anode electrode D_AND, the emission layer EL, and the display cathode electrode D_CTD can be included in a light emitting element ED. An area where the display anode electrode D_AND, the emission layer EL, and the display cathode electrode D_CTD overlap can correspond to a light emitting area where light from the light emitting element ED is emitted.

In an example where the display panel 110 is a top emission display panel, the display cathode electrode D_CTD can include a transparent electrode material.

The substrate SUB can include a first substrate SUB1, a second substrate SUB2, and a third substrate SUB3. The first substrate SUB1 and the third substrate SUB3 can be substrates including a polyimide (PI) material. The second substrate SUB2 can be an inorganic layer for shielding moisture.

Referring to FIGS. 13 and 14, in one or more embodiments, the display panel 110 of the touch display device 100 can further include a multi-buffer layer MBUF disposed on the substrate SUB, lower shield metals BSM disposed on the multi-buffer layer MBUF, and an active buffer layer ABUF on the lower shield metals BSM.

Referring to FIGS. 13 and 14, in one or more embodiments, the display panel 110 of the touch display device 100 can further include various types of transistors (e.g., G_TR, Tc1, Ts11, and DRT) located on the active buffer layer ABUF.

In one or more embodiments, the display panel 110 of the touch display device 100 can include display driving transistors DRT disposed in the display area DA, each of which drives a respective light emitting element ED of each subpixel SP.

Each display driving transistor DRT can be disposed in each subpixel SP. The display driving transistor DRT can supply, as a transistor for driving the display anode electrode D_AND, a driving current to the display anode electrode D_AND.

Referring to FIGS. 13 and 14, in one or more embodiments, the display panel 110 of the touch display device 100 can further include a first touch electrode TE11 (e.g., the first touch electrode TE11 in the figures discussed above) disposed in the display area DA and a first touch driving transistor Ts11 (e.g., the first touch driving transistor Ts11 in the figures discussed above) for driving the first touch electrode TE11. Also, according to an embodiment, the first touch electrode TE11 can be disposed on or at a same layer as the light emitting layer EL of the light emitting element ED, but embodiments are not limited thereto. In this way, a much thinner touch display device can be provided.

For example, the first touch driving transistor Ts11 can be disposed in the display area DA The first touch driving transistor Ts11 can be disposed in the touch area TA of the display area DA.

In another example, the first touch driving transistor Ts11 can be disposed across the touch area TA and the pixel area PA or be disposed in the pixel area PA. In an example where the first touch driving transistor Ts11 among a plurality of touch driving transistors Ts is located in an outermost edge of the display area DA, the first touch driving transistor Ts11 can be disposed in the touch area TA, be disposed across the touch area TA and the first non-display area NDA1, or disposed in the first non-display area NDA1.

Referring to FIGS. 13 and 14, the first touch driving transistor Ts11 can include a first active layer ACT1, a first source electrode S1, a first drain electrode D1, and a first gate electrode G1.

For example, the first source electrode S1 of the first touch driving transistor Ts11 can be electrically connected to the first touch electrode TE11. For example, the first source electrode S1 can be the second node B of the first touch driving transistor Ts11 in FIG. 12. The first drain electrode D1 of the first touch driving transistor Ts11 can be electrically connected to the first touch electrode TL1. For example, the first drain electrode D1 can be the first node A of the first touch driving transistor Ts11 in FIG. 12. The first gate electrode G1 of the first touch driving transistor Ts11 can be electrically connected to a first touch gate line TGL1. For example, the first gate electrode G1 can be the third node C of the first touch driving transistor Ts11 in FIG. 12.

Referring to FIGS. 13 and 14, in one or more embodiments, in the display panel 110 of the touch display device 100, the first touch electrode TE11 can include the second electrode T_E2. In other words, the first touch electrode TE11 and the display cathode D_CTD of the light emitting element ED can be made during a same process, from a same material and at a same layer, but embodiments are not limited thereto. This can reduce manufacturing time and costs, while also producing a much thinner touch display device.

For example, the second electrode T_E2 included in the first touch electrode TE11 can be formed in a mesh pattern. However, embodiments of the present disclosure are not limited thereto. Several subpixels SP can be disposed in an area where the first touch electrode TE11 is formed. Light emitting areas of the subpixels SP can be respectively located in opening areas in the area of the first touch electrode TE1.

Referring to FIGS. 13 and 14, the second electrode T_E2 can include a cathode electrode material that is spaced apart from the display cathode electrode D_CTD including the same cathode electrode material.

The second electrode T_E2 can include the same cathode electrode material as the display cathode electrode D_CTD. It should be noted that the second electrode T_E2 and the display cathode electrode D_CTD can be spaced apart from each other and electrically disconnected from each other (e.g., separated by a trench, a raised portion or an undercut area).

Referring to FIGS. 13 and 14, in one or more embodiments, in the display panel 110 of the touch display device 100, the first touch electrode TE11 can further include the first electrode T_E1 disposed under the second electrode T_E2. Also, the first electrode T_E1 and the second electrode T_E2 can be in direct contact with each other to form the first touch electrode TE11. According to another embodiment, one or more other conductive layers can be disposed between the first electrode T_E1 and the second electrode T_E2 forming the first touch electrode TE11.

The first electrode T_E1 can include the same anode electrode material as the display anode electrode D_AND. In other words, part of the first touch electrode TE11 and the display anode electrode D_AND of the light emitting element ED can be made during a same process, from a same material and at a same layer, but embodiments are not limited thereto.

Referring to FIGS. 13 and 14, in one or more embodiments, in the display panel 110 of the touch display device 100, the first touch electrode TE11 can further include a first relay electrode RE_TS for relaying an electrical interconnection between the first source electrode S1 or the first drain electrode D1 of the first touch driving transistor Ts11 and the second electrode T_E2. In other words, the first relay electrode RE_TS can connect the second electrode T_E2 with the first touch driving transistor Ts11. Also, the first relay electrode RE_TS can be disposed at a layer that is located between the second electrode T_E2 and the first touch driving transistor Ts11. According to an embodiment, all three of the second electrode T_E2, the first relay electrode RE_TS and the first touch driving transistor Ts11 can overlap with each other in a vertical direction relative to the substrate, but embodiments are not limited thereto. Referring to FIGS. 13 and 14, the first relay electrode RE_TS can be located between the first source electrode S1 or the first drain electrode D1 and the second electrode T_E2. For example, the first relay electrode RE_TS can be disposed on the first planarization layer PLN1.

Referring to FIGS. 13 and 14, in one or more embodiments, the display panel 110 of the touch display device 100 can further include a first touch line TL1 (e.g., the first touch line TL1 in the figures discussed above). The first touch line TL1 can be disposed at a lower layer than the first relay electrode RE_TS relative to the substrate (e.g., on the second interlayer insulating layer ILD2), but embodiments are not limited thereto.

The first touch line TL1 can be an extended portion of the first drain electrode D1 or the first source electrode S1 of the first touch driving transistor Ts11, or be a separate line electrically connected to the first drain electrode D1 or the first source electrode S1 of the first touch driving transistor Ts11.

Referring to FIGS. 13 and 14, in one or more embodiments, the display panel 110 of the touch display device 100 can further include a first control transistor Tc1 (e.g., the first control transistor Tc1 in the figures discussed above) for controlling the turn-on and turn-off operation of the first touch driving transistor Ts11.

Referring to FIGS. 13 and 14, the first control transistor Tc1 can include a second active layer ACT2, a second source electrode S2, a second drain electrode D2, and a second gate electrode G2.

The second source electrode S2 or the second drain electrode D2 of the first control transistor Tc1 can be electrically connected to the first gate electrode G1 of the first touch driving transistor Ts11. For example, the second source electrode S2 or the second drain electrode D2 of the first control transistor Tc1 can be connected to a first touch gate line TGL1 (e.g., the first touch gate line TGL1 in the figures discussed above) connected to the first gate electrode G1 of the first touch driving transistor Ts11.

The second drain electrode D2 or the second source electrode S2 of the first control transistor Tc1 can be electrically connected to a first switching signal line SWL1 (e.g., the first switching signal line SWL 1 in the figures discussed above).

The second gate electrode G2 of the first control transistor Tc1 can be electrically connected to a driving signal line GDSL1 (e.g., the driving signal line GDSL1 in the figures discussed above).

The second drain electrode D2 or the second source electrode S2 of the first control transistor Tc1 can be electrically connected to the first switching signal line SWL1. For example, the second drain electrode D2 or the second source electrode S2 can be the first node D of the first control transistor Tc1 in FIG. 12. The second source electrode S2 or the second drain electrode D2 of the first control transistor Tc1 can be electrically connected to the first touch gate line TGL1. For example, the second source electrode S2 or the second drain electrode D2 can be the second node E of the first control transistor Tc1 in FIG. 12. The second gate electrode G2 of the first control transistor Tc1 can be electrically connected to a first group driving signal line GDSL1 (e.g., the first group driving signal line GDSL1 in the figures discussed above). For example, the second gate electrode G2 can be the third node F of the first control transistor Tc1 in FIG. 12.

Referring to FIGS. 13 and 14, the first control transistor Tc1 can have the same structure as the first touch driving transistor Ts11. Accordingly, the second active layer ACT2 of the first control transistor Tc1 can include the same semiconductor material as the first active layer ACT1 of the first touch driving transistor Ts11, the second source electrode S2 of the first control transistor Tc1 can include the same material as the first source electrode S1 of the first touch driving transistor Ts11, the second drain electrode D2 of the first control transistor Tc1 can include the same material as the first drain electrode D1 of the first touch driving transistor Ts11, and the second gate electrode G2 of the first control transistor Tc1 can include the same material as the first gate electrode G1 of the first touch driving transistor Ts11.

For example, while the first touch driving transistor Ts11 can be disposed in the display area DA, the first control transistor Tc1 can be disposed in the non-display area NDA.

Referring to FIGS. 13 and 14, in one or more embodiments, the display panel 110 of the touch display device 100 can further include the gate driving circuit 130 formed in the gate in panel (GIP) type.

Referring to FIGS. 13 and 14, in one or more embodiments, in the display panel 110 of the touch display device 100, the first control transistor Tc1 can be disposed in the first non-display area NDA, and the gate driving circuit 130 can be disposed in the second non-display area NDA.

Referring to FIGS. 13 and 14, the gate driving circuit 130 can include a gate driving transistor G_TR. The gate driving transistor G_TR included in the gate driving circuit 130 can be one of a pull-up transistor and a pull-town transistor, or be a transistor for controlling a voltage at the gate node of one of the pull-up transistor and the pull-town transistor.

Referring to FIGS. 13 and 14, the gate driving transistor G_TR can include a third active layer ACT3, a third source electrode S3, a third drain electrode D3, and a third gate electrode G3.

Referring to FIGS. 13 and 14, the gate driving transistor G_TR can have the same structure as the first control transistor Tc1. Accordingly, the third active layer ACT3 of the gate driving transistor G_TR can include the same semiconductor material as the second active layer ACT2 of the first control transistor Tc1, the third source electrode S3 of the gate driving transistor G_TR can include the same material as the second source electrode S2 of the first control transistor Tc1, the third drain electrode D3 of the gate driving transistor G_TR can include the same material as the second drain electrode D2 of the first control transistor Tc1, and the third gate electrode G3 of the gate driving transistor G_TR can include the same material as the second gate electrode G2 of the first control transistor Tc1.

Referring to FIGS. 13 and 14, a display driving transistor DRT can include a fourth active layer ACT4, a fourth source electrode S4, a fourth drain electrode D4, and a fourth gate electrode G4.

Referring to FIGS. 13 and 14, the display driving transistor DRT can have the same structure as the first touch driving transistor Ts11. Accordingly, the fourth active layer ACT4 of the display driving transistor DRT can include the same semiconductor material as the first active layer ACT1 of the first touch driving transistor Ts11, the fourth source electrode S4 of the display driving transistor DRT can include the same material as the first source electrode S1 of the first touch driving transistor Ts11, the fourth drain electrode D4 of the display driving transistor DRT can include the same material as the first drain electrode D1 of the first touch driving transistor Ts11, and the fourth gate electrode G4 of the display driving transistor DRT can include the same material as the first gate electrode G1 of the first touch driving transistor Ts11. Also, the first touch driving transistor Ts11 can be disposed at a location between the first control transistor Tc1 and the display driving transistor DRT.

Referring to FIGS. 13 and 14, the first active layer ACT1, the second active layer ACT2, the third active layer ACT3, and the fourth active layer ACT4 can be located on the active buffer layer ABUF.

Referring to FIGS. 13 and 14, each of the lower shield metals BSM can be disposed under the first active layer ACT1, the second active layer ACT2, the third active layer ACT3, and the fourth active layer ACT4, and overlap the first active layer ACT1, the second active layer ACT2, the third active layer ACT3, and the fourth active layer ACT4. Also, according to an embodiment, all four of a lower shield metal BSM, the second electrode T_E2, the first relay electrode RE_TS and the first touch driving transistor Ts11 can overlap with each other in a vertical direction relative to the substrate, but embodiments are not limited thereto.

Referring to FIGS. 13 and 14, the display panel 110 can include a gate insulating layer GI located on the first active layer ACT1, the second active layer ACT2, the third active layer ACT3, and the fourth active layer ACT4.

Referring to FIGS. 13 and 14, the first gate electrode G1, the second gate electrode G2, the third gate electrode G3, and the fourth gate electrode G4 can be disposed on the gate insulating layer GI. Respective channel regions of the first active layer ACT1, the second active layer ACT2, the third active layer ACT3, and the fourth active layer ACT4 can overlap the first gate electrode G1, the second gate electrode G2, the third gate electrode G3, and the fourth gate electrode G4, respectively.

Referring to FIGS. 13 and 14, the display panel 110 can include at least one interlayer insulating layer (a first interlayer insulating layer ILD1 and/or a second interlayer insulating layer ILD2) disposed on the first gate electrode G1, the second gate electrode G2, the third gate electrode G3, and the fourth gate electrode G4.

Referring to FIGS. 13 and 14, the display panel 110 can further include the gate insulating layer GI between the first active layer ACT1 and the first gate electrode G1, the at least one interlayer insulating layer (ILD1 and/or ILD2) disposed on the first gate electrode G1, a first planarization layer PLN1 disposed on the at least one interlayer insulating layer (ILD1 and/or ILD2), and a second planarization layer PLN2 disposed on the first planarization layer PLN1. Also, according to an embodiment, all five of the first gate electrode G1, a lower shield metal BSM, the second electrode T_E2, the first relay electrode RE_TS and the first touch driving transistor Ts11 can overlap with each other in a vertical direction relative to the substrate, but embodiments are not limited thereto. In this way, space can be conserved while circuit elements can be hidden from a viewer to help reduce reflections and improve image quality.

Referring to FIGS. 13 and 14, each of the first source electrode S1 and the first drain electrode D1 can be located between the at least one interlayer insulating layer (ILD1 and/or ILD2) and the first planarization layer PLN1, and can be connected to the first active layer ACT1 through holes of the at least one interlayer insulating layer (ILD1 and/or ILD2) and the gate insulating layer GI.

Referring to FIGS. 13 and 14, the first relay electrode RE_TS can be located between the first planarization layer PLN1 and the second planarization layer PLN2, and be connected to the first source electrode S1 or the first drain electrode D1 through a hole in the first planarization layer PLN1.

Referring to FIGS. 13 and 14, the second electrode T_E2 or the first electrode T_E1 connected to the second electrode T_E2 can be located on the second planarization layer PLN2, and be connected to the first relay electrode RE_TS through a hole in the second planarization layer PLN2. For example, the second planarization layer PLN2 can be disposed between the first relay electrode RE_TS and the stacked second electrode T_E2 and first electrode T_E1 forming the first touch electrode TE11.

Referring to FIGS. 13 and 14, the display panel 110 can include a bank BK located between the anode electrode material layer AML, in which an anode electrode material is disposed and the cathode electrode material layer CML in which a cathode electrode material is disposed.

The display anode electrode D_AND can be located within the anode electrode material layer AML, and the display cathode electrode D_CTD and second electrode T_E2 can be located within the cathode electrode material layer CML.

Referring to FIGS. 13 and 14, the bank BK can include a first bank portion BK1 located on a portion of the display anode electrode D_AND, a second bank portion BK2 overlapping the non-display area NDA, and third and fourth bank portions BK3 and BK4 located between the first bank portion BK1 and the second bank portion BK2.

Referring to FIGS. 13 and 14, the cathode electrode material is disconnected between the third bank portion BK3 and the fourth bank portion BK4, and the second electrode T_E2 can be located between the third bank portion BK3 and the fourth bank portion BK4.

Referring to FIGS. 13 and 14, the bank BK is not disposed under the second electrode T_E2. Accordingly, at least a portion of the display cathode electrode D_CTD can be located farther away from the substrate SUB than the second electrode T_E2. For example, at least a portion of the display cathode electrode can be disposed higher than the second electrode T_E2 relative to the substrate.

Referring to FIGS. 13 and 14, the second electrode T_E2 can be located farther away from the substrate SUB than the display anode electrode D_AND, or be located farther away from the substrate SUB than the first source electrode S1 and the first drain electrode D1. For example, the second electrode T_E2 can be disposed higher than the display anode electrode D_AND and the first source and drain electrodes S1, S2, relative to the substrate.

Referring to FIGS. 13 and 14, the display panel 110 can further include a first reverse spacer RSPC1 on the third bank portion BK3 and a second reverse spacer RSPC2 on the fourth bank portion BK4. For example, each of the first and second reverse spacers RSPC1 and RSPC2 can have a reverse taper shape that becomes narrower toward the substrate SUB (e.g., an upside down trapezoid shape or an upside down triangular shape).

Referring to FIGS. 13 and 14, the display panel 110 can further include a first floating cathode electrode F_CTD1 on the first reverse spacer RSPC1 and a second floating cathode electrode F_CTD2 on the second reverse spacer RSPC2. Also, the first and second floating cathode electrodes F_CTD1, F_CTD2 can be disposed farther away from the substrate than the first light emitting element ED, the second electrode T_E2, the first relay electrode RE_TS and the transistors (e.g., DRT, Ts11, Tc1 and G_TR).

The first floating cathode electrode F_CTD1 and the second floating cathode electrode F_CTD2 can be spaced apart from and electrically disconnected from the second electrode T_E2 (e.g., due to the undercut space or gap area caused by the reverse spacer).

The first floating cathode electrode F_CTD1 and the second floating cathode electrode F_CTD2 can also be spaced apart from, and electrically disconnected from, the display cathode electrode D_CTD.

Referring to FIGS. 13 and 14, the display panel 110 can further include a spacer SPC on the first bank portion BK1.

Referring to FIGS. 13 and 14, the pixel area PA in the display area DA of the display panel 110 can include a storage capacitor Cst.

The storage capacitor Cst can include a first capacitor electrode CAPE1, a second capacitor electrode CAPE2, and a third capacitor electrode CAPE3.

The gate insulating layer GI can be located between the first capacitor electrode CAPE1 and the second capacitor electrode CAPE2, and the active buffer layer ABUF can be located between the first capacitor electrode CAPE1 and the third capacitor electrode CAPE3.

The first capacitor electrode CAPE1 can include the same semiconductor material as the first active layer ACT1.

The second capacitor electrode CAPE2 can be located on the first capacitor electrode CAPE1 and can include the same material as the first gate electrode G1.

The third capacitor electrode CAPE3 can be located under the first capacitor electrode CAPE1. The third capacitor electrode CAPE3 can include the same material as the lower shield metal BSM located under the first active layer ACT1 of the driving transistor DRT, or can be an extended portion of the lower shield metal BSM.

The first capacitor electrode CAPE1 can be electrically connected to the first gate electrode G1 of the driving transistor DRT. The second capacitor electrode CAPE2 and the third capacitor electrode CAPE3 can be electrically connected to each other and be electrically connected to the first source electrode S1 of the driving transistor DRT.

Accordingly, a first capacitor formed between the first capacitor electrode CAPE1 and the second capacitor electrode CAPE2 and a second capacitor formed between the first capacitor electrode CAPE1 and the third capacitor electrode CAPE3 can be connected in parallel between the first source electrode S1 and the first gate electrode G1 of the driving transistor DRT.

Accordingly, the storage capacitor Cst can be formed by the first capacitor and the second capacitor connected in parallel between the first source electrode S1 and the first gate electrode G1 of the driving transistor DRT. Accordingly, the capacitance of the storage capacitor Cst can be increased and space can be conserved.

Referring to FIG. 14, the light emitting element ED can be located in the pixel area PA.

Referring to FIG. 14, the color filter layer CFL can be located on the encapsulation layer ENCAP.

FIG. 15 is another example cross-sectional view of the display panel 110 of the touch display device 100 according to aspects of the present disclosure. FIG. 16 is yet another example cross-sectional view of the display panel 110 of the touch display device 100 according to aspects of the present disclosure.

Respective cathode split structures in the display panel 110 of FIGS. 15 and 16 can be different from respective cathode split structures in the display panel 110 of FIGS. 13 and 14. Accordingly, vertical locations of the respective second electrodes CTD (e.g., TE11) in the display panel 110 of FIGS. 15 and 16 can be different from vertical locations of the respective second electrodes CTD (e.g., TE11) in the display panel 110 of FIGS. 13 and 14.

Further, while the display panel 110 of FIGS. 13 and 14 can include at least two planarization layers (e.g., the first planarization layer PLN1 and the second planarization layer PLN2), the display panel 110 of FIGS. 15 and 16 can include one first planarization layer PLN1 (e.g., a first planarization layer PLN1). Accordingly, locations of the respective first relay electrodes RE_TS in the display panel 110 of FIGS. 15 and 16 can be different from locations of the respective first relay electrodes RE_TS in the display panel 110 of FIGS. 13 and 14. For example, as shown in FIGS. 15 and 16 the first relay electrode RE_TS can be disposed on a same layer as the gate electrodes (e.g., G1-G4) of the transistors (e.g., G_TR, Tc1, Ts11 and DRT) and one of the capacitor electrodes of the storage capacitor Cst. Also, the first relay electrode RE_TS can be disposed between the gate of the first touch driving transistor Ts11 (e.g., G1) and the gate of the driving transistor DRT (e.g., G4) and on a same layer (e.g., gate insulating layer GI).

As described above, respective stack configurations in the display panel 110 of FIGS. 15 and 16 and respective stack configurations in the display panel 110 of FIGS. 13 and 14 have differences in some structures (e.g., the cathode split structure, the number of planarization layers), but can substantially correspond to each other in the most of, or a considerable portion of, the remaining structures. For example, in FIGS. 15 and 16, the first relay electrode RE_TS and the first electrode T_E1 and the second electrode T_E2 forming the first touch electrode TE11 can be disposed closer to the substrate (e.g., at the TFT layer, such as on gate insulating layer GI).

Considering such similarity, example cross-sectional structures of the display panel 110 of FIGS. 15 and 16 will be described by focusing on features different from the cross-sectional structures of the display panel 110 of FIGS. 13 and 14, and description of features common to the cross-sectional structures of the display panel 110 of FIGS. 13 and 14 will not be repeated here for brevity.

Referring to FIGS. 15 and 16, in the display panel 110, one first planarization layer PLN1 can be disposed over transistors (G_TR, Tc1, Ts11, and DRT).

The cathode split structures of FIGS. 15 and 16 can be formed during the process of manufacturing the display panel 110 by the anode electrode material layer AML, in which an anode electrode material, which is a pixel electrode material, is disposed. For example, the cathode split structures can be formed during the process of manufacturing the display panel 110 by an under-cut structure in which an insulating layer (e.g., an interlayer insulating layer ILD2) under the anode electrode material layer AML is downwardly recessed from the top surface thereof.

Referring to FIGS. 15 and 16, a gate insulating layer GI can be disposed between a first active layer ACT1 and a first gate electrode G1, an at least one interlayer insulating layers (ILD1 and/or ILD2) can be disposed on the first gate electrode G1, and the first planarization layer PLN1 can be disposed on the at least one interlayer insulating layer (ILD1 and/or ILD2).

Referring to FIGS. 15 and 16, each of first source and drain electrodes S1 and D1 of the first touch driving transistor Ts11 can be located between the at least one interlayer insulating layer (ILD1 and/or ILD2) and the first planarization layer PLN1, and can be connected to the first active layer ACT1 through holes of the at least one interlayer insulating layer (ILD1 and/or ILD2) and the gate insulating layer GI.

Referring to FIGS. 15 and 16, a first relay electrode RE_TS can be located in the same layer as the first gate electrode G1 (e.g., on gate insulating layer GI).

Referring to FIGS. 15 and 16, the first source electrode S1 or the first drain electrode D1 of the first touch driving transistor Ts11 can be connected to the first relay electrode RE_TS through a hole in the at least one interlayer insulating layer (ILD1 and/or ILD2).

Referring to FIGS. 15 and 16, the second electrode T_E2 or the first electrode T_E1 connected to the second electrode T_E2 can be connected to the first relay electrode RE_TS through holes of the first planarization layer PLN1 and the at least one interlayer insulating layer (ILD1 and/or ILD2), or be located on the first relay electrode RE_TS in holes of the first planarization layer PLN1 and the at least one interlayer insulating layer (ILD1 and/or ILD2).

Referring to FIGS. 15 and 16, the display panel 110 can include a bank BK located between the anode electrode material layer AML in which the anode electrode material is disposed and the cathode electrode material layer CML in which the cathode electrode material is disposed.

Referring to FIGS. 15 and 16, the display anode electrode D_AND can be located in the anode electrode material layer AML. The display cathode electrode D_CTD and the second electrode T_E2 can be located in the cathode electrode material layer CML.

Referring to FIGS. 15 and 16, the bank BK can include a first bank portion BK1 located on a portion of the display anode electrode D_AND, and a second bank portion BK2 spaced apart from the first bank portion BK1.

Referring to FIGS. 15 and 16, the cathode electrode material can be disconnected between the first bank portion BK1 and the second bank portion BK2.

Referring to FIGS. 15 and 16, in terms of a horizontal location of the second electrode T_E2, the second electrode T_E2 can be located between the first bank portion BK1 and the second bank portion BK2 (e.g., by a deep trench in the various insulating layers).

Referring to FIGS. 15 and 16, in terms of a vertical location of the second electrode T_E2, the second electrode T_E2 can be located closer to the substrate SUB than the display cathode electrode D_CTD, and be located closer to the substrate SUB than the display anode electrode D_AND.

Referring to FIGS. 15 and 16, in terms of a vertical location of the second electrode T_E2, the first electrode T_E1 can be disposed higher than a gate electrode material layer in which a first gate electrode G1 of the first touch driving transistor Ts11 is disposed relative to the substrate, and the second electrode T_E2 can be located on the first electrode T_E1. For example, the first gate electrode G1 of the first touch driving transistor Ts11 and a fourth gate electrode G4 of a driving transistor DRT can be located in the same gate electrode material layer.

Figure 17:
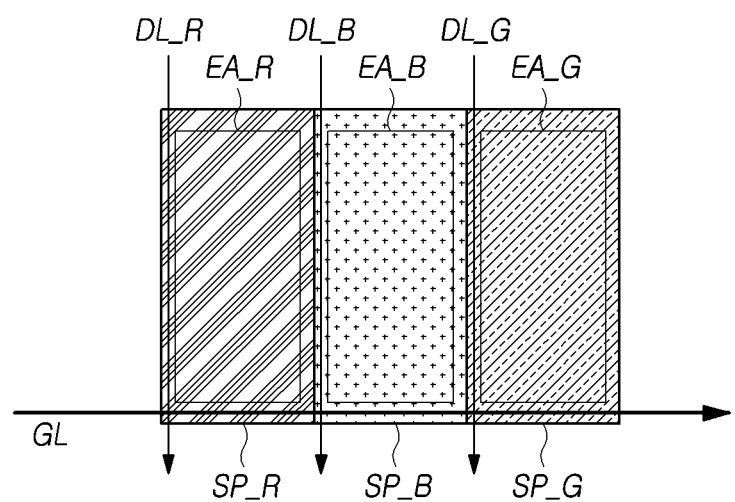
FIG. 17 is an example plan view of the display panel of the touch display device according to aspects of the present disclosure.

FIG. 17 is an example plan view of the display panel 110 of the touch display device 100 according to aspects of the present disclosure.

Referring to FIG. 17, in one or more embodiments, a plurality of subpixels SP can be disposed in the pixel area PA of the display area DA of the display panel 110 of the touch display device 100. The plurality of subpixels SP can include one or more red subpixels SP_R emitting red light, one or more blue subpixels SP_B emitting blue light, and one or more green subpixels SP_G emitting green light.

Referring to FIG. 17, in one or more embodiments, in the display panel 110 of the touch display device 100, an area of the red subpixel SP_R can include a red light emitting area EA_R emitting red light, an area of the blue subpixel SP_B can include a blue light emitting area EA_B emitting blue light, and an area of the green subpixel SP_G can include a green light emitting area EA_G emitting green light.

Referring to FIG. 17, in one or more embodiments, in example where the display panel 110 of the touch display device 100 has a top emission structure, most of the area of the red subpixel SP_R can correspond to the red light emitting area EA_R, most of the area of the blue subpixel SP_B can correspond to the blue light emitting area EA_B, and most of the area of the green subpixel SP_G can correspond to the green light emitting area EA_G.

Referring to FIG. 17, in one or more embodiments, in example where the display panel 110 of the touch display device 100 has a top emission structure, the red light emitting area EA_R can overlap a pixel circuit of the red subpixel SP_R, the blue light emitting area EA_B can overlap a pixel circuit of the blue subpixel SP_B, and the green light emitting area EA_G can overlap a pixel circuit of the green subpixel SP_G.

In other words, transistors (DRT, SCT, and the like) and a capacitor Cst included in the pixel circuit of the red subpixel SP_R can be disposed to be located under, and to be overlapped with, the light emitting element ED formed in the red light emitting area EA_R. Transistors (DRT, SCT, and the like) and a capacitor Cst included in the pixel circuit of the blue subpixel SP_B can be disposed to be located under, and to be overlapped with, the light emitting element ED formed in the blue light emitting area EA_B. Transistors (DRT, SCT, and the like) and a capacitor Cst included in the pixel circuit of the green subpixel SP_G can be disposed to be located under, and to be overlapped with, the light emitting element ED formed in the green light emitting area EA_G.

Referring to FIG. 17, the display panel 110 can include a data line DL_R for transferring a data voltage to the red subpixel SP_R, a data line DL_B for transferring a data voltage to the blue subpixel SP_B, and a data line DL_G for transferring a data voltage to the green subpixel SP_G.

Referring to FIG. 17, the display panel 110 can include a gate line GL for transferring a scan signal to the red subpixel SP_R, the blue subpixel SP_B, and the green subpixel SP_G.

Figure 18:
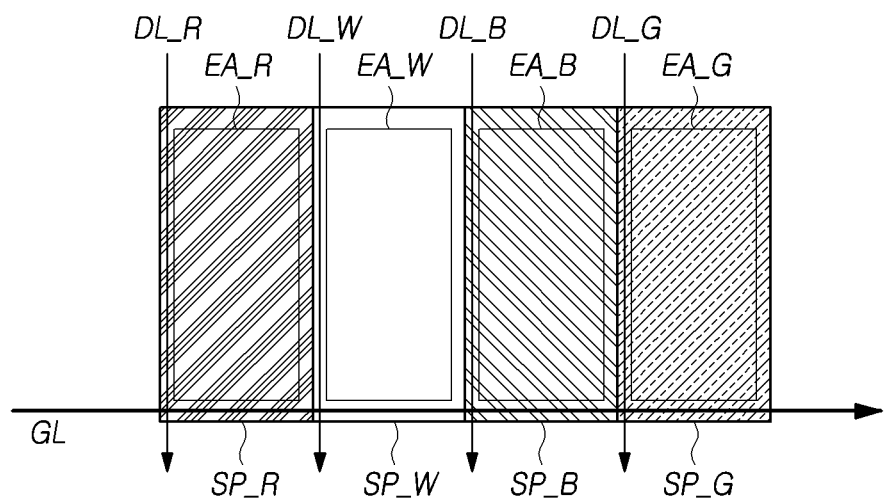
FIG. 18 is another example plan view of the display panel of the touch display device according to aspects of the present disclosure.

FIG. 18 is another example cross-sectional view of the display panel 110 of the touch display device 100 according to aspects of the present disclosure.

Referring to FIG. 18, in one or more embodiments, a plurality of subpixels SP can be disposed in the pixel area PA of the display area DA of the display panel 110 of the touch display device 100. The plurality of subpixels SP can include one or more red subpixels SP_R emitting red light, one or more white subpixels SP_W emitting white light, one or more blue subpixels SP_B emitting blue light, and one or more green subpixels SP_G emitting green light.

Referring to FIG. 18, in one or more embodiments, in the display panel 110 of the touch display device 100, an area of the red subpixel SP_R can include a red light emitting area EA_R emitting red light, an area of the white subpixel SP_W can include a white light emitting area EA_W emitting white light, an area of the blue subpixel SP_B can include a blue light emitting area EA_B emitting blue light, and an area of the green subpixel SP_G can include a green light emitting area EA_G emitting green light.

Referring to FIG. 18, in one or more embodiments, in examples where the display panel 110 of the touch display device 100 has a top emission structure, most of the area of the red subpixel SP_R can correspond to the red light emitting area EA_R, most of the area of the white subpixel SP_W can correspond to the white light emitting area EA_W, most of the area of the blue subpixel SP_B can correspond to the blue light emitting area EA_B, and most of the area of the green subpixel SP_G can correspond to the green light emitting area EA_G.

Referring to FIG. 18, in one or more embodiments, in examples where the display panel 110 of the touch display device 100 has a top emission structure, the red light emitting area EA_R can overlap a pixel circuit of the red subpixel SP_R, the white light emitting area EA_W can overlap a pixel circuit of the white subpixel SP_W, the blue light emitting area EA_B can overlap a pixel circuit of the blue subpixel SP_B, and the green light emitting area EA_G can overlap a pixel circuit of the green subpixel SP_G.

In other words, transistors (DRT, SCT, and the like) and a capacitor Cst included in the pixel circuit of the red subpixel SP_R can be disposed to be located under, and to be overlapped with, the light emitting element ED formed in the red light emitting area EA_R. Transistors (DRT, SCT, and the like) and a capacitor Cst included in the pixel circuit of the white subpixel SP_W can be disposed to be located under, and to be overlapped with, the light emitting element ED formed in the white light emitting area EA_W. Transistors (DRT, SCT, and the like) and a capacitor Cst included in the pixel circuit of the blue subpixel SP_B can be disposed to be located under, and to be overlapped with, the light emitting element ED formed in the blue light emitting area EA_B. Transistors (DRT, SCT, and the like) and a capacitor Cst included in the pixel circuit of the green subpixel SP_G can be disposed to be located under, and to be overlapped with, the light emitting element ED formed in the green light emitting area EA_G.

Referring to FIG. 18, the display panel 110 can include a data line DL_R for transferring a data voltage to the red subpixel SP_R, a data line DL_W for transferring a data voltage to the white subpixel SP_W, a data line DL_B for transferring a data voltage to the blue subpixel SP_B, and a data line DL_G for transferring a data voltage to the green subpixel SP_G.

Referring to FIG. 18, the display panel 110 can include a gate line GL for transferring a scan signal to the red subpixel SP_R, the white subpixel SP_W, the blue subpixel SP_B, and the green subpixel SP_G.

Figure 19:
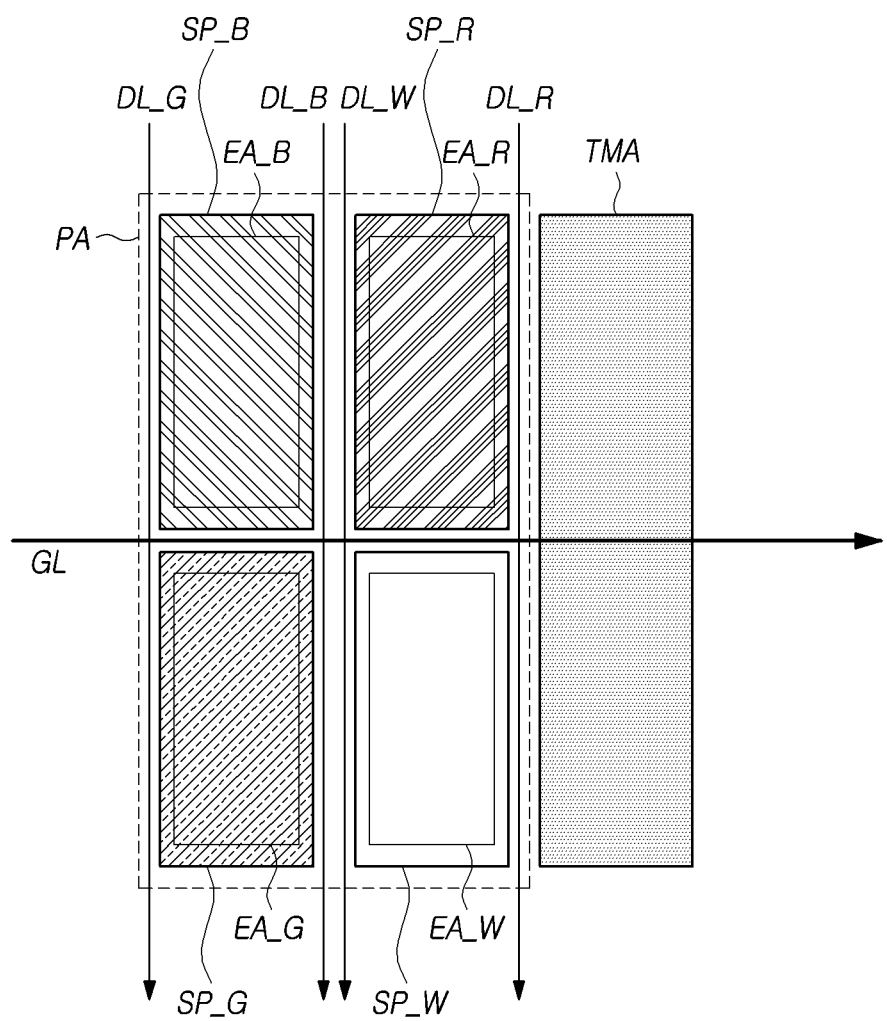
FIG. 19 is yet another example plan view of the display panel of the touch display device according to aspects of the present disclosure.

FIG. 19 is yet another example cross-sectional view of the display panel 110 of the touch display device 100 according to aspects of the present disclosure.

Referring to FIG. 19, in one or more embodiments, the touch display device 100 can be a transparent display. Accordingly, the display area DA of the display panel 110 can include a pixel area PA and a transmission area TMA. For example, the pixel area PA can be an area allowing light to be transmitted, and the transmission area TMA can be an area not allowing light to be transmitted. That is, the transmission area TMA can refer to an area through which external light is transmitted, enabling a background to be viewed from the front. The transmission area TMA can be also referred to as a transparent area.

Referring to FIG. 19, in one or more embodiments, a plurality of subpixels SP can be disposed in the pixel area PA of the display area DA of the display panel 110 of the touch display device 100. The plurality of subpixels SP can include one or more red subpixels SP_R emitting red light, one or more white subpixels SP_W emitting white light, one or more blue subpixels SP_B emitting blue light, and one or more green subpixels SP_G emitting green light.

For example, the blue subpixel SP_B, the red subpixel SP_R, the green subpixel SP_G, and the white subpixel SP_W can be arranged in two rows and two columns.

Referring to FIG. 19, in one or more embodiments, in the display panel 110 of the touch display device 100, an area of the red subpixel SP_R can include a red light emitting area EA_R emitting red light, an area of the white subpixel SP_W can include a white light emitting area EA_W emitting white light, an area of the blue subpixel SP_B can include a blue light emitting area EA_B emitting blue light, and an area of the green subpixel SP_G can include a green light emitting area EA_G emitting green light.

Referring to FIG. 19, in one or more embodiments, in example where the display panel 110 of the touch display device 100 has a top emission structure, most of the area of the red subpixel SP_R can correspond to the red light emitting area EA_R, most of the area of the white subpixel SP_W can correspond to the white light emitting area EA_W, most of the area of the blue subpixel SP_B can correspond to the blue light emitting area EA_B, and most of the area of the green subpixel SP_G can correspond to the green light emitting area EA_G.

Referring to FIG. 19, in one or more embodiments, in examples where the display panel 110 of the touch display device 100 has a top emission structure, the red light emitting area EA_R can overlap a pixel circuit of the red subpixel SP_R, the white light emitting area EA_W can overlap a pixel circuit of the white subpixel SP_W, the blue light emitting area EA_B can overlap a pixel circuit of the blue subpixel SP_B, and the green light emitting area EA_G can overlap a pixel circuit of the green subpixel SP_G.

In other words, transistors (DRT, SCT, and the like) and a capacitor Cst included in the pixel circuit of the red subpixel SP_R can be disposed to be located under, and to be overlapped with, the light emitting element ED formed in the red light emitting area EA_R. Transistors (DRT, SCT, and the like) and a capacitor Cst included in the pixel circuit of the white subpixel SP_W can be disposed to be located under, and to be overlapped with, the light emitting element ED formed in the white light emitting area EA_W. Transistors (DRT, SCT, and the like) and a capacitor Cst included in the pixel circuit of the blue subpixel SP_B can be disposed to be located under, and to be overlapped with, the light emitting element ED formed in the blue light emitting area EA_B. Transistors (DRT, SCT, and the like) and a capacitor Cst included in the pixel circuit of the green subpixel SP_G can be disposed to be located under, and to be overlapped with, the light emitting element ED formed in the green light emitting area EA_G.

Referring to FIG. 19, the display panel 110 can include a red data line DL_R for transferring a data voltage to the red subpixel SP_R, a white data line DL_W for transferring a data voltage to the white subpixel SP_W, a blue data line DL_B for transferring a data voltage to the blue subpixel SP_B, and a green data line DL_G for transferring a data voltage to the green subpixel SP_G.

Referring to FIG. 19, the blue data line DL_B and the white data line DL_W can be disposed between two adjacent subpixels. The green data line DL_G and the red data line DL_R can be disposed between the pixel area PA and the transmission area TMA.

Referring to FIG. 19, the display panel 110 can include a gate line GL for transferring a scan signal to the red subpixel SP_R, the white subpixel SP_W, the blue subpixel SP_B, and the green subpixel SP_G.

Referring to FIG. 19, the gate line GL can be disposed across the transmission area TMA.

Referring to FIG. 19, the display anode electrode D_AND, the emission layer EL, the display cathode electrode D_CTD, and the display driving transistor DRT can be disposed in the pixel area PA. Meanwhile, the first touch electrode TE11 can be disposed in the transmission area TMA.

According to the embodiments described herein, the touch display device 100 can be provided that has an advanced touch sensor structure capable of reducing the number of touch lines, the number of touch pads, and the number of touch channels even when the number of touch electrodes increases, and saves space and improves manufacturing efficiencies.

According to the embodiments described herein, the touch display device 100 can be provided that has an advanced touch sensor structure capable of realizing a high touch resolution while reducing the number of touch lines, the number of touch pads, and the number of touch channels.

According to the embodiments described herein, the touch display device 100 can be provided that enables a touch sensor structure to be integrated into a self-emission type of display panel.

According to the embodiments described herein, the touch display device 100 can be provided that enables a touch sensor structure to be integrated into the display panel 110 with a top emission structure. According to the embodiments described herein, since a touch sensor is integrated into the display panel 110, the manufacturing process of the panel can be simplified, or one or more of processes of manufacturing the panel can be simplified, thus, resulting in helping to optimize the process and conserving resources and reducing costs.

According to the embodiments described herein, low-power driving and high-efficiency driving can be realized because touch driving and touch sensing can be normally performed even using reduced numbers of touch lines and touch channels by employing an advanced touch sensor structure even when the number of touch electrodes increases.

According to the embodiments described herein, the size or number of elements included in a touch driving circuit can be reduced by employing an advanced touch sensor structure and thereby reducing the number of touch channels even when the number of touch electrodes increases. Accordingly, the touch display device 100 with a reduced weight can be provided.

The above description has been presented to enable any person skilled in the art to make, use and practice the technical features of the present invention, and has been provided in the context of a particular application and its requirements as examples. Various modifications, additions and substitutions to the described embodiments will be readily apparent to those skilled in the art, and the principles described herein can be applied to other embodiments and applications without departing from the scope of the present invention. The above description and the accompanying drawings provide examples of the technical features of the present invention for illustrative purposes only. That is, the disclosed embodiments are intended to illustrate the scope of the technical features of the present invention.

What is claimed is:

1. A touch display device comprising:
   a substrate comprising a display area and a non-display area located outside of the display area;
   at least one subpixel disposed in the display area, the at least one subpixel including a display anode electrode, an emission layer and a display cathode electrode;
   a display driving transistor disposed in the display area, the display driving transistor being configured to drive the display anode electrode;
   a touch electrode disposed in the display area;
   a touch driving transistor disposed in the display area and configured to drive the touch electrode, the touch driving transistor including a first active layer, a first source electrode, a first drain electrode and a first gate electrode; and
   a control transistor configured to control turn-on and turn-off operations of the touch driving transistor, the control transistor including a second active layer, a second source electrode, a second drain electrode and a second gate electrode,
   wherein the second source electrode or the second drain electrode of the control transistor is electrically connected to the first gate electrode of the touch driving transistor,
   the second drain electrode or the second source electrode of the control transistor is electrically connected to a first switching signal line, and
   the second gate electrode of the control transistor is electrically connected to a driving signal line.

2. The touch display device of claim 1, wherein the control transistor is disposed in the non-display area.

3. The touch display device of claim 1, further comprising:
   a first touch line disposed in the display area and connected to a first column of touch electrodes disposed in a same first column, the first touch line being configured to supply a touch driving signal,
   wherein the touch electrode is included in the first column of touch electrodes.

4. The touch display device of claim 3, further comprising:
   a first self-multiplexer connected to one end of the first touch line; and
   a first self-sensing circuit connected to the first self-multiplexer,
   wherein the first self-multiplexer is connected between the first touch line and the first self-sensing circuit.

5. The touch display device of claim 4, further comprising:
   a second touch line disposed in the display area and connected to a second column of touch electrodes disposed in a same second column adjacent to the first column of touch electrodes, the second touch line being configured to supply a touch driving signal; a second self-multiplexer connected to one end of the second touch line; and
   a second self-sensing circuit connected to the second self-multiplexer,
   wherein the second self-multiplexer is connected between the second touch line and the second self-sensing circuit.

6. The touch display device of claim 5, wherein at least two first upper touch electrodes in the first column of touch electrodes and at least two second upper touch electrodes in the second column of touch electrodes are included in a first touch electrode group,
   wherein at least two first lower touch electrodes in the first column of touch electrodes and at least two second lower touch electrodes in the second column of touch electrodes are included in a second touch electrode group, and
   wherein the first self-sensing circuit is configured to sense one or more touch electrodes in the first touch electrode group and one or more touch electrodes in the second touch electrode group.

7. The touch display device of claim 1, further comprising:
   a first upper touch line disposed in the display area and connected to at least two upper touch electrodes disposed in a same first column, the first upper touch line being configured to supply a touch driving signal; and
   a first lower touch line disposed in the display area and connected to at least two lower touch electrodes disposed in the same first column, the first lower touch line being configured to supply a touch driving signal,
   wherein the first upper touch line is spaced apart from and electrically isolated from the first lower touch line.

8. The touch display device of claim 7, further comprising:
   a first upper self-multiplexer connected to one end of the first upper touch line;
   a first upper self-sensing circuit connected to the first upper self-multiplexer;
   a first lower self-multiplexer connected to one end of the first lower touch line; and
   a first lower self-sensing circuit connected to the first lower self-multiplexer,
   wherein the first upper self-multiplexer is connected between the first upper touch line and the first upper self-sensing circuit, and wherein the first lower self-multiplexer is connected between the first lower touch line and the first lower self-sensing circuit.

9. The touch display device of claim 1, wherein the touch electrode includes a second electrode having a same material as the display cathode electrode, the second electrode being spaced apart from the display cathode electrode.

10. The touch display device of claim 9, wherein the touch electrode further includes a first electrode disposed under the second electrode, and
wherein the first electrode includes a same material as the display anode electrode, the first electrode being spaced apart from the display anode electrode.

11. The touch display device of claim 1, wherein the touch electrode further includes a relay electrode configured to electrically connect the second electrode with the first source electrode or the first drain electrode.

12. The touch display device of claim 11, wherein the relay electrode is located between the second electrode and the first source electrode of the touch driving transistor or between the second electrode and the first drain electrode of the touch driving transistor.

13. The touch display device of claim 11, further comprising:
a gate insulating layer disposed between the first active layer and the first gate electrode;
an interlayer insulating layer disposed on the first gate electrode;
a first planarization layer disposed on the interlayer insulating layer; and
a second planarization layer disposed on the first planarization layer,
wherein each of the first source electrode and the first drain electrode of the touch driving transistor is located between the interlayer insulating layer and the first planarization layer, and is connected to the first active layer through holes in the interlayer insulating layer and the gate insulating layer.

14. The touch display device of claim 13, wherein the relay electrode is located between the first planarization layer and the second planarization layer, and is connected to the first source electrode or the first drain electrode of the touch driving transistor through a hole in the first planarization layer, and
wherein the second electrode or a first electrode connected to the second electrode is located on the second planarization layer, and is connected to the relay electrode through a hole in the second planarization layer.

15. The touch display device of claim 11, wherein the relay electrode is located in or on a same layer as the first gate electrode of the touch driving transistor.

16. The touch display device of claim 11, further comprising:
a gate insulating layer disposed between the first active layer and the first gate electrode;
an interlayer insulating layer disposed on the first gate electrode; and
a first planarization layer disposed on the interlayer insulating layer,
wherein each of the first source electrode and the first drain electrode of the touch driving transistor is located between the interlayer insulating layer and the first planarization layer, and is connected to the first active layer through a hole in the interlayer insulating layer, and
wherein the relay electrode is located in or on a same layer as the first gate electrode.

17. The touch display device of claim 16, wherein the first source electrode or the first drain electrode of the touch driving transistor is connected to the relay electrode through holes in the interlayer insulating layer and the gate insulating layer, and
wherein the second electrode or a first electrode connected to the second electrode is connected to the relay electrode through holes in the first planarization layer and the interlayer insulating layer, or the second electrode or the first electrode connected to the second electrode is located on the relay electrode.

18. The touch display device of claim 17, wherein at least a portion of the display cathode electrode is farther away from the substrate than the second electrode, and
wherein the second electrode is farther away from the substrate than the display anode electrode, or the second electrode is farther away from the substrate than the first source electrode and the first drain electrode of the touch driving transistor.

19. The touch display device of claim 11, further comprising:
a bank disposed between an anode electrode material layer including an anode electrode material and a cathode electrode material layer including the cathode electrode material,
wherein the display anode electrode is included in the anode electrode material layer, and the display cathode electrode and the second electrode are included in the cathode electrode material layer,
wherein the bank comprises:
a first bank portion disposed on a portion of the display anode electrode,
a second bank portion overlapping with a portion of the non-display area; and
third and fourth bank portions disposed between the first bank portion and the second bank portion, and
wherein the cathode electrode material is disconnected at an area between the third bank portion and the fourth bank portion, and the second electrode is disposed between the third bank portion and the fourth bank portion.

20. The touch display device of claim 11, further comprising:
a bank disposed between an anode electrode material layer including an anode electrode material and a cathode electrode material layer including the cathode electrode material,
wherein the display anode electrode is disposed in the anode electrode material layer, and the display cathode electrode and the second electrode are included in the cathode electrode material layer,
wherein the bank comprises:
a first bank portion disposed on a portion of the display anode electrode; and
a second bank portion spaced apart from the first bank portion, and
wherein the cathode electrode material is disconnected at an area between the first bank portion and the second bank portion, and the second electrode is disposed between the first bank portion and the second bank portion.

21. The touch display device of claim 20, wherein the second electrode is closer to the substrate than the display cathode electrode, and the second electrode is closer to the substrate than the display anode electrode.

22. The touch display device of claim 1, wherein the display area includes a pixel area and a transmission area, and wherein the display anode electrode, the emission layer, the display cathode electrode, and the display driving transistor are disposed in the pixel area, and the touch electrode is disposed in the transmission area.

23. The touch display device of claim 1, further comprising:

a first touch line disposed in the display area and connected to a first column of transmission touch electrodes disposed in a same first column, the first touch line being configured to supply a touch driving signal; and a first reception touch electrode crossing over the first column of transmission touch electrodes, wherein the touch electrode is included in the first column of transmission touch electrodes.

* * * * *